(12) United States Patent
Vanheusden et al.

(10) Patent No.: US 8,167,393 B2
(45) Date of Patent: May 1, 2012

(54) PRINTABLE ELECTRONIC FEATURES ON NON-UNIFORM SUBSTRATE AND PROCESSES FOR MAKING SAME

(75) Inventors: Karel Vanheusden, Placitas, NM (US); Chuck Edwards, Rio Rancho, NM (US)

(73) Assignee: Cabot Corporation, Boston, MA (US)

( * ) Notice: Subject to any disclaimer, the term of this patent is extended or adjusted under 35 U.S.C. 154(b) by 1557 days.

(21) Appl. No.: 11/331,190

(22) Filed: Jan. 13, 2006

(65) Prior Publication Data
US 2006/0158470 A1    Jul. 20, 2006

Related U.S. Application Data

(60) Provisional application No. 60/643,629, filed on Jan. 14, 2005, provisional application No. 60/643,577, filed on Jan. 14, 2005, provisional application No. 60/643,578, filed on Jan. 14, 2005.

(51) Int. Cl.
*B41J 25/308* (2006.01)
*B41J 29/38* (2006.01)
*B41J 29/393* (2006.01)
*B41J 2/01* (2006.01)

(52) U.S. Cl. ............ 347/8; 347/14; 347/19; 347/101

(58) Field of Classification Search .......... 347/8, 14, 347/19, 101, 105
See application file for complete search history.

(56) References Cited

U.S. PATENT DOCUMENTS

| 2,785,964 A | 3/1957 | Pollock |
| 3,313,632 A | 4/1967 | Langley et al. ............ 106/1 |
| 3,401,020 A | 9/1968 | Kester et al. |
| 3,683,382 A | 8/1972 | Ballinger ............ 346/74 |
| 3,814,696 A | 6/1974 | Verdone et al. ............ 252/317 |
| 3,922,355 A | 11/1975 | Kotthoff |
| 3,922,388 A | 11/1975 | Schebalin |
| RE28,972 E | 9/1976 | Weber et al. |
| 4,019,188 A | 4/1977 | Hochberg et al. ............ 346/75 |
| 4,105,483 A | 8/1978 | Lin ............ 156/154 |
| 4,122,062 A | 10/1978 | Monte et al. ............ 260/42.14 |

(Continued)

FOREIGN PATENT DOCUMENTS

EP    0 410 765 A3    7/1990

(Continued)

OTHER PUBLICATIONS

Advanced Materials Systems for Ultra-Low-Temperature, Digital, Direct-Write Technologies, Digital, Direct Write Technologies, Vanheusden, et al., "Direct-Write Technologies for Rapid Prototyping Applications", pp. 123-173 (2001).

(Continued)

*Primary Examiner* — Matthew Luu
*Assistant Examiner* — Jannelle M Lebron

(57) ABSTRACT

A system and process for compensating for non-uniform surfaces of a substrate when direct printing traces is provided. The system and process provided herein measures the surface of a substrate and can determine whether the surface is substantially flat, rises or falls, or whether a mesa or valley is encountered. Depending on the surface feature (i.e., mesa, valley, falling or rising surface), the direct printing system can change the frequency of the printing timing signal, advance or retard the print timing signal, advance or retard the print data, or make repeated passes over certain areas. In addition, the process disclosed herein can determine whether two, three or all of the aforementioned steps for compensating for non-uniform substrates should be combined to most effectively and efficiently print on the non-uniform surface of the substrate as intended.

63 Claims, 20 Drawing Sheets

U.S. PATENT DOCUMENTS

| | | | | |
|---|---|---|---|---|
| 4,130,671 A | 12/1978 | Nagesh et al. | | 427/125 |
| 4,170,480 A | 10/1979 | Ikenoue et al. | | 96/114.1 |
| 4,186,244 A | 1/1980 | Deffeyes et al. | | 428/570 |
| 4,211,668 A | 7/1980 | Tate | | 252/316 |
| 4,255,291 A | 3/1981 | Needes et al. | | 252/578 |
| 4,266,229 A | 5/1981 | Mansukhani | | 346/1.1 |
| 4,289,534 A | 9/1981 | Deffeyes et al. | | 106/1.14 |
| 4,333,966 A | 6/1982 | Deffeyes et al. | | 427/96 |
| 4,370,308 A | 1/1983 | Williams et al. | | |
| 4,381,945 A | 5/1983 | Nair | | 106/1.14 |
| 4,407,674 A | 10/1983 | Ehrreich | | 75/251 |
| 4,416,932 A | 11/1983 | Nair | | 428/209 |
| 4,418,099 A | 11/1983 | Cuevas et al. | | 427/229 |
| 4,419,383 A | 12/1983 | Lee | | 427/47 |
| 4,463,030 A | 7/1984 | Deffeyes et al. | | 427/216 |
| 4,487,811 A | 12/1984 | Eichelberger et al. | | 428/546 |
| 4,508,753 A | 4/1985 | Stepan | | 427/53.1 |
| 4,517,252 A | 5/1985 | Hugh | | 428/553 |
| 4,539,041 A | 9/1985 | Figlarz et al. | | 75/5 |
| 4,548,879 A | 10/1985 | St. John et al. | | 427/96 |
| 4,599,277 A | 7/1986 | Brownlow et al. | | 428/552 |
| 4,622,069 A | 11/1986 | Akai et al. | | 106/1.11 |
| 4,627,875 A | 12/1986 | Kobayashi et al. | | 106/22 |
| 4,650,108 A | 3/1987 | Gallagher | | 228/124 |
| 4,668,533 A | 5/1987 | Miller | | 427/98 |
| 4,697,041 A | 9/1987 | Okaniwa et al. | | |
| 4,720,418 A | 1/1988 | Kuo | | |
| 4,753,821 A | 6/1988 | Giesecke et al. | | 427/98 |
| 4,775,439 A | 10/1988 | Seeger, Jr. et al. | | 156/231 |
| 4,808,274 A | 2/1989 | Nguyen | | 204/15 |
| 4,857,241 A | 8/1989 | Straw et al. | | 261/124 |
| 4,859,241 A | 8/1989 | Grundy | | 106/114 |
| 4,877,451 A | 10/1989 | Winnik et al. | | 106/23 |
| 4,877,647 A | 10/1989 | Klabunde | | 427/123 |
| 4,879,104 A | 11/1989 | List et al. | | |
| 4,891,242 A | 1/1990 | Ito et al. | | 437/53.1 |
| 4,892,798 A | 1/1990 | Lamanna et al. | | 430/38 |
| 4,931,168 A | 6/1990 | Watanabe et al. | | 204/284 |
| 4,931,323 A | 6/1990 | Manitt et al. | | 427/53.1 |
| 4,948,623 A | 8/1990 | Beach et al. | | 427/35 |
| 4,959,430 A | 9/1990 | Jonas et al. | | 526/257 |
| 5,011,627 A | 4/1991 | Lutz et al. | | |
| 5,028,473 A | 7/1991 | Vitriol et al. | | 428/137 |
| 5,039,552 A | 8/1991 | Riemer | | 427/96 |
| 5,045,141 A | 9/1991 | Salensky et al. | | 156/240 |
| 5,049,434 A | 9/1991 | Wasulko | | 428/202 |
| 5,057,363 A | 10/1991 | Nakanishi | | 428/321.5 |
| 5,059,242 A | 10/1991 | Firmstone et al. | | 106/1.23 |
| 5,075,262 A | 12/1991 | Nguyen et al. | | 501/19 |
| 5,091,003 A | 2/1992 | Boaz | | 106/20 |
| 5,121,127 A | 6/1992 | Toriyama | | 343/700 |
| 5,132,248 A | 7/1992 | Drummond et al. | | |
| 5,139,818 A | 8/1992 | Mance | | 427/54.1 |
| 5,148,355 A | 9/1992 | Lowe et al. | | |
| 5,153,023 A | 10/1992 | Orlowski et al. | | 427/555 |
| 5,160,366 A | 11/1992 | Shibata | | 75/232 |
| 5,173,330 A | 12/1992 | Asano et al. | | 427/558 |
| 5,176,744 A | 1/1993 | Muller | | 106/1.26 |
| 5,176,764 A | 1/1993 | Abbott et al. | | 152/158 |
| 5,183,784 A | 2/1993 | Nguyen et al. | | 501/19 |
| 5,215,820 A | 6/1993 | Hosokawa et al. | | 428/403 |
| 5,216,207 A | 6/1993 | Prabhu et al. | | 174/256 |
| 5,244,538 A | 9/1993 | Kumar | | 156/643 |
| 5,250,229 A | 10/1993 | Hara et al. | | 252/518 |
| 5,270,368 A | 12/1993 | Lent et al. | | 524/236 |
| 5,281,261 A | 1/1994 | Lin | | |
| 5,312,480 A | 5/1994 | Lotze et al. | | 106/1.13 |
| 5,312,674 A | 5/1994 | Haertling et al. | | 428/210 |
| 5,329,293 A | 7/1994 | Liker | | 347/11 |
| 5,332,646 A | 7/1994 | Wright et al. | | 430/137 |
| 5,366,760 A | 11/1994 | Fujii et al. | | 427/96 |
| 5,378,408 A | 1/1995 | Carroll et al. | | 252/514 |
| 5,378,508 A | 1/1995 | Castro et al. | | 427/556 |
| 5,384,953 A | 1/1995 | Economikos et al. | | 29/846 |
| 5,395,452 A | 3/1995 | Kobayashi et al. | | 118/715 |
| 5,403,375 A | 4/1995 | Konig et al. | | 75/255 |
| 5,421,926 A | 6/1995 | Yukonobu et al. | | 156/83 |
| 5,433,893 A | 7/1995 | Jost et al. | | 252/514 |
| 5,444,453 A | 8/1995 | Lalezari | | 343/700 |
| 5,463,057 A | 10/1995 | Graetzel et al. | | 546/4 |
| 5,494,550 A | 2/1996 | Benge | | 156/268 |
| 5,501,150 A | 3/1996 | Leenders et al. | | 101/466 |
| 5,539,041 A | 7/1996 | Arnold et al. | | 524/494 |
| 5,559,057 A | 9/1996 | Goldstein | | 437/228 |
| 5,565,143 A | 10/1996 | Chan | | 252/514 |
| 5,571,311 A | 11/1996 | Belmont et al. | | |
| 5,587,111 A | 12/1996 | Watanabe et al. | | 252/514 |
| 5,599,046 A | 2/1997 | Behm et al. | | 283/83 |
| 5,601,638 A | 2/1997 | Fukuda et al. | | 106/19 |
| 5,604,027 A | 2/1997 | Sheridon | | 428/323 |
| 5,604,673 A | 2/1997 | Washburn et al. | | 363/147 |
| 5,645,932 A | 7/1997 | Uchibori | | 428/347 |
| 5,665,472 A | 9/1997 | Tanaka et al. | | 428/402 |
| 5,679,724 A | 10/1997 | Sacripante et al. | | 523/161 |
| 5,712,673 A | 1/1998 | Hayashi et al. | | 347/217 |
| 5,716,663 A | 2/1998 | Capote et al. | | 427/96 |
| 5,725,647 A | 3/1998 | Carlson et al. | | 106/31.86 |
| 5,725,672 A | 3/1998 | Schmitt et al. | | 118/715 |
| 5,746,868 A | 5/1998 | Abe | | 156/247 |
| 5,747,222 A | 5/1998 | Ryu | | 430/312 |
| 5,747,562 A | 5/1998 | Mahmud et al. | | |
| 5,750,194 A | 5/1998 | Watanabe et al. | | 427/216 |
| 5,751,325 A | 5/1998 | Leenders et al. | | 347/96 |
| 5,759,230 A | 6/1998 | Chow et al. | | |
| 5,759,712 A | 6/1998 | Hockaday | | 429/30 |
| 5,767,810 A | 6/1998 | Hagiwara et al. | | 343/700 |
| 5,781,158 A | 7/1998 | Ko et al. | | 343/700 |
| 5,801,108 A | 9/1998 | Huang et al. | | 501/32 |
| 5,815,282 A * | 9/1998 | Kano | | 358/296 |
| 5,826,329 A | 10/1998 | Roth | | 29/846 |
| 5,828,271 A | 10/1998 | Stitzer | | 333/24.1 |
| 5,837,041 A | 11/1998 | Bean et al. | | 106/31.6 |
| 5,837,045 A | 11/1998 | Johnson et al. | | 106/31.85 |
| 5,838,271 A | 11/1998 | Park | | 341/144 |
| 5,838,567 A | 11/1998 | Boggio, Jr. | | |
| 5,846,615 A | 12/1998 | Sharma et al. | | 427/597 |
| 5,853,470 A | 12/1998 | Martin et al. | | 106/31.86 |
| 5,879,715 A | 3/1999 | Higgins et al. | | 424/489 |
| 5,882,722 A | 3/1999 | Kydd | | 427/123 |
| 5,894,038 A | 4/1999 | Sharma et al. | | 427/554 |
| 5,909,083 A | 6/1999 | Asano et al. | | 313/584 |
| 5,930,026 A | 7/1999 | Jacobson et al. | | 359/296 |
| 5,932,280 A | 8/1999 | Roth | | 427/102 |
| 5,953,037 A | 9/1999 | Hayashi et al. | | 347/172 |
| 5,962,085 A | 10/1999 | Hayashi et al. | | 427/585 |
| 5,966,580 A | 10/1999 | Watanabe et al. | | 419/9 |
| 5,992,320 A | 11/1999 | Kosaka et al. | | 101/401.1 |
| 5,997,044 A | 12/1999 | Behm et al. | | 283/83 |
| 5,998,085 A | 12/1999 | Isberg et al. | | 430/200 |
| 6,019,926 A | 2/2000 | Southward et al. | | 264/216 |
| 6,025,026 A | 2/2000 | Smith et al. | | 427/316 |
| 6,027,762 A | 2/2000 | Tomita et al. | | 427/96 |
| 6,036,889 A | 3/2000 | Kydd | | 252/512 |
| 6,042,643 A | 3/2000 | Belmont et al. | | |
| 6,074,725 A | 6/2000 | Kennedy | | 428/188 |
| 6,080,261 A | 6/2000 | Popat et al. | | 156/240 |
| 6,080,928 A | 6/2000 | Nakagawa | | |
| 6,099,897 A | 8/2000 | Sayo et al. | | 427/180 |
| 6,103,393 A | 8/2000 | Kodas et al. | | 428/570 |
| 6,103,868 A | 8/2000 | Heath et al. | | 528/482 |
| 6,109,175 A | 8/2000 | Kinoshita | | 101/170 |
| 6,118,426 A | 9/2000 | Albert et al. | | |
| 6,124,851 A | 9/2000 | Jacobson | | 345/206 |
| 6,133,147 A | 10/2000 | Rhee et al. | | 438/677 |
| 6,143,356 A | 11/2000 | Jablonski | | 427/96 |
| 6,153,348 A | 11/2000 | Kydd et al. | | 430/119 |
| 6,156,837 A | 12/2000 | Branan, Jr. et al. | | |
| 6,169,129 B1 | 1/2001 | Mahmud et al. | | |
| 6,169,837 B1 | 1/2001 | Kato et al. | | |
| 6,177,151 B1 | 1/2001 | Chrisey et al. | | 427/596 |
| 6,190,731 B1 | 2/2001 | Tecle | | 427/213.3 |
| 6,197,147 B1 | 3/2001 | Bonsel et al. | | 156/269 |
| 6,197,366 B1 | 3/2001 | Takamatsu | | 427/125 |
| 6,200,405 B1 | 3/2001 | Nakazawa et al. | | 156/248 |
| 6,205,849 B1 * | 3/2001 | Schaenzer et al. | | 73/105 |
| 6,207,268 B1 | 3/2001 | Kosaka et al. | | 428/325 |
| 6,214,259 B1 | 4/2001 | Oda et al. | | 252/500 |

| | | | |
|---|---|---|---|
| 6,214,520 B1 | 4/2001 | Wolk et al. ............... 430/273.1 |
| 6,238,734 B1 | 5/2001 | Senzaki et al. ............... 427/226 |
| 6,245,494 B1 | 6/2001 | Andriessen et al. ........... 430/346 |
| 6,251,471 B1 | 6/2001 | Granoff et al. ............... 427/97 |
| 6,251,488 B1 | 6/2001 | Miller et al. ................. 427/596 |
| 6,270,389 B1 | 8/2001 | Kobayashi et al. ............ 445/24 |
| 6,274,412 B1 | 8/2001 | Kydd et al. ................. 438/149 |
| 6,277,740 B1 | 8/2001 | Goldstein .................... 438/660 |
| 6,294,401 B1 | 9/2001 | Jacobson et al. .............. 438/99 |
| 6,296,896 B1 | 10/2001 | Takahashi et al. ............. 427/77 |
| 6,317,023 B1 | 11/2001 | Felten ........................ 338/254 |
| 6,323,096 B1 | 11/2001 | Saia et al. .................... 438/384 |
| 6,328,894 B1 | 12/2001 | Chan et al. ................... 210/638 |
| 6,329,899 B1 | 12/2001 | Hunt et al. ................... 338/308 |
| 6,338,809 B1 | 1/2002 | Hampden-Smith et al. ...... 264/7 |
| 6,348,295 B1 | 2/2002 | Griffith et al. ................ 430/198 |
| 6,356,234 B1 | 3/2002 | Harrison et al. |
| 6,358,567 B2 | 3/2002 | Pham et al. ................... 427/421 |
| 6,358,611 B1 | 3/2002 | Nagasawa et al. ............. 428/403 |
| 6,368,378 B2 | 4/2002 | Sasaki ........................ 75/252 |
| 6,372,158 B1 | 4/2002 | Hashimoto et al. ............ 252/513 |
| 6,379,742 B1 | 4/2002 | Behm et al. .................. 427/7 |
| 6,379,745 B1 | 4/2002 | Kydd et al. .................. 427/96 |
| 6,380,778 B2 | 4/2002 | Uehara et al. ................. 327/175 |
| 6,395,053 B1 | 5/2002 | Fau et al. ..................... 75/362 |
| 6,399,230 B1 | 6/2002 | Tormey et al. ................ 428/702 |
| 6,413,790 B1 | 7/2002 | Duthaler et al. |
| 6,416,150 B1 | 7/2002 | Kimura ........................ 347/14 |
| 6,458,327 B1 | 10/2002 | Vossmeyer ................... 422/68.1 |
| 6,458,431 B2 | 10/2002 | Hill et al. ..................... 427/537 |
| 6,467,897 B1 | 10/2002 | Wu et al. ..................... 347/102 |
| 6,487,774 B1 | 12/2002 | Nakao et al. ................. 29/890.1 |
| 6,501,663 B1 | 12/2002 | Pan |
| 6,503,831 B2 | 1/2003 | Speakman ................... 438/674 |
| 6,506,438 B2 | 1/2003 | Duthaler et al. |
| 6,537,359 B1 | 3/2003 | Spa ............................ 106/31.92 |
| 6,541,433 B2 | 4/2003 | Schultz et al. ................ 510/152 |
| 6,548,036 B2 | 4/2003 | Iida et al. |
| 6,554,416 B2 * | 4/2003 | Koto ........................... 347/8 |
| 6,599,631 B2 | 7/2003 | Kambe et al. ................ 428/447 |
| 6,631,971 B2 * | 10/2003 | Adkins et al. ................ 347/19 |
| 6,645,569 B2 | 11/2003 | Cramer et al. ................ 427/466 |
| 6,649,138 B2 | 11/2003 | Adams et al. ................. 423/403 |
| 6,660,680 B1 | 12/2003 | Hampden-Smith et al. .... 502/180 |
| 6,667,360 B1 | 12/2003 | Ng et al. ...................... 524/492 |
| 6,697,694 B2 | 2/2004 | Mogensen |
| 6,713,389 B2 | 3/2004 | Speakman ................... 438/674 |
| 6,730,400 B1 | 5/2004 | Komatsu et al. .............. 428/403 |
| 6,743,319 B2 | 6/2004 | Kydd ........................... 156/230 |
| 6,753,108 B1 | 6/2004 | Hampden-Smith et al. .... 429/44 |
| 6,773,614 B2 | 8/2004 | Field ........................... 216/5 |
| 6,774,036 B2 | 8/2004 | Goldstein .................... 438/660 |
| 6,780,765 B2 | 8/2004 | Goldstein .................... 438/660 |
| 6,811,885 B1 | 11/2004 | Andriessen et al. ........... 428/464 |
| 6,827,772 B2 | 12/2004 | Foster |
| 6,830,778 B1 | 12/2004 | Schulz et al. ................. 427/123 |
| 6,855,196 B2 | 2/2005 | Kawamura et al. ............ 106/31.6 |
| 6,880,909 B2 | 4/2005 | King et al. ................... 347/19 |
| 6,881,239 B2 | 4/2005 | Uchida ........................ 75/252 |
| 6,939,576 B2 | 9/2005 | Deshpande et al. ........... 427/223 |
| 6,951,666 B2 | 10/2005 | Kodas et al. .................. 427/376.6 |
| 6,958,095 B2 | 10/2005 | Kakimoto et al. |
| 7,001,016 B2 * | 2/2006 | Baxter et al. ................. 347/101 |
| 7,533,361 B2 | 5/2009 | Edwards |
| 7,543,903 B2 * | 6/2009 | Little .......................... 347/19 |
| 2001/0004477 A1 | 6/2001 | Fukunaga et al. ............. 427/475 |
| 2001/0017085 A1 | 8/2001 | Kubo |
| 2002/0006723 A1 | 1/2002 | Goldstein .................... 438/660 |
| 2002/0018861 A1 | 2/2002 | Hill et al. ..................... 427/532 |
| 2002/0020491 A1 | 2/2002 | Price et al. ................... 156/307.1 |
| 2002/0058143 A1 | 5/2002 | Hunt et al. ................... 428/412 |
| 2002/0079832 A1 | 6/2002 | Van Tongeren et al. ....... 313/504 |
| 2002/0131254 A1 | 9/2002 | Schaper ....................... 361/760 |
| 2002/0148640 A1 | 10/2002 | Holl et al. .................... 174/256 |
| 2002/0150678 A1 | 10/2002 | Cramer et al. ................ 427/212 |
| 2002/0151161 A1 | 10/2002 | Furusawa .................... 438/597 |
| 2002/0176987 A1 | 11/2002 | Yadav et al. .................. 428/402 |
| 2003/0003231 A1 | 1/2003 | Kiguchi et al. |
| 2003/0009726 A1 | 1/2003 | Chang et al. |
| 2003/0020768 A1 | 1/2003 | Renn ........................... 347/2 |
| 2003/0060038 A1 | 3/2003 | Sirringhaus et al. |
| 2003/0063155 A1 | 4/2003 | Nakao et al. ................. 347/44 |
| 2003/0070569 A1 | 4/2003 | Bulthaup et al. .............. 101/127 |
| 2003/0070747 A1 | 4/2003 | Kydd .......................... 156/233 |
| 2003/0073042 A1 | 4/2003 | Cernigliaro et al. ........... 430/321 |
| 2003/0082485 A1 | 5/2003 | Bulthaup et al. .............. 430/312 |
| 2003/0083203 A1 | 5/2003 | Hashimoto |
| 2003/0085057 A1 | 5/2003 | Hashimoto |
| 2003/0096056 A1 | 5/2003 | Kawamura et al. ............ 427/66 |
| 2003/0102099 A1 | 6/2003 | Yadav et al. .................. 162/208 |
| 2003/0108664 A1 | 6/2003 | Kodas et al. |
| 2003/0110978 A1 | 6/2003 | Abe et al. ..................... 106/31.13 |
| 2003/0116057 A1 | 6/2003 | Suzuki et al. ................. 106/31.33 |
| 2003/0123259 A1 | 7/2003 | Furuya et al. ................. 362/489 |
| 2003/0124712 A1 | 7/2003 | Kodas et al. .................. 427/376.6 |
| 2003/0145680 A1 | 8/2003 | Ichida ......................... 75/252 |
| 2003/0146019 A1 | 8/2003 | Hirai |
| 2003/0148024 A1 | 8/2003 | Kodas et al. .................. 427/125 |
| 2003/0151030 A1 | 8/2003 | Gurin .......................... 252/502 |
| 2003/0161959 A1 | 8/2003 | Kodas et al. .................. 427/376.2 |
| 2003/0168639 A1 | 9/2003 | Cheon et al. ................. 252/500 |
| 2003/0175411 A1 | 9/2003 | Kodas et al. .................. 427/58 |
| 2003/0180451 A1 | 9/2003 | Kodas et al. .................. 427/123 |
| 2003/0183165 A1 | 10/2003 | Kakimoto et al. ............. 118/35 |
| 2003/0185739 A1 | 10/2003 | Mangold et al. |
| 2003/0185889 A1 | 10/2003 | Yan et al. ..................... 424/484 |
| 2003/0201244 A1 | 10/2003 | Ogawa |
| 2003/0207949 A1 | 11/2003 | Klabunde et al. ............. 516/9 |
| 2003/0211246 A1 | 11/2003 | Kydd et al. .................. 427/282 |
| 2003/0213614 A1 | 11/2003 | Furusawa et al. |
| 2003/0215565 A1 | 11/2003 | Chang et al. |
| 2003/0224104 A1 | 12/2003 | Fukunaga |
| 2003/0228748 A1 | 12/2003 | Nelson et al. |
| 2004/0004209 A1 | 1/2004 | Matsuba et al. .............. 252/518.1 |
| 2004/0030019 A1 | 2/2004 | Kim et al. .................... 524/431 |
| 2004/0038808 A1 | 2/2004 | Hampden-Smith |
| 2004/0043691 A1 | 3/2004 | Abe et al. ..................... 445/24 |
| 2004/0058457 A1 | 3/2004 | Huang et al. ................. 436/524 |
| 2004/0074336 A1 | 4/2004 | Daimon et al. |
| 2004/0126708 A1 | 7/2004 | Jing et al. |
| 2004/0140549 A1 | 7/2004 | Miyagawa |
| 2004/0142165 A1 | 7/2004 | Fujii |
| 2004/0144958 A1 | 7/2004 | Conaghan et al. ............ 252/500 |
| 2004/0144959 A1 | 7/2004 | Conaghan et al. ............ 252/500 |
| 2004/0145858 A1 | 7/2004 | Sakurada |
| 2004/0151893 A1 | 8/2004 | Kydd et al. .................. 428/323 |
| 2004/0160465 A1 | 8/2004 | Baker-Smith et al. |
| 2004/0173144 A1 | 9/2004 | Edwards et al. |
| 2004/0182533 A1 | 9/2004 | Blum et al. |
| 2004/0191695 A1 | 9/2004 | Ray et al. |
| 2004/0196329 A1 | 10/2004 | Ready |
| 2004/0201648 A1 | 10/2004 | Sekiya |
| 2004/0206941 A1 | 10/2004 | Gurin .......................... 252/500 |
| 2004/0223926 A1 | 11/2004 | Kobayashi |
| 2004/0231594 A1 | 11/2004 | Edwards et al. |
| 2004/0239730 A1 | 12/2004 | Kurosawa |
| 2004/0247842 A1 | 12/2004 | Koyama et al. ............... 428/195.1 |
| 2004/0250750 A1 | 12/2004 | Reda et al. ................... 117/84 |
| 2004/0261700 A1 | 12/2004 | Edwards |
| 2004/0263564 A1 | 12/2004 | Maekawa |
| 2004/0265549 A1 | 12/2004 | Kydd .......................... 428/201 |
| 2005/0037614 A1 | 2/2005 | Fukuchi |
| 2005/0056118 A1 | 3/2005 | Xia et al. |
| 2005/0078158 A1 | 4/2005 | Magdassi et al. ............. 347/100 |
| 2005/0116203 A1 | 6/2005 | Takahashi et al. ............. 252/500 |
| 2005/0146545 A1 * | 7/2005 | Richards ...................... 347/14 |
| 2005/0207930 A1 | 9/2005 | Yamaguchi |
| 2005/0238804 A1 | 10/2005 | Garbar |
| 2006/0001726 A1 | 1/2006 | Kodas et al. |
| 2006/0047014 A1 | 3/2006 | Hopper et al. |
| 2006/0083694 A1 | 4/2006 | Kodas et al. |
| 2006/0158497 A1 | 7/2006 | Vanheusden et al. |
| 2006/0159603 A1 | 7/2006 | Vanheusden et al. |
| 2006/0162497 A1 | 7/2006 | Kodas et al. |
| 2006/0163744 A1 | 7/2006 | Vanheusden et al. |
| 2006/0165898 A1 | 7/2006 | Kodas et al. |

| | | | |
|---|---|---|---|
| 2006/0165910 | A1 | 7/2006 | Kodas et al. |
| 2006/0166057 | A1 | 7/2006 | Kodas et al. |
| 2006/0176350 | A1 | 8/2006 | Howarth et al. |

FOREIGN PATENT DOCUMENTS

| | | | |
|---|---|---|---|
| EP | 0 449 309 B9 | 3/1991 | |
| EP | 0 537 502 B1 | 9/1992 | |
| EP | 0 641 670 B1 | 8/1994 | |
| EP | 0 696 515 B1 | 5/1995 | |
| EP | 0 824 138 A2 | 7/1997 | |
| EP | 0 930 641 A3 | 1/1999 | |
| EP | 0 995 718 B1 | 9/1999 | |
| EP | 0 977 212 A2 | 2/2000 | |
| EP | 0 982 090 A1 | 3/2000 | |
| EP | 1 083 578 A1 | 3/2001 | |
| EP | 1 107 298 A2 | 6/2001 | |
| EP | 1 339 073 A1 | 9/2001 | |
| EP | 1 302 895 A3 | 4/2002 | |
| EP | 1 335 393 A1 | 4/2002 | |
| EP | 1 426 978 A1 | 8/2002 | |
| EP | 0 995 718 B1 | 11/2002 | |
| EP | 1 493 780 A1 | 4/2003 | |
| EP | 1 323 793 A1 | 7/2003 | |
| EP | 1 340 568 A1 | 9/2003 | |
| EP | 1 342 760 A1 | 9/2003 | |
| EP | 1 544 905 A1 | 9/2003 | |
| EP | 1 571 186 A1 | 2/2005 | |
| EP | 1 515 348 A2 | 3/2005 | |
| JP | 62-113164 | 5/1987 | |
| JP | 01-303787 | 7/1989 | |
| JP | 2002-124016 | 5/1990 | |
| JP | 2000-011875 | 1/2000 | |
| JP | 2000-182889 | 6/2000 | |
| JP | 2001-167633 | 6/2001 | |
| JP | 2004-311725 | 4/2004 | |
| JP | 2005-191059 | 7/2005 | |
| JP | 2005-219873 | 8/2005 | |
| WO | WO 89/05567 | 6/1989 | |
| WO | WO 97/48257 | 12/1997 | |
| WO | WO 98/08362 | 2/1998 | |
| WO | WO 98/37133 A1 | 8/1998 | |
| WO | WO 99/16556 A1 | 4/1999 | |
| WO | WO 99/16601 A1 | 4/1999 | |
| WO | WO 99/17351 A1 | 4/1999 | |
| WO | WO 99/61911 | 12/1999 | |
| WO | WO 00/10197 A | 2/2000 | |
| WO | WO 00/10736 | 3/2000 | |
| WO | WO 00/29208 A1 | 5/2000 | |
| WO | WO 00/69235 A1 | 11/2000 | |
| WO | WO 00/72224 A1 | 11/2000 | |
| WO | WO 01/54203 A2 | 7/2001 | |
| WO | WO/01/56736 A2 | 8/2001 | |
| WO | WO 01/82315 A1 | 11/2001 | |
| WO | WO 01/87503 A1 | 11/2001 | |
| WO | WO 02/04698 A2 | 1/2002 | |
| WO | WO 02/05294 A1 | 1/2002 | |
| WO | WO 02/098576 A1 | 12/2002 | |
| WO | WO 03/018645 A1 | 3/2003 | |
| WO | WO 03/032084 A2 | 4/2003 | |
| WO | WO 03/035279 A1 | 5/2003 | |
| WO | WO 03/038002 A1 | 5/2003 | |
| WO | WO 03/051562 A1 | 6/2003 | |
| WO | WO 03/106573 A1 | 12/2003 | |
| WO | WO 2004/005413 A1 | 1/2004 | |
| WO | WO 2004/027787 A1 | 4/2004 | |
| WO | WO 2004/030072 A1 | 4/2004 | |
| WO | WO 2004/050260 A3 | 6/2004 | |
| WO | WO 2004/050350 A1 | 6/2004 | |
| WO | WO 2004/062890 A2 | 7/2004 | |
| WO | WO 2004/063295 A1 | 7/2004 | |
| WO | WO 2004/068918 A3 | 8/2004 | |
| WO | WO 2004/075211 | 9/2004 | |
| WO | WO 2004/078641 A1 | 9/2004 | |
| WO | WO 2004/104153 A1 | 12/2004 | |
| WO | WO 2004/105985 A1 | 12/2004 | |
| WO | WO 2005/044451 A1 | 5/2005 | |
| WO | WO 2006/061557 A1 | 6/2006 | |

OTHER PUBLICATIONS

Dispersion and Stability of Silver Inks, Tay, et al., "Journal of Materials Science" vol. 37, pp. 4653-4661 (2002).

Ethylene Glycol-Mediated Synthesis of Metal Oxide Nanowires, X. Jiang, Y. Wang, T. Herricks, Y. Xia, "Journal of Materials Chemistry" 14, 695-703 (2004).

Fine Line Conductor Manufacturing Using Drop-On-Demand PZT Printing Technology, Szczech, et al. "IEEE Transactions on Electronics Packaging Manufacturing" vol. 25, No. 1 (2002).

Gold and Silve Nanoparticles: A Class of Chromophores with Colors Tunable in the Range from 400 to 750 nm, Y. Sun, Y. Xia, "The Analyst, The Royal Scoiety of Chemistry" 128, 686-691 (2003).

Ink Jet Printing of Hybrid Circuits, R.W. Vest, Tweedell and B.C. Buchanan, "Hybrid Microelectronics" 6, 261, 267 (1983).

Ink-Jet Printed Nanoparticle Microelectromechanical Systems, Fuller, et al., "Journal of Microelectromechanical Systems" vol. 11, No. 1 (2002).

Ink-Jet Printing of Catalyst Patterns for Electroless Metal Deposition, Shah, et al., "American Chemical Society" 15, 1584-1587 (1999).

Large-Scale Synthesis of Monodisperse Nanorods of Se/Te Alloys Through a Homogeneous Nucleation and Solution Growth Process, B. Mayers, B. Gates, Y. Yin, Y. Xia, "Advanced Materials" 13, No. 18 (2001).

Large-Scale Synthesis of Silver Nanocubes: The Role of HICl in Promoting Cube Perfection and Monodispersity, S.H. Im, Y.T. Lee, B. Wiley, Y. Xia "Angewandte Chemical International Edition" 44, 2154-2157 (2005).

Large-Scale Synthesis of Uniform Silver Nanowires through a Soft, Self-Seeding, Polyol Process "Advanced Materials" 14, No. 11 (2002).

Late-News Paper: Inkjet-Printed Bus and Address Electrodes for Plasma Display, Furusawa, et al., "SID 02 Digest" pp. 753-755.

Liquid Ink Jet Printing With MOD Inks for Hybrid Microcircuits, K.F. Teng, R.W. Vest "IEEE Transaction on Components, Hybrids and Manufacturing Technology" vol. CHMT-12, No. 4, 545-549 (1987).

Materials, Silver Ink for Jet Printing "NASA Tech Briefs" Aug. 1989.

Microwave-polyol Process for Metal Nanophases, S. Komarneni, H. Katsuki, D. Li, A.S. Bhalla "Journal of Physics, Condensed Matter" 16, S1305-S1312 (2004).

New Development of Nonlinear Optical Crystals for the Ultraviolet Region with Molecular Engineering Approach, C. Chen, Y. Wang, Y. Xia, B. Wu, D. Tang, K. Wu, Z. Wenrong, L. Yu, L. Mei "Journal of Applied Physics" 77, (6) 1995).

New Nonlinear Optical Crystals for UV and VUV Harmonic Generation, Y. Xia, C. Chen, D. Tang, B Wu Advanced Materials: 7, No. 1 (1995).

Physical Mechanisms Governing Pattern Fidelity in Microscale Offset Printing, Darhuber, et al. "Journal of Applied Physics", vol. 90, No. 7, pp. 3602-3609 (2001).

Polyol Synthesis of Uniform Silver Nanowires: A Plausible Growth Mechanism and the Supporting Evidence, Y. Sun, B Mayers, T. Herricks, Y. Xia "Nano Letters" vol. 3, No. 7, 955-960 (2003).

Polyol Synthesis of Silver Nanoparticles: Use of Choloride and Oxygen to Promote the Formation of Single-Crystal, Truncated Cubes and Tetrahedrons, B. Wiley, T. Herricks, Y. Sun, Y. Xia "Nano Letters" vol. 4, No. 9, 1733-1739 (2004).

Polyol Synthesis of Platinum Nanoparticles: Control of Morphology with Sodium Nitrate, T. Herricks, J. Chen, Y. Xia "Nano Letters" vol. 4, No. 12, 2367-2371 (2004).

Polyol Synthesis of Platinum Nanostructures: Control of Morphology Through the Manipulation of Reduction Kinetics, J. Chen, T. Herricks, Y. Xia "Angewandte Chemical International Edition" 44, 2589-2592 (2005).

Polyol Synthesis of Silver Nanostructures: Control of Product Morphology with Fe(II) or Fe(III) Species, B. Wiley, Y. Sun, Y. Xia "Langmuir the ACS Journal of Surfaces and Colloids" Vo 21, No. 18 (2005).

Preparation and Characterization of Nano-Sized Ag/PVP Composites for Optical Applications, G Carotenuto, G.P. Pepe, L. Nicolais "The European Physical Journal B" 16, 11-17 (2000).

Preparation of Colloidal Silver Dispersions by the Polyol Process Part 1—Synthesis and Characterization, P.Y. Silvert, R. Herrera-Urbina, N. Duvauchelle, V. Vijayakrishan, K. Tekaia-Elhsissen "Journal of Materials Chemistry" 6(4), 573-577 (1996).
Preparation of Colloidal Silver Dispersions by the Polyol Process Part 2—Mechanism of Particle Formation, P.-Y. Silvert, R. Herrera-Urbina, K. Tekaia-Elhsissen "Journal of Materials Chemistry" 7(2), 293-299 (1997).
Preparation of Gold, Platinum, Palladium and Silver Nanoparticles by the Reduction of their Salts with a Weak Reductant-Potassium Bitartrate, Y. Tan, X. Dai, Y. Li, D. Zhu "Journal of Materials Chemistry" 13, 1069-1075 (2003).
Preparation of Polychrome Silver Nanoparticles in Different Solvents, R. He, X. Qian, J. Yin, Z. Zhu "Journal of Materials Chemistry" 12, 3783-3786 (2002).
PVP Protective Mechanism of Ultrafine Silve Powder Synthesized by Chemical Reduction Processes, Z. Zhang, B. Zhao, L. Hu "Journal of Solid State Chemistry" 121, 105-110, Article No. 0015 (1996).
Shape-Controlled Synthesis of Gold and Silver Nanoparticles, Y. Sun, Y. Xia "Science Magazine" vol. 298, pp. 2176-2179 (2002).
Shape-Controlled Synthesis of Silver and Gold Nanostructures, B. Wiley, Y. Sun, J. Chen, H. Cang, Z.Y. Li, X. Li, Y. Xia "MRS Bulletin" vol. 30 (2005).
Silver Nanowires Can Be Directly Coated with Amorphous Silica to Generate Well-Controlled Coaxial Nanocables of Silver/Silica, Y. Yin, Y. Lu, Y. Sun, Y. Xia "Nano Letters" vol. 2, No. 4, 427-430 (2002).
Site Selective Copper and Silver Electroless Metallization Facilitated by a Photolithographically Patterned Hydrogen Silsesquioxane Mediated Seed Layer, Harness, et al. "American Chemical Society".
Snythesis of Monodisperse Au, Pt, Pd, Ru and Ir Nanoparticles in Ethylene Glycol, F.Bonet, V. Delmas, S. Grugeon, R. Herrera Urbina, P-Y. Silvert, K. Tekaia-Elhsissen "NanoStructured Materials" vol. 11, No. 8, pp. 1277-1284 (1999).
Synthesis of Monodisperse Submicronic Gold Particles by the Polyol Process, P-Y. Silvert, K. Tekaia-Elhsissen "Solid State Ionics" 82, 53-60 (1995).
Tape Compositions for the Deposition of Electronic Features, T. Kodas, U.S. Appl. No. 10/274,495 (Oct. 18, 2002).
Transformation of Silver Nanospheres into Nanobelts and Triangular Nanoplates Through a Thermal Process, Y. Sun, B. Mayers, Y. Xia "Nano Letters" vol. 3, No. 5, 675-679 (2003).
Triangular Nanoplates of Silver: Synthesis, Characterization, and Use as Sacrificial Templates for Generating Triangular Nanorings of Gold, Y. Sun, Y. Xia "Advanced Materials" 15, No. 9 (2003).
Uniform Silver Nanowires Synthesis by Reducing AgNO3 with Ethylene Glycol in the Presence of Seeds and Poly(Vinyl Pyrrolidone), Y. Sun, Y. Yin, B.T. Mayers, T. Herricks, Y. Xia "Chemical Materials" 14, 4736-4745 (2002).
ITT Cuts Costs of PC Board Manufacturing, K. Dreyfack, "Electronics" vol. 52, No. 17 (1979).
(2005) "How Printable Computers Will Work", Worldwide Web Reference Source, http://computer.howstuffworks.com/printable-computer.htm/printable Date Retrieved: May 23, 2005.
(2005) "Definitions of inkjet printer on the Web:", Worldwide Web Reference Source, http://www.google.com/search?hl=en&lr=&oi+defmore&q=define:inkjet+printer Date Retrieved: May 23, 2005.
(2005) "Screen Printing Technology, Principles of Screen-printing", Worldwide Web Reference Source, http://www.spauk.co.uk/TechnicalPages/Screen%20TP.pdf Date Retrieved: May 3, 2006.
(Unknown) "Lithography—definition of Lithography in Encyclopedia", Worldwide Web Reference Source, http://encyclopedia.laborlawtalk.com/Lithography Date Retrieved: May 25, 2005.
(2006) "Photolithography: Definition and Much More From Answers.com", Worldwide Web Reference Source, http://www.answers.com/topic/photolithography Date Retrieved: May 25, 2005.
(Dec. 3, 2002) "Printing Drawings and Photographic Images", Worldwide Web Reference Source, http://histclo.hispeed.com/photo/photo-print.html Date Retrieved: May 25, 2005.
(Apr. 5, 2006) "Photolithography", Worldwide Web Reference Source, http://www.ece.gatech.edu/research/labs/vc/theory/photolith.html Date Retrieved: May 25, 2005.
Measurement of Clay Surface Areas by Polyvinylpyrrolidone (PVP) Sorption and Its Use for Quantifying Illite and Smectite Abundance, A.E. Blum, D.D. Eberl, "Clays and Clay Mineals", vol. 52, No. 5, 589-602 (2004).

Metal Nanoparticle Compositions, Vanheusden, et al. U.S. Appl. No. 11/331,211, filed Jan. 13, 2006.
Separation of Metal Nanoparticles, Vanheusden, et al. U.S. Appl. No. 11/331,238, filed Jan. 13, 2006.
Production of Metal Nanoparticles, Vanheusden, et al. U.S. Appl. No. 11/331,230, filed Jan. 13, 2006.
Printable Electronic Conductors, Vanheusden, et al. U.S. Appl. No. 11/231,231, filed Jan. 13, 2006.
Replacement of Passive Electrical Components, Howarth, et al. U.S. Appl. No. 11/331,186, filed Jan. 13, 2006.
Circuit Modeling and Selective Deposition, Howarth, et al. U.S. Appl. No. 11/331,188, filed Jan. 13, 2006.
Ink-Jet Printing of Compositionally Non-Uniform Features, Vanheusden, et al. U.S. Appl. No. 11/331,237, filed Jan. 13, 2006.
Printable Electronic Features on Non-Uniform Substrate and Processes for Making Same, Vanheusden, et al., U.S. Appl. No. 11/331,190, filed Jan. 13, 2006.
Controlling Ink Migration During the Formation of Printable Electronic Features, Kowalski, et al., U.S. Appl. No. 11/331,185, filed Jan. 13, 2006.
Processes for Planarizing Substrates and Enapsulating Printable Electronic Features, Mark Kowalski, U.S. Appl. No. 11/331,239, filed Jan. 13, 2006.
Optimized Multi-Layer Printing of Electroics and Displays, Edwards, et al. U.S. Appl. No. 11/331,187, filed Jan. 13, 2006.
A System and Process for Manufacturing Application Specific Printable Circuits (ASPC's) and Other Custom Electronic Devices, Chuck Edwards, U.S. Appl. No. 11/331,189, filed Jan. 13, 2006.
A System and Process for Manufacturing Custom Electronics by Combining Traditional Electronics With Printable Electronics, Chuck Edwards, U.S. Appl. No. 11/331,191, filed Jan. 13, 2006.
Security Features, Their Use, and Processes for Making Them, Hampden-Smith, et al. U.S. Appl. No. 11/331,233, filed Jan. 13, 2006.
All-Polymer Thin Film Transistors Fabricated by High-Resolution Ink-Jet Printing, Kawase, T., et al. "IEEE International Electron Devices Meeting", pp. 25.5.1-25.5.4 (2000).
All-Polymer Thin Film Transistor Fabricated by High-Resolution Ink-Jet Printing, Shimoda, T., et al. "IEEE International Solid State Circuits Conference", Session 16 (2004).
Custom Color Liquid Ink Development (LID) Process, Goodman, N.B., "Xerox Disclosure Journal", vol. 21, No. 2, p. 157 (1996).
Ink Jet Color Copier and Universal Printer, Pearson, R.C., et al. "IBM Technical Disclosure Bulletin", vol. 16, No. 1, pp. 144-145 (1973).
Inkjet Printing of Nanosized Silver Colloids, Lee, H-H, et al., "Nanotechnology" 16, pp. 2436-2441 (2005).
Monolayer-Protected Clusters: Molecular Precursors to Metal Films "Chemical Materials", 13, pp. 87-95 (2001).
Oligomeric Ketoester Precursors for Improved Polyimide Planarization and Gapfilling "IBM Technical Disclosure Bulletin", vol. 30, No. 1, pp. 343-346 (1987).
Porosity-Grain Growth Relationships in the Sintering of Nanocrystalline Ceramics "NanoStructured Materials", vol. 3, pp. 43-52 (1993).
Smoothing of Irregular $SiO_2$ Surfaces, Spencer, O.S. "IBM Technical Disclosure Bulletin", vol. 20, No. 11B, pp. 4842-4843 (1978).
Blum, A.E., et al., "Measurement of Clay Surface Areas by Polyvinylpyrrolidone (PVP) Sorption and Its Use for Quantifying Illite and Smectite Abundance", *Clays and Clay Minerals*, vol. 52, No. 5, pp. 589-602 (2004).
Carotenuto, G., et al., "A Qualitative Model for the Growth Mechanism of Silver Clusters in Polymer Solution", *The European Physical Journal B*, 24, pp. 437-441 (2001).
Fievet, F., et al., "Preparing Monodisperse Metal Powders I Micrometer and Submicrometer Sizes by the Polyol Process", *MRS Bulletin*, Dec. 1989.
Lee, H.K., et al., "One-step preparation of ultrafine poly(acrylonitrile) fibers containing silver nanoparticles", *Materials Letters*, 59, pp. 2977-2980 (2005).
Xia, Y., et al., "Shape-Controlled Synthesis of Metal Nanostructures: The Case of Silver", *Chemistry, A European Journal*, 11, pp. 454-463 (2005).
Teng et al., Liquid Ink Jet Printing with MOD Inks for Hybrid Microcircuits, IEEE Transactions on Components, Hybrids, and Manufacturing Technology, vol, CHMT-12, No. 4, Dec. 1987.

\* cited by examiner

NEGATIVE RESIST

POSITIVE RESIST

000
PRINTABLE ELECTRONIC FEATURES ON NON-UNIFORM SUBSTRATE AND PROCESSES FOR MAKING SAME

CROSS REFERENCE TO RELATED APPLICATIONS

This application claims the benefit of U.S. Provisional Application Ser. Nos. 60/643,577; 60/643,629; and 60/643,578, all filed on Jan. 14, 2005, the entireties of which are all incorporated herein by reference.

BACKGROUND OF THE INVENTION

1. Field of the Invention

The invention relates to direct printing. More particularly, the invention relates to a system and method for non-contact direct printing using conductive particles in an ink solution for dispersion on non-uniform substrates.

2. Background Art

Traditional deposition technologies, such as photolithography and screen-printing, both of which are discussed below, are restricted to planar substrates. FIG. 1 illustrates an emulsion exposure process step for lithography printing according to the prior art, and FIG. 2 illustrates a simplified side view of a lithographic printing system according to the prior art.

The lithography process described in reference to FIGS. 1 and 2, can be used to print on paper 20, or other substrates 60 (see FIG. 7). As shown in FIG. 1, current lithographic processes utilize aluminum plates (plates) 2 that have a brushed, or "roughened" texture. The plates 2 are covered with a smooth photosensitive emulsion 4. A photographic negative 6 of the desired image is laid on top of the plate 2, and is exposed to light 8, transferring a positive image to the emulsion 4. The emulsion 4 is then chemically treated to remove the unexposed portions of the emulsion 4. As shown in FIG. 2, the plate 2 is affixed to a first drum 10 on a printing press, and water 24 is rolled over the plate 2, which adheres to the rough, or negative portions of the image. A ink roller 12 coated with ink 14 is then rolled over the plate 2, which adheres to the smooth, or positive portions of the image. If this image were directly transferred to paper 20, or another type of substrate 60, it would create a positive image, but the paper 20 or substrate 60 would be moistened. Instead, a second drum 18 covered with a rubber surface is rolled over the plate 2, which squeezes away the water 24, and picks up the ink 14. The second drum 18 is then rolled over the paper 20 or substrate 60, transferring the ink 14 to it. Because the image is first transferred to the rubber second drum 18, the process is called "offset lithography," due to the fact that the image is offset to the second drum 18 before being applied to the paper.

As one of ordinary skill in the art can appreciate, the lithographic or offset printing process described above in reference to FIGS. 1 and 2 is complicated, involves skilled laborers, and requires very costly machinery, which requires expensive set-up and maintenance. In addition to these significant drawbacks, the lithographic or offset printing system does not print well on non-uniform substrates, whether they are paper or other materials. In some circumstances, use of the lithographic or offset printing system could be detrimental to the actual substrate material itself. Thus, there are significant problems with use of the lithographic or offset printing process on many types of substrate materials.

Another type of lithographic "printing" process is the photolithography process, which is the process for transferring geometric shapes on a mask to the surface of a silicon wafer. While this process is well known for making integrated circuits, it can also be used to impart images onto the semiconductor wafers. This process is therefore useful for only one particular type of substrate, and as shall be discussed, also has significant disadvantages. For example, for even applying simple images to a wafer substrate, as might be done on silicon solar cells, there are numerous steps that involve very expensive machines and very well trained personnel to run the expensive machines. The steps involved in the photolithographic process are wafer cleaning; barrier layer formation; photoresist application; soft baking; mask alignment; exposure and development; and hard-baking.

Attention is directed toward FIG. 3. In the first step, the wafers 30 are chemically cleaned to remove particulate matter on the surface as well as any traces of organic, ionic, and metallic impurities. After cleaning, silicon dioxide, which serves as a barrier layer, is deposited on the surface of the wafer. After the formation of the $SiO_2$ layer 28, photoresist 26 is applied to the surface of the wafer 30. High-speed centrifugal whirling of silicon wafers 30 is the standard method for applying photoresist coatings 26 in manufacturing. This technique, known as "spin coating," produces a thin uniform layer of photoresist 26 on the wafer 30 surface.

There are two types of photoresist (resist) 26: positive and negative. For positive resists, the resist 26 is exposed with UV light 42 (see FIGS. 4A, 4B, and 4C) wherever the underlying material is to be removed. In these resists 26, exposure to the UV light 42 changes the chemical structure of the resist 26 so that it becomes more soluble in the developer. Whatever is exposed, therefore, is more soluble. The exposed resist 26 is then washed away by the developer solution, leaving windows of the bare underlying material. The mask 32, therefore, contains an exact copy of the pattern which is to remain on the wafer 30. See assemblies 34, 36 in FIG. 3.

Negative resists 26 behave in just the opposite manner. Exposure to the UV light 42 causes the negative resist 26 to become polymerized, and more difficult to dissolve. Therefore, the negative resist 26 remains on the surface wherever it is exposed, and the developer solution removes only the unexposed portions. Masks 32 used for negative photoresists, therefore, contain the inverse (or photographic "negative") of the pattern to be transferred. See assemblies 38, 40 in FIG. 3.

Following the exposure of the photoresist layer 26, the step of soft-baking occurs. Soft-baking is the step during which almost all of the solvents are removed from the photoresist coating 26. Soft-baking plays a very critical role in photo-imaging. The photoresist coatings 26 become photosensitive, or imageable, only after softbaking. Over-soft-baking will degrade the photosensitivity of resists 26 by either reducing the developer solubility or actually destroying a portion of the sensitizer. Under-soft-baking will prevent light from reaching the sensitizer. Positive resists 26 are incompletely exposed if considerable solvent remains in the coating. This under-soft-baked positive resists 26 is then readily attacked by the developer in both exposed and unexposed areas, causing less etching resistance.

One of the most important steps in the photolithography process is mask 32 alignment. A mask or "photomask" 32 is a square glass plate with a patterned emulsion of metal film on one side. The mask 32 is aligned with the wafer 30, so that the pattern can be transferred onto the wafer 30 surface. Each additional mask 32 after the first one must be aligned to the previous pattern.

Once the mask 32 has been accurately aligned with the pattern on the wafer's 30 surface, the photoresist 26 is exposed through the pattern on the mask 32 with a high intensity ultraviolet light 42. There are three primary exposure methods: contact, proximity, and projection. They are shown in FIGS. 4A-4C.

In contact printing, FIG. 4A, the resist-coated silicon wafer 30 is brought into physical contact with the glass photomask 32. The wafer 30 is held on a vacuum chuck, and the whole assembly rises until the wafer 30 and mask 32 contact each other. The photoresist 26 is exposed with UV light 42 while the wafer 30 is in contact position with the mask 32. Because of the contact between the resist 26 and mask 32, very high resolution is possible in contact printing (e.g. 1-micron features in 0.5 microns of positive resist). Some drawbacks do exist, however. For example, debris, trapped between the resist 26 and the mask 32, can damage the mask 32 and cause defects in the pattern.

The proximity exposure method, shown in FIG. 4B, is similar to contact printing except that a small gap, between 10 to 25 microns wide, is maintained between the wafer 30 and the mask 32 during exposure. This gap minimizes (but may not eliminate) mask 32 damage. Approximately 2 to 4 micron resolution is possible with proximity printing.

Projection printing, shown in FIG. 4C, avoids mask 32 damage entirely. An image of the patterns on the mask 32 is projected onto the resist-coated wafer 30, which is many centimeters away. In order to achieve high resolution, only a small portion of the mask 32 is imaged. This small image field is scanned or stepped over the surface of the wafer 30. Projection printers that step the mask image over the wafer surface are called step-and-repeat systems. Step-and-repeat projection printers are capable of approximately one micron resolution. Following exposure, one of the last steps in the photolithographic process is development. FIG. 5 shows response curves for both negative and positive resist after exposure and development.

At low-exposure energies, the negative resist 26 remains completely soluble in the developer solution. As the exposure is increased above a threshold energy $E_t$, more of the resist film 26 remains after development. At exposures two or three times the threshold energy, very little of the resist film 26 is dissolved. For positive resists 26, the resist solubility in its developer is finite even at zero-exposure energy. The solubility gradually increases until, at some threshold, it becomes completely soluble. These curves are affected by all the resist processing variables: initial resist thickness, pre-bake conditions, developer chemistry, developing time, and others. Hard-baking is the final step in the photolithographic process. This step is necessary in order to harden the photoresist and improve adhesion of the photoresist to the wafer surface. See FIGS. 6A and 6B.

As one of ordinary skill in the art can appreciate from the discussion above, there are significant drawbacks for use of photolithography when printing images on semiconductor wafers 30. The discussion above serves to highlight the incredible complexity of the steps involved, the precise and therefore expensive equipment necessary to perform such printing, and the likelihood that small imperfections or problems in manufacturing can drastically reduce throughput.

This photolithographic process is used when performing vacuum deposition onto thick and thin film hybrids. One example of a thin film device is a metal oxide semiconductor field effect transistor (MOSFET), which is used in active matrix liquid crystal displays (AMLCD). Another example of a delicate thin film devices are thin film transistor liquid crystal displays (TFT-LCD's). TFT-LCD's utilize large amounts of transistors. Printing on the transistors can only be accomplished by vacuum deposition. Vacuum deposition makes use of the photolithographic process discussed above.

In addition to the expensive photolithographic tools already discussed, vacuum deposition requires additional and expensive machinery, and a significant amount of steps to accomplish the process. Further, skilled workers, which are needed to run the expensive machinery, add to the overall production costs.

FIGS. 7-12 illustrate a process for screen mesh printing according to the prior art. Screen printing is a very old, but commonly used technology that involves relatively inexpensive equipment, but still presents difficulties in practical usage in some applications. As shown in FIG. 7, the screen printing system comprises a screen frame 52 for holding the screen or mesh 66 in place. A stencil 54 is made on the mesh 66 by applying a photosensitive material to the mesh 66, and then applying a negative of the image to be printed onto the photosensitive material. The photosensitive material is developed, leaving a negative of the image to be printed on the mesh 66. Ink 58 is applied to the mesh 66 with the stencil 54, and a squeegee 56 pushes the ink through the parts of the mesh 66 that does not have the stencil 54, onto the substrate 60 below. This process is shown in greater detail in FIG. 8. There are, however, many difficulties that can be encountered when using the screen mesh printing process with non-uniform and other substrate materials.

For example, printing high-resolution patterns into recessed areas presents significant problems with screen-mesh printing. As shown in FIG. 9, the squeegee 56 will have difficulty filling in the valley 68 in the substrate 60 with the ink 58. FIG. 10 illustrates problems associated with screen printing into trenches 68. Again, the squeegee will not be able to adequately fill in, or lay a conductive trace through, the valley/trench 68. In FIG. 11, a mesa 70 exists on the non-uniform substrate 60. The screen printing process cannot adequately print over the mesa 70, thereby leaving portions of the substrate uncovered with the ink 58. Mesas 70 represents the opposite problem as recesses, or valleys 68, but with a further complication. Because the mesa 70 rises above the surface of the substrate 60, it can interfere with operation of the mesh. As shown in FIG. 11, the mesh 66 is pushed up by the mesa 70, causing not only the ink 58 to flow improperly around and on the mesa 70 itself, but perhaps also on the substrate 60 that is in close vicinity to the mesa 70. The closer the mesa 70 is to the squeegee 56, the more sharply pronounced the angle the mesh 66 will make with the surface of the substrate 60, and the greater the chance the ink 58 will not be properly deposited. Other examples of problem areas include printing over sharp edges or ramps (e.g. to connect a contact pad on a die to an electrode on a PCB), or printing a conductive trace between an integrated circuit with lead pins placed on a substrate (PCB) material. In the prior art, the only way to connect the lead pin to the electrode (or pad) on the substrate is with a metal wire.

FIG. 12 illustrates the screen printing process when encountering a via (or "through") hole 72. Conventional screen printing technology cannot get the ink into the via hole in a substantially consistent manner.

The above discussion highlights the significant difficulties encountered when using screen printing on traditional substrate materials. Advanced printing techniques are simply not possible with screen printing. For example, printing of multi-layered features with conventional mesh and photolithography processes cannot create multi-layered devices, or 3-dimensional (3-d) structures. For example, in mesh printing, the mesh 66 will begin to experience the same problems as when a mesa 66 is encountered when a build up occurs. Or, when the squeegee 56 is applied to the mesh 66, the 3-d object will be destroyed by the very process being used to create it.

Additionally, printing on fragile substrates can be damaged by screen-printing. Very fragile substrates, such as thin Si wafers (solar cells), need additional printing to be performed on them after they have been formed. For solar cells, the manufacturer needs to print the current collector grid on the solar cell (this is where the current created by the silicon solar cell is collected and connected to the power system). Solar cells, being made of silicon, are extremely expensive as they need to be made very large in order to be effective. Because of the significant cost associated with the silicon, however, manufacturers try to make the cells as thin as possible, and hence they are substantially more fragile. Screen printing can damage the fragile solar cells.

Printing on a surface that has a wet, chemically-active coating, such as reducing agent or a fixing agent, presents problems for the screen printing process. Placing a second mesh 66 onto a previously wet surface, whether it has been made wet by a first printing action, or some other chemical process, will negatively affect the first wet surface simply because of the physical interaction of the mesh 66 with the wet surface. Meshes 66 are typically made of metal or some other hard material and will interfere with the wet surface for that reason. Similar to this problem is the problem of printing on substrates that have liquid materials such as previously printed inks. One wet ink 58 on top of another, especially when presented through the use of a squeegee 56, will cause the two to interfere with each other, rendering the printing nearly useless.

Printing on surfaces that have thin film devices such as MOSFET transistors, which are used in active matrix liquid crystal displays (AMLCD), will also present problems with the screen printing process. For example, thin film transistor liquid crystal displays (TFT-LCD's) utilize a large amounts of transistors that are very fragile. The force of the squeegee 56 upon the thin fragile transistor surface can break them.

Thus, a need exists for printing on non-uniform substrates that overcomes all of the above mentioned difficulties, as well as those not mentioned, and provide the advantages described in greater detail below.

SUMMARY OF THE INVENTION

It is therefore a general object of the invention to provide a non-contact direct printing system that will obviate or minimize problems of the printing systems and processes previously described.

It is a specific object of the present invention to provide a non-contact direct printing system that can avoid contamination of the substrate surface, and allows for printing on chemically sensitive substrates such as semiconductors. It is a further object of the present invention to use direct printing on non-uniform substrates so that etching is avoided, as well as the resultant potential for contamination. Further, it is an object of the present invention to provide a direct printing system that allows for side-by-side printing of chemically incompatible chemicals such as high-pH and low-Ph inks. It is still another object of the present invention to provide a system and method of direct printing on non-uniform substrates that allows for printing on upwardly and downwardly sloped surfaces of up to at least 90°, by changing one of at least four different printing parameters of the direct printing process: shifting the print data file; advancing or retarding the print timing command; increasing the print timing command signal frequency; and providing for repeated passes over certain topological features. It is yet another object of the present invention to provide a direct printing system that can combine two, three or all four of the aforementioned printing parameters depending upon the particular non-uniform substrate encountered.

The above described disadvantages are overcome and a number of advantages are realized by the present invention. According to an exemplary embodiment, the present invention relates to a process for compensating for a non-uniform surface of a substrate when printing onto the non-uniform surface of the substrate, the process comprising the steps of adjusting a print timing command when printing an electrical component based on a topology of the non-uniform surface of the substrate.

According to another embodiment of the present invention, a process for compensating for a non-uniform surface of a substrate when printing onto the non-uniform surface of the substrate is provided, wherein the process comprises adjusting a portion of an electronic print file when printing an electrical component based on a topology of the non-uniform surface of the substrate.

According to still yet another embodiment of the present invention, a process for compensating for a non-uniform surface of a substrate when printing onto the non-uniform surface of the substrate is provided, the process comprising adjusting a print timing command when printing onto the non-uniform surface of the substrate based on a topology of the non-uniform surface of the substrate.

According to a further embodiment of the present invention, a process of compensating for a non-uniform surface of a substrate when printing onto the non-uniform surface of the substrate is provided, the process comprising adjusting a print drop dot-per-inch quantity when printing an electrical component based on a topology of the non-uniform surface of the substrate.

According to yet another embodiment of the present invention, a process of compensating for a non-uniform surface of a substrate when printing electrical components onto the non-uniform surface of the substrate is provided, comprising a) adjusting a print drop dots-per-inch quantity based on the topology of the non-uniform surface of the substrate; and b) repeating one or more print timing commands that correspond to one or more certain areas of the non-uniform surface of the substrate, without repeating other print timing commands that correspond to any of one or more non-certain areas of the non-uniform surface of the substrate, based on the topology of the non-uniform surface of the substrate.

According to a first aspect of the present invention, a process for compensating for a non-uniform surface of a substrate when printing onto the non-uniform surface of the substrate is provided comprising the steps of: a) adjusting a print timing command when printing an electrical component based on a topology of the non-uniform surface of the substrate. According to the first aspect, the process further comprises a) determining the height of a print head above the surface of the non-uniform surface of the substrate; and b) adjusting the print timing command when printing the electrical component based on the relative height difference between the height of the print head before the previous drop was expelled and after the previous drop was expelled; and c) transmitting the adjusted print timing command to the print head.

According to the first aspect of the present invention, the step of determining the height above the non-uniform surface of a substrate of a print head comprises a) measuring the height of the print head above the non-uniform surface of the substrate by a laser interferometer, and the step of adjusting a print timing command when printing an electrical component comprises a) initiating the print timing command to cause a print head to expel a next drop sooner by a first delta τ amount if a height of the print head above the non-uniform surface of the substrate at a next print drop release position increases relative to a height of the print head above the non-uniform surface of the substrate at a previous print drop release position; and b) initiating the print timing command to cause the print head to expel the next drop later by a second delta τ amount if the height of the print head above the non-uniform surface of the substrate at the next print drop release position decreases relative to the height of the print head above the non-uniform surface of the substrate at the previous print drop release position.

According to the first aspect of the present invention, the first or second delta τ is a measurement of time, and if the print timing command occurs sooner by the first delta τ amount, the first delta τ amount is a negative number added to a print timing command period. Still further, if the print timing command occurs later by the second delta τ amount, the second delta τ amount is a positive number added to a print timing command period.

According to the first aspect of the present invention, the step of adjusting a print timing command when printing electrical components comprises: a) calculating a first delta τ amount if a height of the print head above the non-uniform surface of the substrate at a next print drop release position increases relative to the height of the print head above the non-uniform surface of the substrate at a previous print drop release position; b) calculating a second delta τ amount if a height of the print head above the non-uniform surface of the substrate at a next print drop release position decreases relative to the height of the print head above the non-uniform surface of the substrate at a previous print drop release position, wherein the first delta τ and the second delta τ amount are calculated according to the speed of the print head in a direction substantially parallel to a plane of the non-uniform surface of the substrate, the height of the print head above the non-uniform surface of the substrate and the velocity of the print drop as it is expelled from the print head; c) adjusting the print timing command by either the first or second delta τ amount; and d) transmitting the adjusted print timing command to the print head.

According to the first aspect of the present invention, the first and second delta τ amount is a measurement of time, and the step of calculating either the first or second delta τ amount comprises: performing an algorithm that takes into account an amount of height differential between the height of the print head above the non-uniform surface of the substrate at a next print drop release position and the height of the print head above the non-surface of the substrate at the previous print drop release position.

According to the first aspect of the present invention, the process further comprises a) creating a topological survey of the non-uniform surface of the substrate; b) creating a print file for a desired print image to be printed onto the non-uniform surface of the substrate; c) initiating a printing sequence to print the desired print image onto the non-uniform surface of the substrate; d) determining an initial location of a print head with respect to the non-uniform surface of the substrate; e) determining a drop velocity of a drop of ink from the print head; and f) determining a print head velocity relative to the substrate material.

According to a second aspect of the present invention, a process for compensating for a non-uniform surface of a substrate when printing onto the non-uniform surface of the substrate is provided comprising the steps of: a) adjusting a portion of an electronic print file when printing an electrical component based on a topology of the non-uniform surface of the substrate. According to the second aspect of the present invention, the process further comprises a) determining the height of a print head above the surface of the non-uniform surface of the substrate; and b) adjusting a portion of an electronic print file when printing the electrical component based on the relative height difference between the height of the print head before the previous drop was expelled and after the previous drop was expelled; and c) transmitting the adjusted print timing command to the print head.

According to the second aspect of the present invention, the step of determining the height of a print head above the surface of the non-uniform surface of the substrate comprises: a) measuring the height of the print head above the non-uniform surface of the substrate by a laser interferometer. According to the second aspect of the present invention, the step of adjusting a portion of an electronic print file comprises: a) shifting a portion of an electronic print file towards a direction from which a print head is moving to expel a next drop sooner by a first delta x amount if a height of the print head above the non-uniform surface of the substrate at a next print drop release position increases relative to a height of the print head above the non-uniform surface of the substrate at a previous print drop release position; and b) shifting a portion of an electronic print file away from a direction from which the print head is moving to expel the next drop sooner by a second delta x amount if the height of the print head above the non-uniform surface of the substrate at the next print drop release position increases relative to the height of the print head above the non-uniform surface of the substrate at the previous print drop release position.

According to the second aspect of the present invention, the first or second delta x is a measurement of distance in the direction the print head is moving, and if the portion of an electronic print file is shifted towards a direction from which the print head is moving, the print file is shifted in a negative x direction.

According to the second aspect of the present invention, if the portion of an electronic print file is shifted away from a direction from which the print head is moving, the print file is shifted in a positive x direction.

According to the second aspect of the present invention, the step of shifting a print pattern towards a direction from which a print head is moving to initiate the print sequence for a next drop comprises: a) changing a first timing period of a signal that causes the print head to expel a print drop to expel the print drop sooner by a first delta time amount that corresponds to the first delta x amount. According to the second aspect of the present invention, the step of shifting a print pattern away a direction from which a print head is moving to initiate the print sequence for a next drop comprises: a) changing a timing period of a signal that causes the print head to expel a print drop to expel the print drop later by a second delta time amount that corresponds to the second delta x amount.

According to the second aspect of the present invention, the step of shifting a print pattern towards a direction from which a print head is moving to initiate the print sequence for a next drop comprises: a) advancing a print pattern data set associated with a first x-y position, by one or more print timing command periods such that the print pattern data set is transmitted to the print head by the one or more print timing command periods prior to when the print pattern data set would have been transmitted to the print head.

According to the second aspect of the present invention, the step of shifting a print pattern away a direction from which a print head is moving to initiate the print sequence for a next drop comprises: a) retarding a print pattern data set associated with a first x-y position, by one or more print timing command periods such that the print pattern data set is transmitted to the print head by the one or more print timing command periods after when the print pattern data set would have been transmitted to the print head.

According to the second aspect of the present invention, the step of adjusting a portion of an electronic print file comprises: a) calculating a first delta x amount, if a height of the print head above the non-uniform surface of the substrate at a next print drop release position increases relative to the height of the print head above the non-uniform surface of the substrate at a previous print drop release position; b) calculating a second delta x amount if a height of the print head above the non-uniform surface of the substrate at a next print drop release position decreases relative to the height of the print head above the non-uniform surface of the substrate at a previous print drop release position; wherein, the first and second delta x amount is calculated according to the speed of the print head in a direction substantially parallel to a plane of the non-uniform surface of the substrate, the height of the print head above the non-uniform surface of the substrate and the velocity of the print drop as it is expelled from the print head; c) adjusting the portion of the electronic print by either the first or second delta x amount; and d) transmitting the adjusted electronic print file to the print head.

According to the second aspect of the present invention, the first and second delta x amount is a measurement of distance in the direction the print head is moving, and the step of calculating either the first or second delta x amount comprises: performing an algorithm that takes into account an amount of height differential between the height of the print head above the non-uniform surface of the substrate at a next print drop release position and the height of the print head above the non-uniform surface of the substrate at the previous print drop release position.

According to the second aspect of the present invention, the process further comprises a) creating a topological survey of the non-uniform surface of the substrate; b) creating a print file for a desired print image to be printed onto the non-uniform surface of the substrate; c) initiating a printing sequence to print the desired print image onto the non-uniform surface of the substrate; d) determining an initial location of a print head with respect to the non-uniform surface of the substrate; e) determining a drop velocity of a drop of ink from the print head; and f) determining a print head velocity relative to the substrate material.

According to a third aspect of the present invention, a process for compensating for a non-uniform surface of a substrate when printing onto the non-uniform surface of the substrate is provided, comprising the steps of: a) adjusting a print timing command when printing onto the non-uniform surface of the substrate based on a topology of the non-uniform surface of the substrate.

According to the third aspect of the present invention, the process further comprises: a) direct printing an electrical component onto a non-uniform surface of the substrate based on the adjusted print timing command.

According to a fourth aspect of the present invention, a process of compensating for a non-uniform surface of a substrate when printing onto the non-uniform surface of the substrate is provided comprising the steps of: a) adjusting a print drop dot-per-inch quantity when printing an electrical component based on a topology of the non-uniform surface of the substrate.

According to the fourth aspect of the present invention, the step of adjusting a print drop dot-per-inch quantity comprises: a) adjusting a print timing command when printing an electrical component based on the topology of the non-uniform surface of the substrate; and b) adjusting a frequency of the print timing command based on the topology of the non-uniform surface of the substrate.

According to the fourth aspect of the present invention, the process further comprises: a) determining the height of a print head above the surface of the non-uniform surface of the substrate; and b) adjusting the print timing command when printing the electrical component based on the relative height difference between the height of the print head before the previous drop was expelled and after the previous drop was expelled; and c) transmitting the adjusted print timing command to the print head.

According to the fourth aspect of the present invention, the step of determining the height above the non-uniform surface of a substrate of a print head comprises: a) measuring the height of the print head above the non-uniform surface of the substrate by a laser interferometer.

According to the fourth aspect of the present invention, the step of adjusting a print timing command when printing an electrical component comprises: a) initiating the print timing command to cause a print head to expel a next drop sooner by a first delta $\tau$ amount if a height of the print head above the non-uniform surface of the substrate at a next print drop release position increases relative to a height of the print head above the non-uniform surface of the substrate at a previous print drop release position; and b) initiating the print timing command to cause the print head to expel the next drop later by a second delta $\tau$ amount if the height of the print head above the non-uniform surface of the substrate at the next print drop release position decreases relative to the height of the print head above the non-uniform surface of the substrate at the previous print drop release position.

According to the fourth aspect of the present invention, the first or second delta $\tau$ is a measurement of time, and if the print timing command occurs sooner by the first delta $\tau$ amount, the first delta $\tau$ amount is a negative number added to a print timing command period, and if the print timing command occurs later by the second delta $\tau$ amount, the second delta $\tau$ amount is a positive number added to a print timing command period.

According to the fourth aspect of the present invention, the step of adjusting a print timing command when printing electrical components comprises: a) calculating a first delta $\tau$ amount if a height of the print head above the non-uniform surface of the substrate at a next print drop release position increases relative to the height of the print head above the non-uniform surface of the substrate at a previous print drop release position; b) calculating a second delta $\tau$ amount if a height of the print head above the non-uniform surface of the substrate at a next print drop release position decreases relative to the height of the print head above the non-uniform surface of the substrate at a previous print drop release position, wherein the first delta $\tau$ and the second delta $\tau$ amount are calculated according to the speed of the print head in a direction substantially parallel to a plane of the non-uniform surface of the substrate, the height of the print head above the non-uniform surface of the substrate and the velocity of the print drop as it is expelled from the print head; c) adjusting the print timing command by either the first or second delta $\tau$ amount; and d) transmitting the adjusted print timing command to the print head.

According to the fourth aspect of the present invention, the first and second delta $\tau$ amount is a measurement of time, and the step of calculating either the first or second delta $\tau$ amount comprises: performing an algorithm that takes into account an amount of height differential between the height of the print head above the non-uniform surface of the substrate at a next print drop release position and the height of the print head above the non-uniform surface of the substrate at the previous print drop release position.

According to the fourth aspect of the present invention, the process further comprises a) creating a topological survey of the non-uniform surface of the substrate; b) creating a print file for a desired print image to be printed onto the non-uniform surface of the substrate; c) initiating a printing sequence to print the desired print image onto the non-uniform surface of the substrate; d) determining an initial location of a print head with respect to the non-uniform surface of the substrate; e) determining a drop velocity of a drop of ink from the print head; and f) determining a print head velocity relative to the substrate material.

According to the fourth aspect of the present invention, the step of adjusting a print drop-per-inch quantity based on the topology of the non-uniform surface of the substrate comprises: a) adjusting a timing and frequency of a print timing command based on a sloped surface of the non-uniform surface of the substrate, and the step of adjusting a print drop dot-per-inch quantity based on the topology of the non-uniform surface of the substrate comprises: a) causing a print head to repeat a print sequence for a certain topological feature only at a location of the topological feature.

According to the fourth aspect of the present invention, the step of adjusting a frequency of the print timing command based on the topology of the non-uniform surface of the substrate comprises: a) increasing the print drop dot-per-inch quantity by a factor of cos h(x) when a slope of x degrees occurs in the non-uniform surface of the substrate, and the step of adjusting a frequency of a print timing command based on the topology of the non-uniform surface of the substrate comprises: a) decreasing by a first amount at least one or more timing periods of the print timing command such that the print head expels at least one or more print drops at a higher frequency than the print drops were previously expelled.

According to the fourth aspect of the present invention, the amount of the at least one or more timing periods corresponds to a density of print drop dots-per-inch necessary to substantially cover a certain topological feature.

According to a fifth aspect of the present invention, a process of compensating for a non-uniform surface of a substrate when printing electrical components onto the non-uniform surface of the substrate, is provided comprising the steps of: a) adjusting a print drop dots-per-inch quantity based on the topology of the non-uniform surface of the substrate; and b) repeating one or more print timing commands that correspond to one or more certain areas of the non-uniform surface of the substrate, without repeating other print timing commands that correspond to any of one or more non-certain areas of the non-uniform surface of the substrate, based on the topology of the non-uniform surface of the substrate.

According to the fifth aspect of the present invention, the step of repeating one or more print timing commands that correspond to one or more certain areas of the non-uniform surface of the substrate without repeating other print timing commands that correspond to any of one or more non-certain areas of the non-uniform surface of the substrate comprises: a) printing in a first direction at the one or more certain areas of the non-uniform surface of the substrate; b) printing in a direction opposite to the first direction at the one or more certain area of the non-uniform surface of the substrate; and c) repeating steps a) and b) until the non-uniform surface of the substrate has been substantially covered.

According to the fifth aspect of the present invention, the step of adjusting a print drop dot-per-inch quantity comprises: a) adjusting a print timing command when printing an electrical component based on the topology of the non-uniform surface of the substrate; and b) adjusting a frequency of the print timing command based on the topology of the non-uniform surface of the substrate.

According to the fifth aspect of the present invention, the process further comprises: a) determining the height of a print head above the surface of the non-uniform surface of the substrate; b) adjusting the print timing command when printing the electrical component based on the relative height difference between the height of the print head before the previous drop was expelled and after the previous drop was expelled; and c) transmitting the adjusted print timing command to the print head.

According to the fifth aspect of the present invention, the step of determining the height above the non-uniform surface of a substrate of a print head comprises: a) measuring the height of the print head above the non-uniform surface of the substrate by a laser interferometer. According to the fifth aspect of the present invention, the step of adjusting a print timing command when printing an electrical component comprises: a) initiating the print timing command to cause a print head to expel a next drop sooner by a first delta $\tau$ amount if a height of the print head above the non-uniform surface of the substrate at a next print drop release position increases relative to a height of the print head above the non-uniform surface of the substrate at a previous print drop release position; and b) initiating the print timing command to cause the print head to expel the next drop later by a second delta $\tau$ amount if the height of the print head above the non-uniform surface of the substrate at the next print drop release position decreases relative to the height of the print head above the non-uniform surface of the substrate at the previous print drop release position.

According to the fifth aspect of the present invention, the first or second delta $\tau$ is a measurement of time, and if the print timing command occurs sooner by the first delta $\tau$ amount, the first delta $\tau$ amount is a negative number added to a print timing command period. According to the fifth aspect of the present invention, if the print timing command occurs later by the second delta $\tau$ amount, the second delta $\tau$ amount is a positive number added to a print timing command period.

According to the fifth aspect of the present invention, the step of adjusting a print timing command when printing electrical components comprises: a) calculating a first delta $\tau$ amount if a height of the print head above the non-uniform surface of the substrate at a next print drop release position increases relative to the height of the print head above the non-uniform surface of the substrate at a previous print drop release position; b) calculating a second delta $\tau$ amount if a height of the print head above the non-uniform surface of the substrate at a next print drop release position decreases relative to the height of the print head above the non-uniform surface of the substrate at a previous print drop release position, wherein the first delta $\tau$ and the second delta $\tau$ amount are calculated according to the speed of the print head in a direction substantially parallel to a plane of the non-uniform surface of the substrate, the height of the print head above the non-uniform surface of the substrate and the velocity of the print drop as it is expelled from the print head; c) adjusting the print timing command by either the first or second delta $\tau$ amount; and d) transmitting the adjusted print timing command to the print head.

According to the fifth aspect of the present invention, the first and second delta $\tau$ amount is a measurement of time, and the step of calculating either the first or second delta $\tau$ amount comprises: performing an algorithm that takes into account an amount of height differential between the height of the print head above the non-uniform surface of the substrate at a next print drop release position and the height of the print head above the non-uniform surface of the substrate at the previous print drop release position.

According to the fifth aspect of the present invention, the process further comprises a) creating a topological survey of the non-uniform surface of the substrate; b) creating a print file for a desired print image to be printed onto the non-uniform surface of the substrate; c) initiating a printing sequence to print the desired print image onto the non-uniform surface of the substrate; d) determining an initial location of a print head with respect to the non-uniform surface of the substrate; e) determining a drop velocity of a drop of ink from the print head; and f) determining a print head velocity relative to the substrate material.

According to the fifth aspect of the present invention, the step of adjusting a print drop-per-inch quantity based on the topology of the non-uniform surface of the substrate comprises: a) adjusting a timing and frequency of a print timing command based on a sloped surface of the non-uniform surface of the substrate.

According to the fifth aspect of the present invention, the step of adjusting a print drop dot-per-inch quantity based on the topology of the non-uniform surface of the substrate comprises: a) causing a print head to repeat a print sequence for a certain topological feature only at a location of the topological feature. According to the fifth aspect of the present invention, the step of adjusting a frequency of the print timing command based on the topology of the non-uniform surface of the substrate comprises: a) increasing the print drop dot-per-inch quantity by a factor of cos h(x) when a slope of x degrees occurs in the non-uniform surface of the substrate.

According to the fifth aspect of the present invention, the step of adjusting a frequency of a print timing command based on the topology of the non-uniform surface of the substrate comprises: a) decreasing by a first amount at least one or more timing periods of the print timing command such that the print head expels at least one or more print drops at a higher frequency than the print drops were previously expelled.

According to the fifth aspect of the present invention, the amount of the at least one or more timing periods corresponds to a density of print drop dots-per-inch necessary to substantially cover a certain topological feature. [0029] The above described disadvantages are overcome and a number of advantages are realized by the present invention which relates to process for compensating for a non-uniform surface of a substrate when printing onto the non-uniform surface of the substrate, the process comprising the steps of adjusting a print timing command when printing an electrical component based on a topology of the non-uniform surface of the substrate.

According to sixth aspect of the present invention, a computer-readable medium containing a computer program for compensating for a non-uniform surface of a substrate when printing onto the non-uniform surface of the substrate is provided, wherein the computer program performs the steps of adjusting a portion of an electronic print file when printing an electrical component based on a topology of the non-uniform surface of the substrate.

According to a seventh aspect of the present invention, a computer-readable medium containing a computer program for compensating for a non-uniform surface of a substrate when printing onto the non-uniform surface of the substrate, is provided, wherein the computer program performs the steps of adjusting a print timing command when printing onto the non-uniform surface of the substrate based on a topology of the non-uniform surface of the substrate.

According to an eighth aspect of the present invention, a computer-readable medium containing a computer program for compensating for a non-uniform surface of a substrate when printing onto the non-uniform surface of the substrate is provided, wherein the computer program performs the steps of adjusting a print drop dot-per-inch quantity when printing an electrical component based on a topology of the non-uniform surface of the substrate.

According to a ninth aspect of the present invention, a computer-readable medium containing a computer program for compensating for a non-uniform surface of a substrate when printing electrical components onto the non-uniform surface of the substrate is provided wherein the computer program performs the steps of a) adjusting a print drop dots-per-inch quantity based on the topology of the non-uniform surface of the substrate; and b) repeating one or more print timing commands that correspond to one or more certain areas of the non-uniform surface of the substrate, without repeating other print timing commands that correspond to any of one or more non-certain areas of the non-uniform surface of the substrate, based on the topology of the non-uniform surface of the substrate.

BRIEF DESCRIPTION OF THE DRAWINGS

The novel features and advantages of the present invention will best be understood by reference to the detailed description of the preferred embodiments which follows, when read in conjunction with the accompanying drawings, in which.

DETAILED DESCRIPTION OF THE PREFERRED EMBODIMENTS

Figure 1:
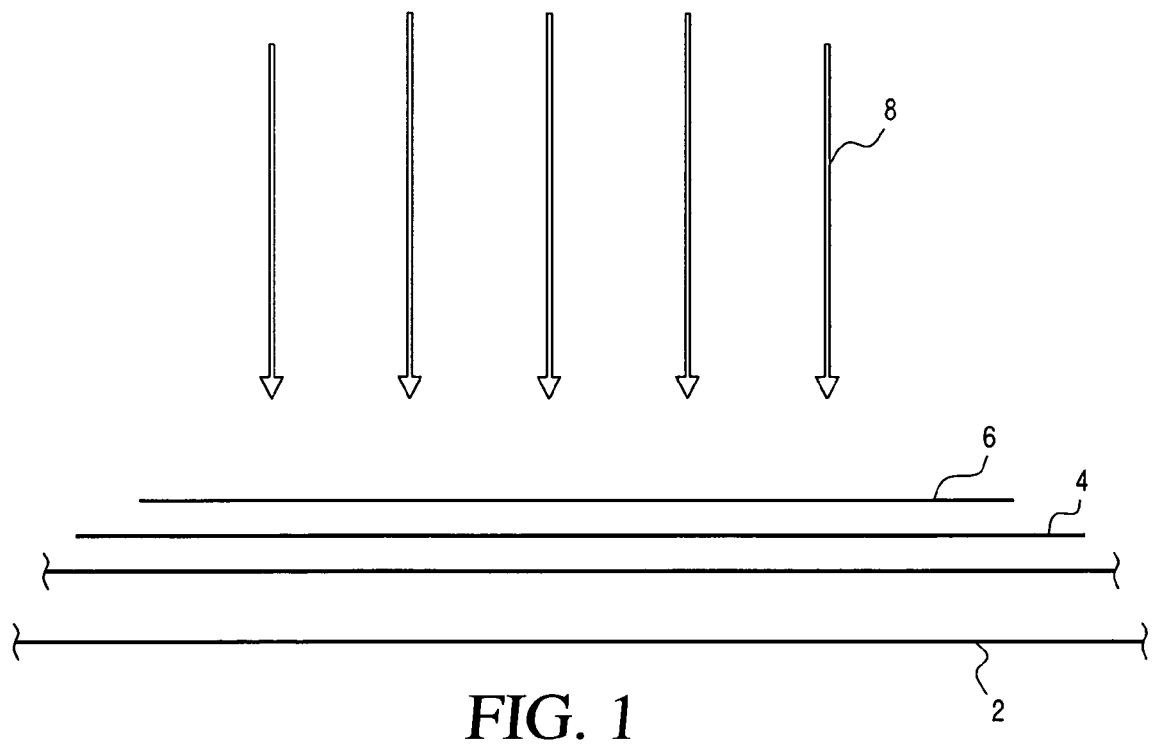
FIG. 1 illustrates an emulsion exposure process step in a lithography printing process according to the prior art.
Figure 2:
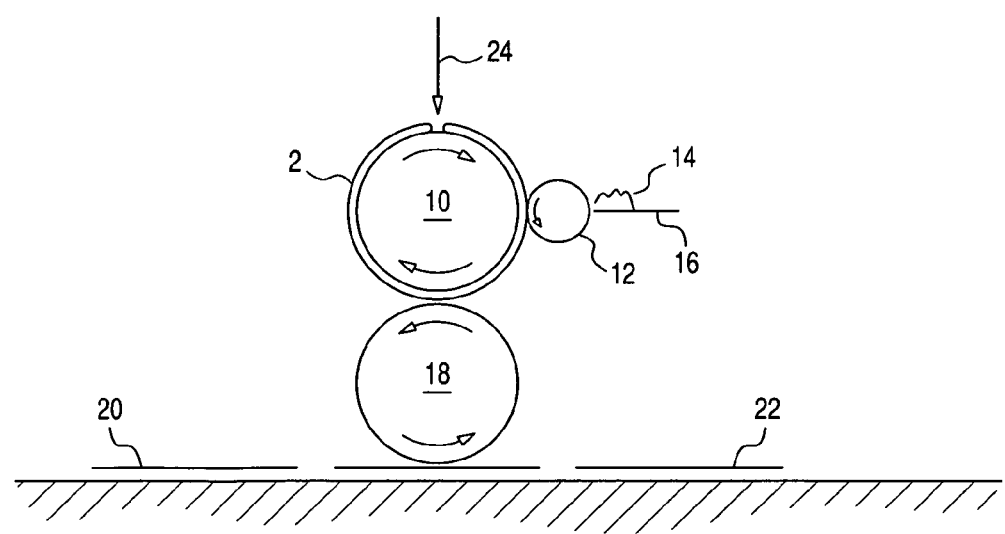
FIG. 2 illustrates a simplified side view of a lithographic printing system according to the prior art.
Figure 3:
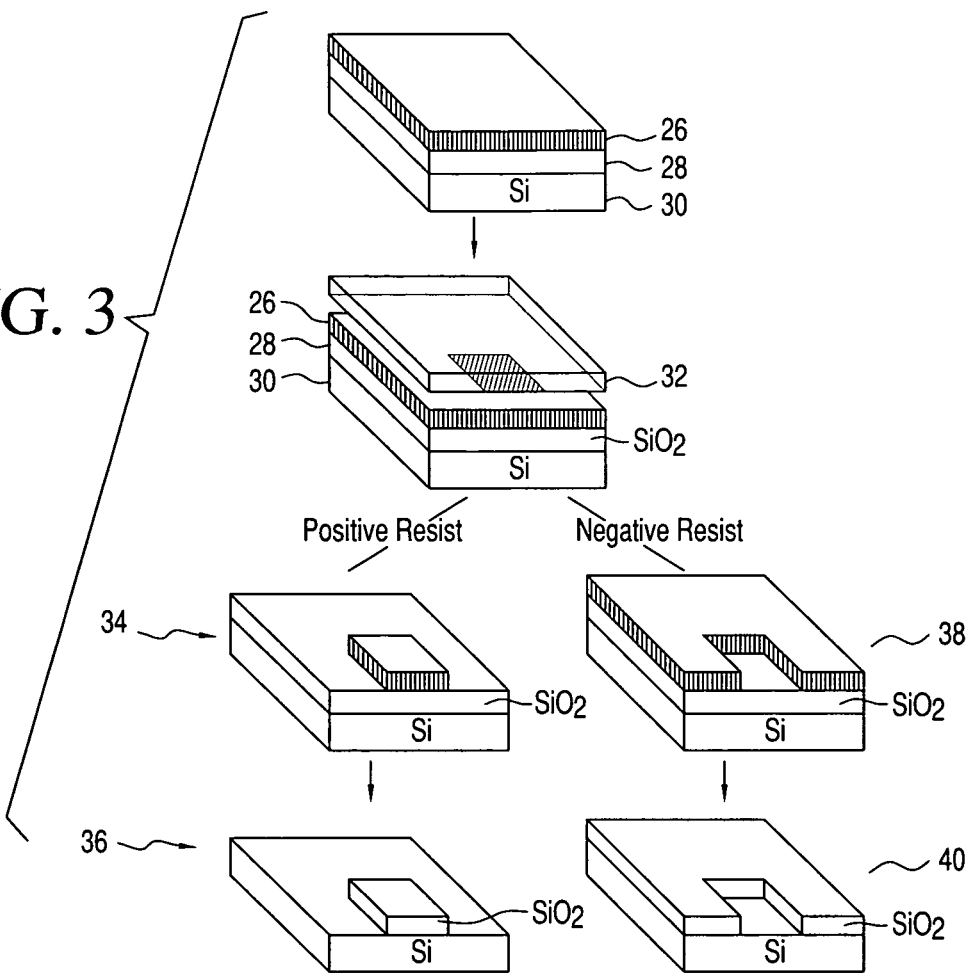
FIG. 3 illustrates several steps in a photolithography process for transforming geometric shapes onto a semiconductor wafer.
Figure 4A:
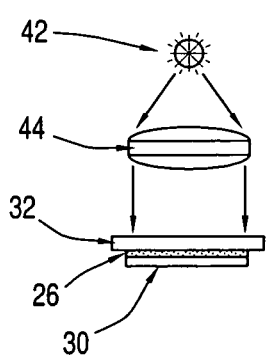
FIGS. 4A-4AC illustrate several systems for illuminating the semiconductor wafer with an illumination source.
Figure 4B:
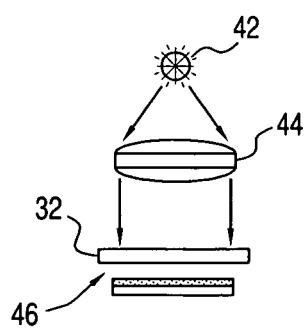
Figure 4C:
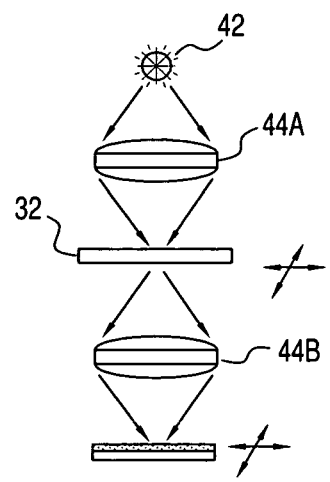
Figure 5:
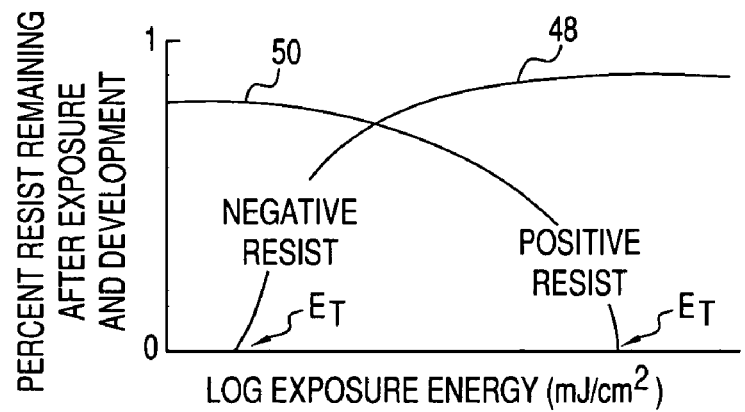
FIG. 5 illustrates response curves for negative and positive photoresist after exposure and development.
Figure 6A:
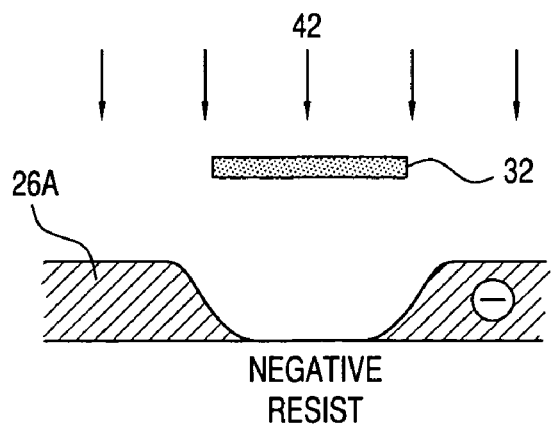
FIGS. 6A and 6B illustrate both positive and negative photoresist following development.
Figure 6B:
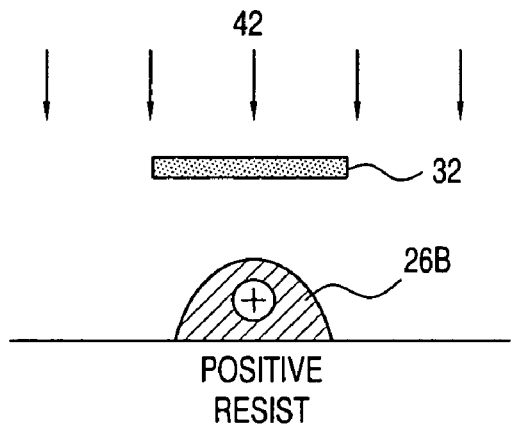
Figure 7:
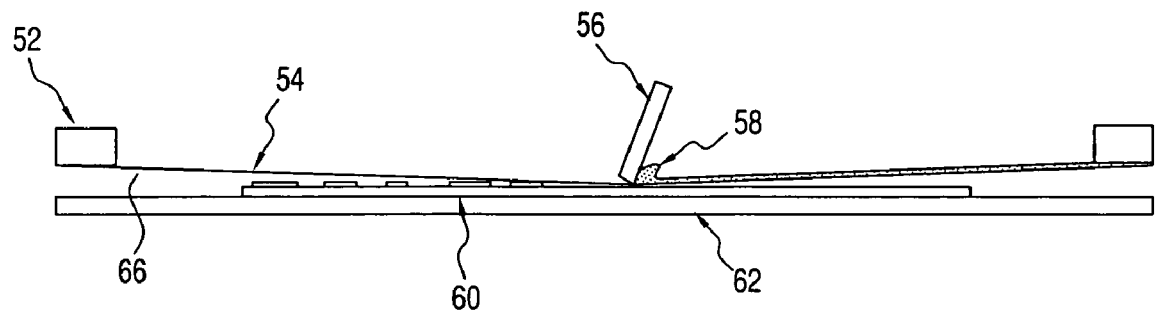
FIGS. 7 and 8 illustrate a process for screen mesh printing according to the prior art.
Figure 8:
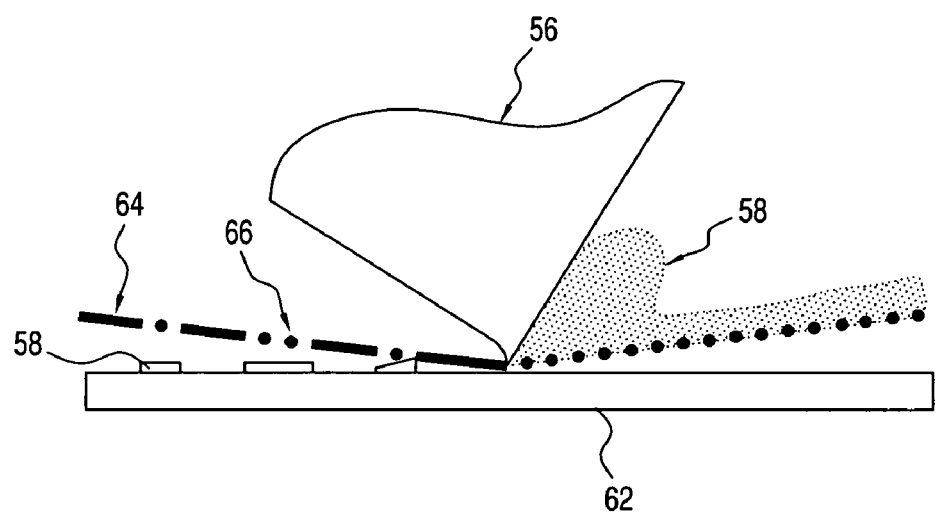
Figure 9:
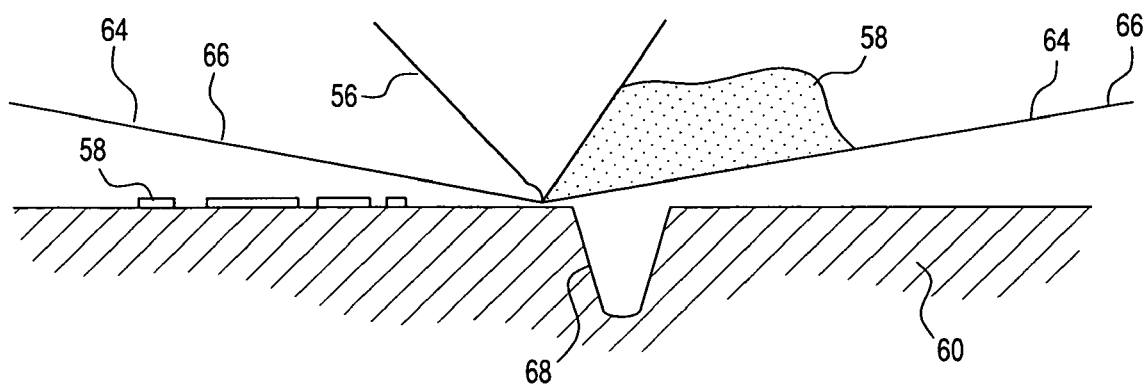
FIGS. 9-12 illustrate the screen mesh printing on a non-uniform substrate according to the prior art.
Figure 10:
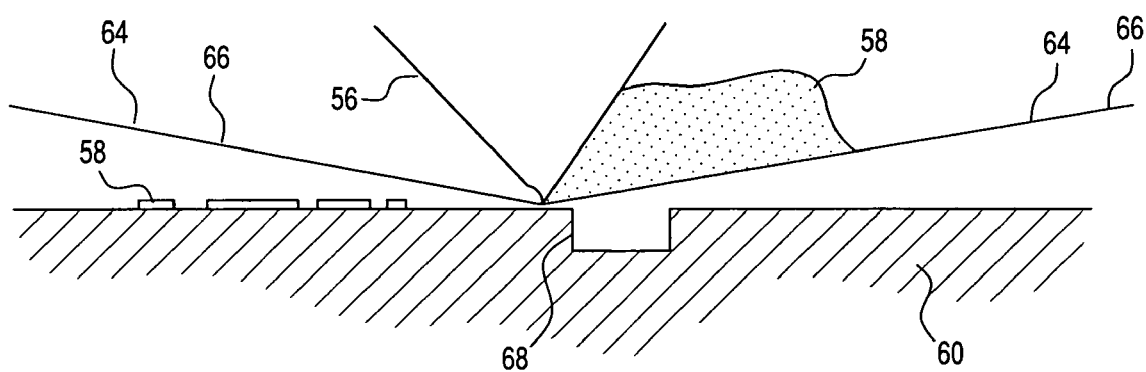
Figure 11:
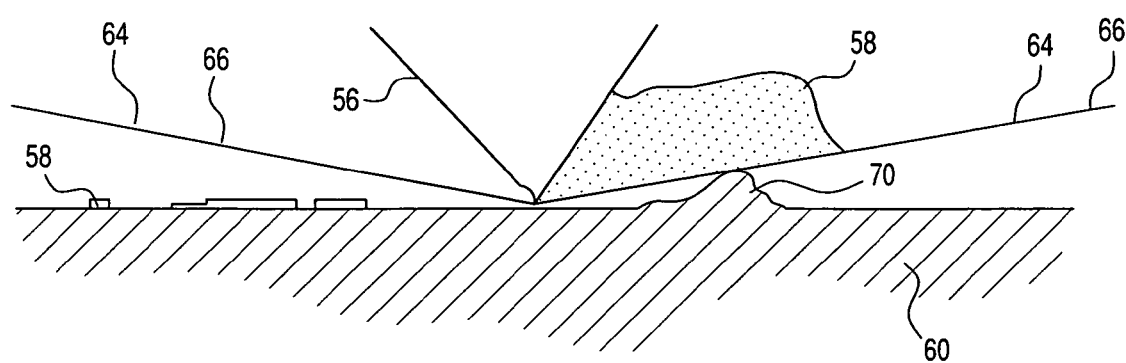
Figure 12:
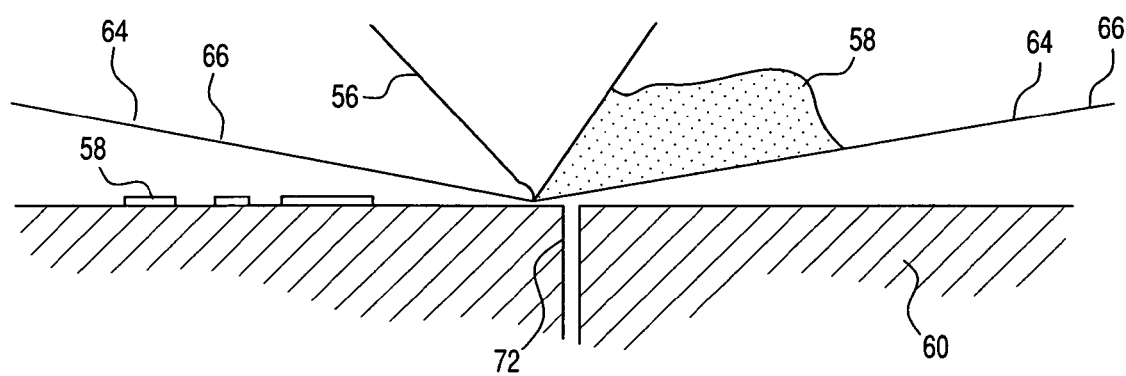

The various features of the preferred embodiment(s) will now be described with reference to the drawing figures, in which like parts are identified with the same reference characters. The following description of the presently contemplated best mode of practicing the invention is not to be taken in a limiting sense, but is provided merely for the purpose of describing the general principles of the invention.

Figure 13:
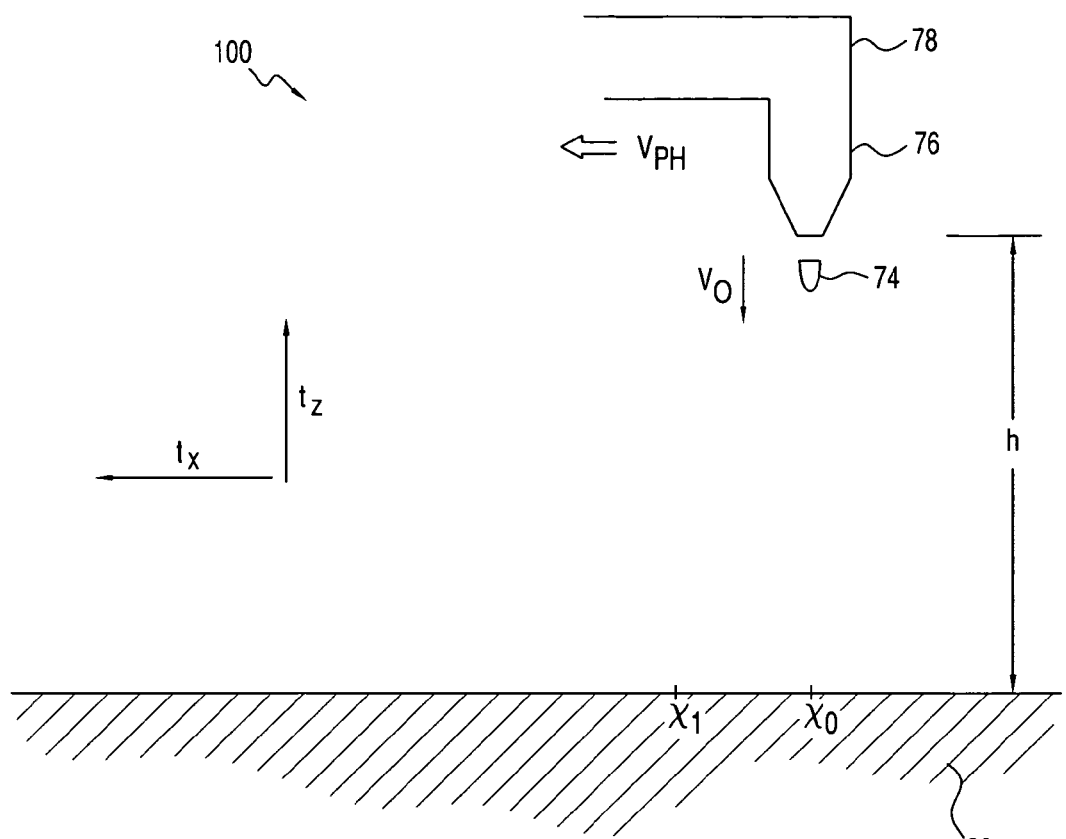
FIG. 13 illustrates a partial side view of a direct printing system according to an embodiment of the present invention expelling an ink drop.

FIG. 13 illustrates a partial side view of a direct printing system 100 expelling a drop of ink (ink drop) 74 according to an embodiment of the present invention. In the direct print system 100 shown in FIG. 13, a nozzle 76 is expelling an ink drop 74 at a height h above a substrate 60. The direct printing system 100 can determine the velocity of each ink drop 74 as it is expelled from the nozzle 76. The velocity of the drop of expelled ink 74 is denoted as $V_D$. In addition, as is well known to those of ordinary skill in the art, the nozzle 76 moves with the print head 78 at a certain velocity in a direction transverse to the length of the substrate 60. The print head 78 velocity is referred to as $V_{PH}$. The print head 78 velocity $V_{PH}$ is a relative velocity term; in some instances, the print head 78 remains motionless and the substrate 60 moves. In either event, the relative movement does not matter, because the effect is substantially similar. In some instances, both the print head 78 and the substrate 60 can and do move relative to each other.

Regardless of the attributes of the system, the relative velocities between the print head 78 and substrate 60 will be known, and the systems and processes according to the embodiments of the present invention can determine the position where the ink drop 74 will strike the surface of the substrate 60.

Figure 14:
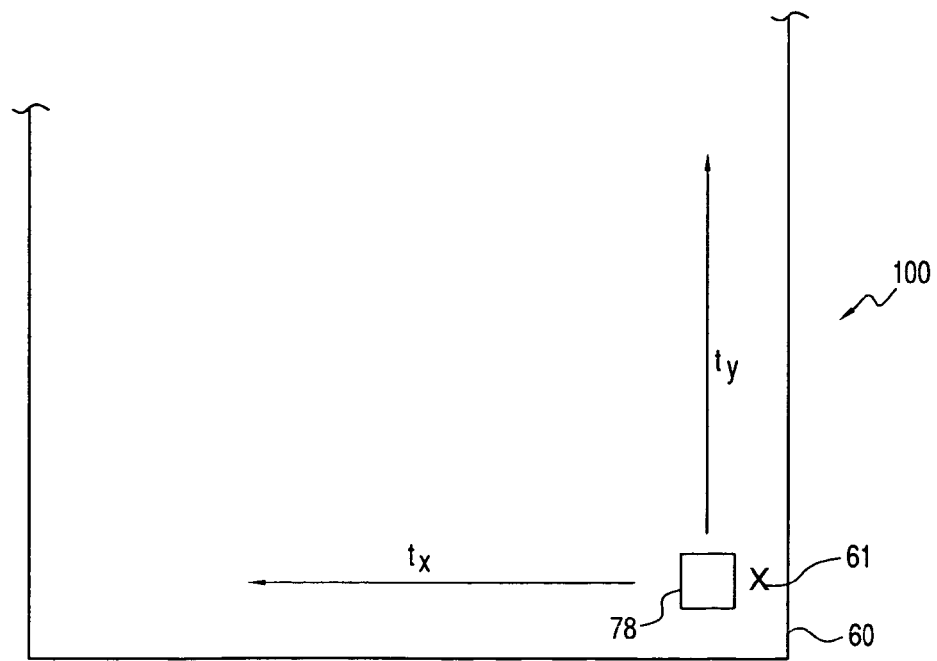
FIG. 14 illustrates a top view of the direct printing system shown in FIG. 13.

FIG. 14 illustrates a top view of the direct printing system 100. For purposes of this discussion, the positive x direction is to the left across the substrate 60, and the positive y direction is taken in the direction shown in FIG. 14. The position of the print head 78 shown in FIG. 14 is the 0,0 position, where printing begins. Note the fiducial 61: this is used by the print head 78 to locate itself on the substrate 60. When the print head moves over the substrate 60 upon power-up, or when a first or new substrate is encountered or put into the direct printing system 100, the print head 78 knows generally how to locate itself. The print head 78 searches for the fiducial, and, upon finding it, realizes that it is at a known location, and printing can then occur. This process is well known to those skilled in the art of the invention.

The print head 78 moves to the left, in the positive x direction to print a first line, moves in the positive y direction to begin printing a next line, then prints in the negative x direction to return to the right side. This process repeats itself until the substrate has been printed with whatever data has been provided to the direct print system 100. Typically, however, print heads 78 will have at least one and perhaps several nozzles 76 with which to expel ink 74 onto a substrate 60. In this discussion, however, only one nozzle 76 will be addressed for purposes of simplicity. The several embodiments of the present invention pertain to all print heads 78 with one or more nozzles 76. As one of ordinary skill in the art can appreciate, the print head 78 does not have to expel ink drops 74 in a continuous manner: the direct printing system 100 can expel a single drop of ink 74 anywhere on the substrate it is told to do so.

As one of ordinary skill in the art can appreciate, even though the ink drop 74 is expelled from the print head 78 at a velocity of $V_D$, which typically is in the order of 6 meters/sec (m/s), and the print head 78 is only in the order of about 1.0 mm above the surface of the substrate, because the print head 78 moves with a velocity $V_{PH}$, the ink drop 74 will not drop straight down from the print head 78. Instead, the ink drop 74 will travel with a horizontal component that makes it travel at a slight angle relative to the position of the print head 78 (i.e., in the direction of travel of the print head 78). Thus, if an ink drop 74 is expelled at position $x_o$ at time $t_o$, it will hit the substrate 60 at time $t_1$ and position $x_1$, assuming a substantially smooth substrate 60. Knowing the height h (which will be discussed in greater detail below), the velocity of the ink drop 74 (which can be measured or accurately predicted by the direct printing system 100) and the velocity of the print head 78 itself, both the time $t_1$ and $\Delta x$ (difference between position $x_0$ where print head 78 was told to expel the ink drop 74 and the position $x_1$ where the ink drop 74 actually hits the surface of the substrate 60) can be easily determined.

If it is assumed that the print head 78 is 1 mm above the surface of the substrate 60, the print head 78 travels at a direction of 1 m/s in the positive x direction, and the ink drop is expelled at 6 m/s, the ink drop's 74 position when it strikes the substrate (assuming a substantially uniform smooth substrate) can be easily determined. Since $V_{PH}$ is 1 m/s, and $V_D$ is 6.0 m/s, the angle the ink drop 74 makes from the position from where it was released is about 9.5°. This presumes, of course, that the print head 78 expels the ink drop 75 perfectly orthogonal to the surface of the substrate 60, and that the surface of the substrate 60 is perfectly uniform. Either of these assumptions are rarely the case, however, and the direct printing system 100 and method for using the same according to an embodiment of the present invention corrects for the imperfection of the non-uniform surface of the substrate 60.

The angle the ink drop 74 makes when being expelled from the nozzle is variable, but generally in the order of 0.5°. This angle is referred to as the deviation angle $\theta_D$. The deviation angle $\theta_D$ is an order of magnitude different than the angle the ink drop makes from where it is released to where the ink drops contacts the printing surface due to the motion of the print head 78. Because of this, and also because the deviation angle $\theta_D$ is random, it can be safely disregarded. Furthermore, it is also known that the print head 78 moves in the z direction. That is, up and down relative to the surface of the substrate. This too will have an effect on the velocity of the expelled drop of ink 74. But, as in the case with the deviation angle $\theta_D$, this velocity component is generally so much smaller than the velocity $V_D$, that it too can be safely disregarded. Another factor that affects the velocity of the expelled drop of ink, $V_D$, is the air resistance the ink drop 74 encounters after being expelled. Some direct printing systems expel ink drops 74 from a height of up to 5 mm above the surface of the substrate. This air resistance generally slows down the ink drop 74, but, this is a very small amount and can also be disregarded in determining the position where the ink drop 74 will meet the surface of the substrate 60.

Figure 15:
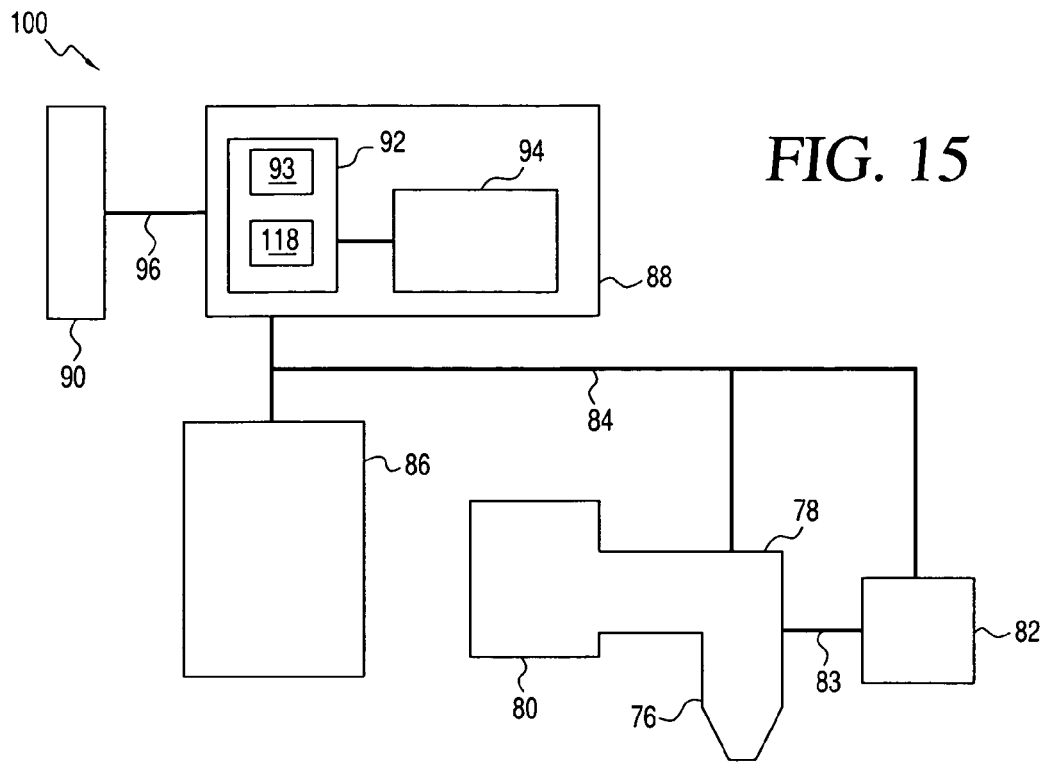
FIG. 15 illustrates a block diagram of a direct printing system according to an embodiment of the present invention.

FIG. 15 illustrates a block diagram of the direct printing system 100 according to an embodiment of the present invention. Processes for generation of a print data file 118 are presumed to be well known to those of ordinary skill in the art of the present invention, and will not be repeated here for purposes of brevity. It is to be understood that a print data file 118 is made available to (i.e., transmitted to) the direct printing system 100, whereupon modifications to the print data file 118 (and/or other printing parameters) are made to compensate for non-uniform substrates 60, according to the embodiments of the present invention described herein. Furthermore, those of ordinary skill in the art can appreciate that the system and method according to the embodiments of the present invention need not be incorporated in one external direct printing device. The system and method of the present invention can be distributed among two or more printing and/or processing devices, using distributed networks (i.e., LAN, WAN, the Internet, among others).

Figure 16:
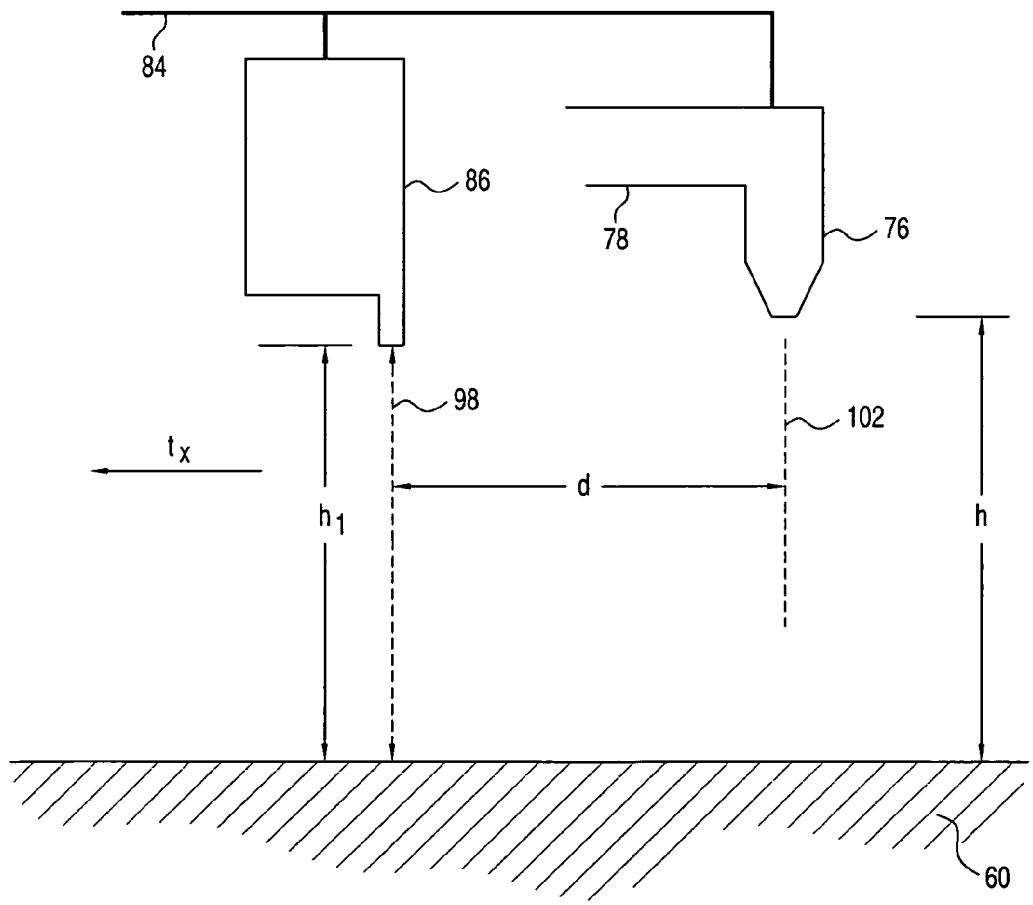
FIG. 16 illustrates a close up side view of a laser interferometer and a print head of the direct printing system shown in FIG. 15.

In FIG. 15, a motor and drive assembly 82 receives commands from processor board 88 that places the print head 78 at expected print positions according to a print data file 118 received by the processor board 88 and processed by printing software 93. The motor and drive assembly 88 receives data and commands via bus 84, and locates the print head 78 with the use of either a belt system 83, a gear system, or any other type of mechanical apparatus capable of precisely locating the print head 78. As part of the print head 78, there is a nozzle 76 and ink reservoir 80. A laser interferometer 86, or other type of distance measuring device, is located adjacent to the print head 78 for measuring the height of the print head 78 above the surface of the substrate 60. FIG. 16 illustrates a close up side view of a laser interferometer 86 and print head 78 of the direct printing system 100 shown in FIG. 15. Other components of the direct printing system 100 according to an embodiment of the present invention include bus (data and command) 84, memory 92, printing software 93, an input/output (I/O) connector 90, and a second data/command bus 96 connecting the I/O connector 90 and the processor board 88. The processor board 88 receives all or some of a print data file 118 that is processed by the processor 94 to create printing commands via printing software 93. Conventional direct printing systems are well known to those of ordinary skill in the art, and the direct printing system 100 according to an embodiment of the present invention performs similarly to the conventional systems in receiving data and commands from an external source thereof. As discussed above, those operations relating to receipt of the print data file from the external source will not be repeated here for purposes of brevity and clarity.

As discussed above, FIG. 15 illustrates a block diagram of the direct printing system 100 according to an embodiment of the present invention. In FIG. 15, processor board 88 comprises processor 94 which can be one or more general or special purpose processors, and memory 92, which itself comprises printing software 93. Memory 92 can comprise an input buffer, printing software 93, and an output buffer. It should be noted that in this exemplary embodiment of the present invention, the database, which is not shown, can be a separate hardware memory item, though that need not always be the case. The database can also be implemented in software, for example, as a portion of the memory 92.

Printing software 93 comprise one or more computer programs that can be stored on any type of computer readable medium or other data storage devices. These additional data storage devices can include removable and/or non-removable devices, such as, for example, magnetic disks, optical disks, or tape. Computer readable medium can include volatile and nonvolatile, removable and non-removable medium implemented in any method or technology for storage of information, such as computer readable instructions, data structures, program modules, or other data. Computer readable medium can include, by way of a non-limiting example, random access memory (RAM), read-only memory (ROM), electrically erasable programmable ROM (EEPROM), computer disk ROMs (CD-ROMS), digital versatile disks (DVDs), magnetic tape, flash memory, bubble memory devices, optical storage devices, floppy disks, hard drives, and any other type of memory storage devices (e.g., memory sticks, microcassettes, among other types of devices). As discussed in greater detail below, the various embodiments of the present invention comprise one or more methods, as shown and described in reference to FIGS. 27, 28, and 31. Each and all of these method can be embodied as printing software 93. Printing software 93 accepts print data file 118 and processes it according to particular embodiment of the present invention to print on non-uniform substrates. According to an exemplary embodiment of the present invention, printing software 93 accepts print data file 118 to print electronic features on non-uniform substrates.

Any and all components of the direct printing system 100, shown and discussed in regard to FIG. 15, including, but not limited to I/O connector 90, processor 94, memory 92, laser interferometer 86, print head 78, and motor and drive assembly 82 (among other components), can be comprises of any suitable type of electrical or electronic device capable of performing the functions for direct printing system 100 and its components discussed herein. For example, direct printing system 100 can be comprised of hardware, software, firmware or any suitable combination thereof.

Alternatively, direct printing system 100, and any and all components thereof, including, but not limited to, processor 94, laser interferometer 86, print head 78, and motor and drive assembly 82 (among other components), can be comprised of any suitable type of processor, including any type of microprocessor, microcontroller, digital signal processor (DSP), application-specific integrated circuit (ASIC), programmable read-only memory (PROM), erasable programmable read-only memory (EPROM), electrically-erasable programmable read-only memory (EEPROM), or the like. The direct printing system 100, and any and all components thereof, including, but not limited to, processor 94, and memory 92, laser interferometer 86, print head 78, and motor and drive assembly 82 (among other components), can be connected to or include a memory, such as, for example, any type of computer memory or any other type of electronic storage medium, such as, for example, read-only memory (ROM), random access memory (RAM), cache memory, compact disc read-only memory (CDROM), electro-optical memory, magneto-optical memory, or the like, alternatively or additionally to memory 92. The processor and memory can be used, for example, to perform some or all of the functions of the direct printing system 100, and any and all components thereof, including, but not limited to, processor 94, and memory 92, laser interferometer 86, print head 78, and motor and drive assembly 82 (among other components), described herein. As will be appreciated based on the foregoing description, the memory can be programmed using conventional techniques known to those having ordinary skill in the art of computer programming. For example, the actual source code or object code of the computer program can be stored in the memory.

As discussed briefly above, the laser interferometer 86, shown in greater detail in FIG. 16, measures the distance from the print head 78 to the surface of the substrate 60. As the print head 78 and laser interferometer 86 moves in the positive x direction as shown in FIG. 16, the processor 94 substantially continuously commands the laser interferometer 86 to measure the height $h_L$ of the laser interferometer 86 above the surface of the substrate 60. In the direct printing system 100, there might be a height difference, $\Delta h$, between the laser interferometer 86 and the nozzle 76. This height difference $\Delta h$ would be known, and the processor 94 can therefore calculate an actual height h of the nozzle 76 above the substrate 60, at any position x,y (h=height of nozzle above substrate 60, = $h_L$+/−$\Delta h$.) Because the processor 94 also knows the lateral distance d the distance from the laser interferometer 86 to the nozzle 76, the processor 94 can associate the height $h_L$ of the laser interferometer 86 above the substrate to the height of the nozzle 76, and store the height data h in memory 92.

For example, prior to printing, the processor 94 commands the print head 78 to move to an initial printing position (1,1). In doing so, the processor 94 commands the laser interferometer 86 to measure the height $h_L$ of a first portion of the substrate 60 where printing is about to take place. The laser interferometer 86 stores its height data $h_L$ for each x,y location. The processor 94 associates the x,y height data $h_L$ to the current position data of the print head 78 (by virtue of the distance data d), and determines whether and to what extent there are variations in the height of the print head 78 above the non-uniform substrate 60. The data accumulated by the processor 94 can be stored in the memory 92, in the form of, for example, a table. In the first column are the x values, for each y position ($2^{nd}$ column). In an exemplary embodiment of the present invention, a substrate can be provided that is 10"×20", with a usable surface area of about 90%. Converting this to metric values, and presuming a 10 micron resolution, there are 22,858 printing positions in the x direction, and 45,720 rows in the y direction. Starting at the 1,1 position, the direct printing system 100 commands the laser interferometer 86 to measure a height $h_L$ for each x,y position, from 1,1 to 22,858, 1 as it moves from right-to-left over substrate 60. For each x,y position a height h is calculated (h=$h_L$+/−$\Delta h$) and stored for that x,y position. After the first y row is finished, the direct printing system 100 starts again at the 1,2 position, and the direct printing system 100 commands the laser interferometer 86 to measure a height $h_L$ for each x,y position, from 1,2 to 22,858, 2 as it moves from right-to-left over substrate 60. For each x,y position, a height h is calculated (h=$h_L$+/−$\Delta h$) and stored for that x,y position.

According to alternative embodiments of the present invention, the height mapping (i.e., the process of determining the height h of the nozzle over each x,y position on the substrate 60), can be accomplished as printing occurs, or, height mapping can occur prior to any printing, as a standalone process. After the height map has been generated, the direct printing system 100 can then determine a best method for compensating for an non-uniform substrate 60. This is discussed in greater detail below. It is also possible that the surface topology (i.e., the height map), can be determined for a particular substrate. Then, that particular substrate will have circuit components inserted and soldered into it, or direct printed on it. The direct printing system 100 would not necessarily need to perform a height mapping each time the substrate was directed printed, because the height map information can be stored and re-used. Additionally, if different types of circuits or other devices are inserted onto the substrate with a known topology, the direct printing system 100 can obtain the heights of those components, their location data, and integrate all that information so it can direct print onto the substrate and compensate for mesas, valleys and/or any electronic devices or other components. In the case of a non-uniform substrate 60, the processor 94 will use that varying height information to control the expelling or firing of ink drops 74 from the nozzle 76 of the print head 78 in accordance with the systems and processes described herein in accordance with an embodiment of the present invention.

The substrate 60 can be a flexible, substantially non-rigid substrate. Alternatively, the substrate 60 can be non-flexible, substantially rigid substrate. The substrate 60 in this embodiment can be any of the substrate materials described herein. In one exemplary embodiment, the substrate 60 has opposing major planar surfaces. The types of substrates 60 that are particularly useful according to an embodiment of the present invention include polyfluorinated compounds, polyimides, epoxies (including glass-filled epoxy), polycarbonates and other polymers. Other useful low-cost substrates 60 include cellulose-based materials, such as wood, paper, cardboard, or other wood pulp based materials, acetate, polyester, such as PET or PEN, polyethylene, polypropylene, polyvinyl chloride, acrylonitrile, butadiene (ABS), flexible fiber board, nonwoven polymeric fabric, cloth, metallic foil, silicon, and glass. In another embodiment of the present invention, the substrate 60 comprises a component selected from the group consisting of an organic substrate, a glass substrate, a ceramic substrate and a polymeric substrate. The substrate 60 can be coated, for example, with a dielectric on a metallic foil. Although the present invention can be used for such low-temperature substrates, it will be appreciated that traditional substrates such as ceramic substrates can also be used in accordance with embodiments of the present invention.

The processes of the present invention also enable the formation of conductive features onto non-planar substrates, such as curved substrates or substrates that have a stepped feature on the substrate surface. The conductive features can also be well adhered, such that a flexible substrate can be rolled or otherwise flexed without damaging the integrity of the conductive feature.

Figure 17:
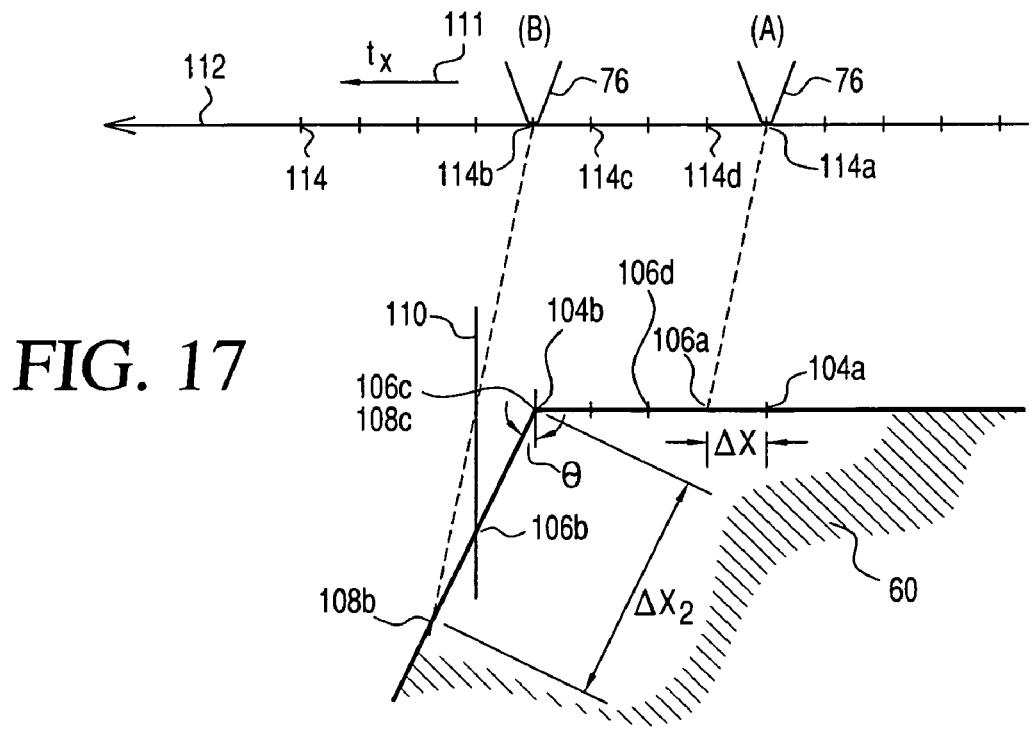
FIG. 17 illustrates a depression or valley in a non-uniform substrate; one.

FIG. 17 illustrates a depression in a non-uniform substrate 60. In FIG. 17, the nozzle 76 is moving to the left, in the positive x direction, as indicated by arrow 111. Print head travel path 112 represents the path the print head 78 travels over the substrate 60, as held by the machinery and apparatus associated with the motor and drive assembly 82 of the direct printing system 100. Shown on the print head travel path are print position ticks 114. Each print position 114 represents an opportunity for the direct printing system 100 to command the nozzle 76 to expel an ink drop 74 (i.e., the resolution). As discussed above, it is necessary for the processor 94 to command the nozzle 76 to expel an ink drop 74 at ink drop expel position 104*a* (corresponding to 114*a*) so that it lands on the surface of the substrate 60 at the intended ink drop receive position 106*a* (corresponding to 114*d*). This, as one of ordinary skill in the art can appreciate, presumes that the surface of the substrate 60 is substantially flat and smooth. If, however, the surface of the substrate 60 is not substantially flat, as shown in FIG. 17, then the ink drop 74 will not land at the intended ink drop receive position 106*a*. Instead, if the ink drop 74 is expelled from the nozzle 76 at ink drop expel position 104*b* (corresponding to 114*b*) it will land not at the intended ink drop receive position 106*b*, but instead at the actual ink drop receive position 108*b*. The reason for this is that because the ink drop 74 has both a z-direction velocity component and an x-direction velocity component, the ink drop 74 continues to travel in the x-direction (in this case the positive x-direction) when the surface of the substrate 60 falls away into a depression, or valley area. The intersection of the surface of the substrate 60 with the datum line 110 shows where the ink drop 74 should have landed (i.e., at 106*b*).

Ink drop 74 spacing, or dots-per-inch (dpi) is affected by falling (and rising slopes) with respect to the surface of the substrate 60. As shown in FIG. 17, if the print head 78 expels a first ink drop 74 at printing position 114*a*, it will hit the substrate 60 at the intended ink drop receive position 106*a*. If it is desired to put a continuous path of ink 74 on the surface of the substrate 60, there is little concern if the surface of the substrate 60 is substantially uniform. If, however, there is a downward or upward slope (as in FIG. 17), the spacing between ink drops 74, presuming nothing else changes, will vary. For example, if an ink drop 74 is expelled at printing position 114*c*, it will encounter the substrate 60 at an ink drop intended and actual receive position 106*c*, 108*c*. The spacing between this and a previous ink drop 74 can be as little as $\Delta x$. But, if the next ink drop 74 is expelled at the very next available printing position 114*b*, ink drop 74 will encounter the substrate 60 at an actual ink drop receive position 108*b*. The distance $\Delta x_2$ between the ink drop 74 expelled at printing position 114*c* and an ink drop 74 expelled at printing position 114*b* is much greater than an ink drop 74 expelled at two adjacent printing positions 114 when the print head 78 is over a substantially uniform surface (i.e., printing position 114*a* and 114*d*–$\Delta x$). This can mean a loss of continuity in a path of ink drops 74 on the substrate 60. The dpi density will decrease. As discussed in reference to FIGS. 18-24, there are several methods to overcome the problem of a rising or falling slope: 1) increase the frequency of a printing timing command signal 116; 2) shift the print data file 118 (i.e., shifting the data in the print data file 118); 3) make repeated passes over the affected area; 4) shift the print timing command signal; and/or 5) slow down the print head 78. Slowing down the print head 78 is generally more difficult to do because of the momentum of the print head 78 relative to the very small distances involved in correcting for dpi density and ink drops 74. The rest of the processes for correcting for rising and falling slopes on the substrate 60 are discussed in greater detail below.

Figure 18:
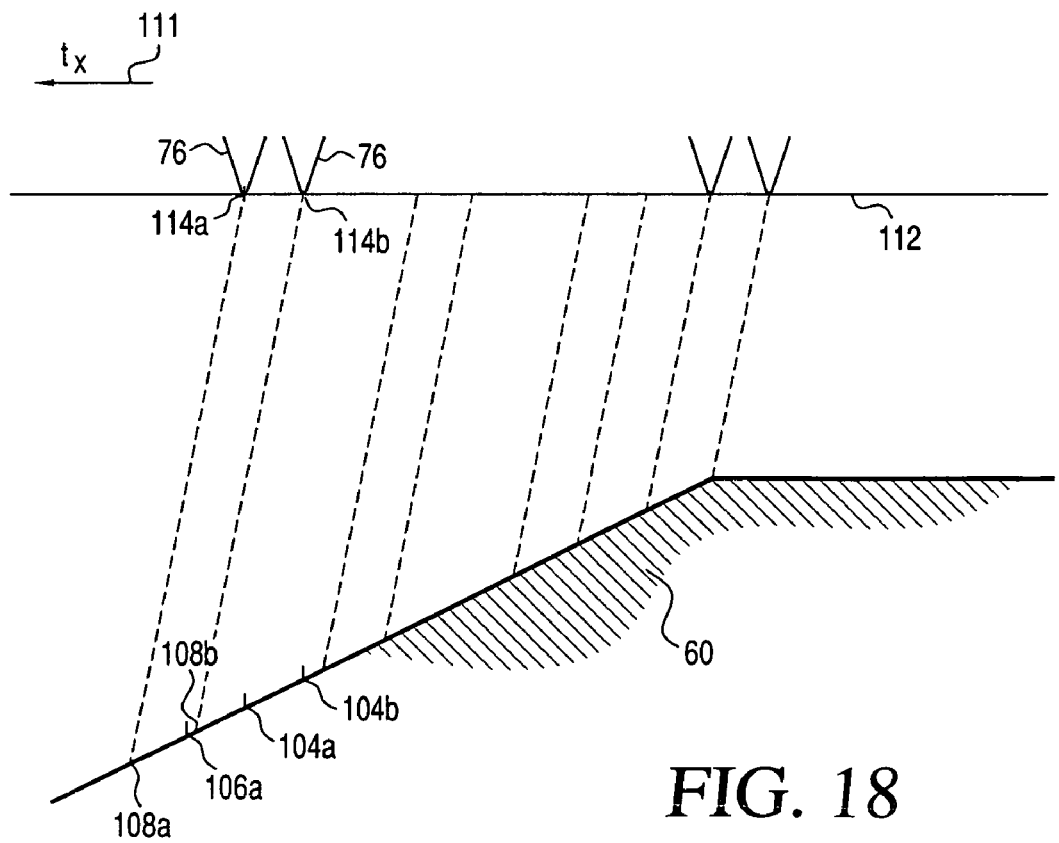
FIG. 18 illustrates a first method for compensating for a depression in a non-uniform substrate encountered by the direct printing system shown in FIG. 15.

FIG. 18 illustrates a first method for compensating for a depression or a valley on a non-uniform substrate 60 encountered by the direct printing system 100 shown in FIG. 15. In the first method for compensating for a depression or a valley on a non-uniform substrate 60, the data in the print data file 118 is shifted towards the print head 78. When print data is processed by a direct printer's compiler software, a print data file 118 is generated that creates a table or list of x,y positions where a nozzle 76 is to expel one or more ink drops 74. As discussed above, an unmodified print data file 118 (i.e., a print data file that has not been modified by the direct printing system 100 according to an embodiment of the present invention) accounts for the normal "drift" or x direction motion of the ink drop 74 after it is expelled from the nozzle 76. In this instance, however, there is a valley that for which conventional direct printing systems cannot compensate. Therefore, the method for compensating for a depression or a valley on a non-uniform substrate 60 according to an embodiment of the present invention shifts the print data file 118 towards the position of the print head 78.

For example, in a conventional direct printing system, the print data file 118 generates print data that commands the nozzle 76 to expel an ink drop 74 at ink drop expel position 104*a,b*, anticipating a substantially uniform substrate 60. Because of the valley, however, instead of the ink drop 74 striking the substrate 60 at the intended ink drop receive position 106*a* (e.g., 10, y) it strikes the substrate 60 at an actual ink drop receive position 108*a* that is some distance to the left ($\Delta x$) of the intended ink drop receive position 106*a* (e.g., 12,y). Therefore, the method according to an embodiment of the present invention shifts the data in the print data file by subtracting one or more x positions from the x,y location for that particular print data (e.g., from 10,y to 8,y). The method for compensating for a depression or a valley on a non-uniform substrate 60 according to an embodiment of the present invention determines the appropriate amount of x positions to shift the data in the print data file 118 by using the height data $h_L$ the laser interferometer 86 feeds back to the direct printing system 100. The method for compensating for a non-uniform substrate 60 according to an embodiment of the present invention performs a calculation that takes into account the velocities of the print head 78 and the expelled ink drop 74, $V_{PH}$, $V_D$, the deviation angle $\theta_D$, and the change in height of the nozzle 76 over the surface of non-uniform substrate 60 caused by the valley, to arrive at a change in x position for the particular print data. Those of ordinary skill in the art of the present invention can readily determine the change in the x position based on the aforementioned factors.

In FIG. 18, the nozzle 76 expels an ink drop at ink drop 74 expel position 104*a*. The ink drop 74 is expected to strike the substrate 60 at the intended ink drop receive position 106*a*, but, because of the valley, strikes the non-uniform surface of the substrate 60 at the actual ink drop receive position 108*a*, which is to the left of the intended position 106*a*. Therefore, the direct printing system 100 shifts the data in the print data file 118 for this particular print data to the right, which is in the direction toward the print head 78 by one print data x position. The nozzle 76 then expels an ink drop 74 at ink drop expel position 104*b*, and the actual ink drop receive position 108*b* is substantially close to the intended ink drop receive position 106*a*.

Figure 19:
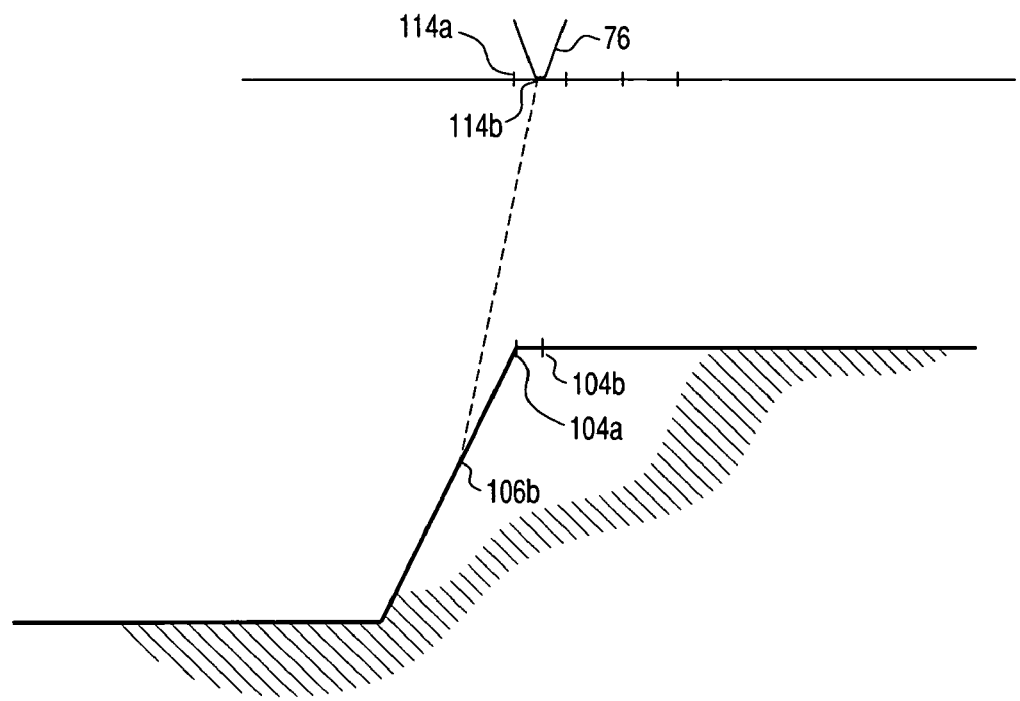
FIG. 19 illustrates a second method for compensating for a depression in a non-uniform substrate encountered by the direct printing system shown in FIG. 15.

FIG. 19 illustrates a second method for compensating for a valley or depression on a non-uniform substrate 60 encountered by the direct printing system 100 shown in FIG. 15. Operation of the nozzle 76 as shown in FIG. 19 represents a different method for compensating for a valley or a depression on a non-uniform substrate 60. In this instance, the direct printing system 100 changes the timing of a print timing command signal 116. The direct printing system 100 commands the print timing command signal 116 to occur a certain amount of time earlier than normal. This has the same effect as shifting the data in the print data file 118 in the negative x direction (for a print head 78 moving in the positive x direction over a valley). The method for compensating for a non-uniform substrate 60 according to an embodiment of the present invention performs a calculation that takes into account the velocities of the print head 78 and the expelled ink drop 74, $V_{PH}$, $V_D$, the deviation angle $\theta_D$, and the change in height of the nozzle 76 over the surface of non-uniform substrate 60 caused by the valley, to determine the amount of time the print timing command signal 116 needs to be shifted for the particular print data. Those of ordinary skill in the art of the present invention can readily determine the amount of time the print timing command signal 116 needs to be shifted based on the aforementioned factors. This is shown in FIG. 19 by the nozzle 76 expelling an ink drop 74 ink drop expel position 104b instead of at ink drop expel position 104a.

Figure 20:
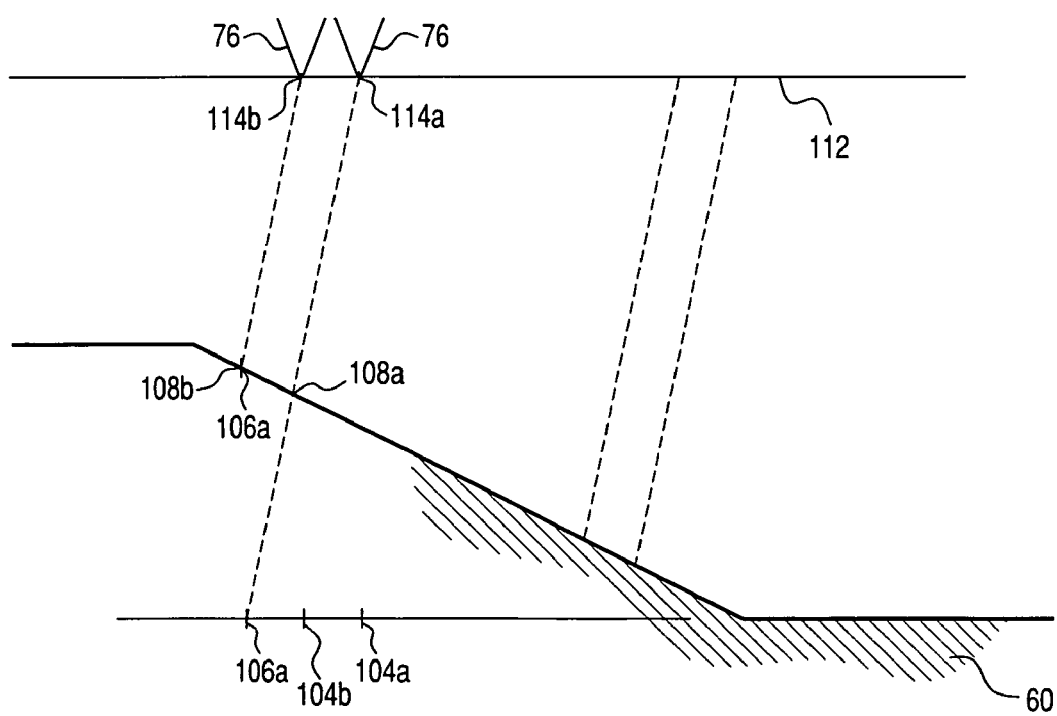
FIGS. 20 and 21 illustrate a first and second method for compensating for a rising slope on a non-uniform substrate by the direct printing system shown in FIG. 15.
Figure 21:
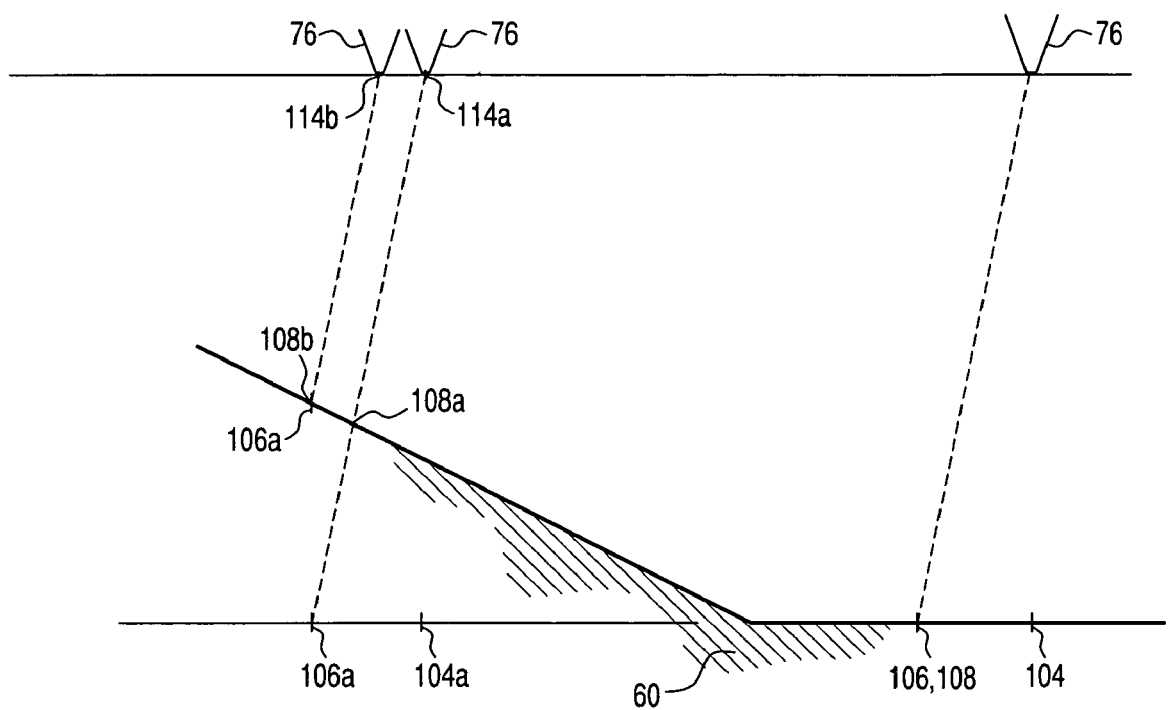

FIGS. 20 and 21 illustrate a first and second method, respectively, for the direct printing system 100 shown in FIG. 15 to compensate for a rising slope on a non-uniform substrate 60. Similarly to the situation shown and described in reference to FIGS. 17-19, FIGS. 20 and 21 illustrate a situation in which the surface of a substrate 60 rises into a mesa. Again, because of the change in height between the surface of the substrate 60 and the nozzle 76, the ink drop 74 will not be received at the surface of the substrate 60 at the intended ink drop position 106a; instead, the ink drop 74 will encounter the surface of the substrate 60 at actual ink drop receive position 108a, which is closer to the nozzle 76. This is to the right of the intended ink drop position 106a. This is shown in FIG. 20. The nozzle 76 expels an ink drop 74 at ink drop expel position 104a. The ink drop 74 should land on the surface of the non-uniform substrate 60 at intended ink drop receive position 106a but instead lands on the rising slope of the mesa on the substrate 60 at actual ink drop receive position 108a. Depending on the slope and height of the non-uniform surface of the substrate 60, the velocity of the print head 78, the velocity of the ink drop 74, and the deviation angle $\theta_D$, the location of the actual ink drop receive position 108a can cause a loss of continuity in the path being direct printed.

To alleviate the problem caused by a mesa (or rising slope) when direct printing on the non-uniform substrate 60, the direct printing system 200 can adjust both the timing of the print timing command signal or shift the data in the print data file 118. FIG. 20 represents the situation when the direct printing system 100 shifts the data in the print data file 118 according to an embodiment of the present invention. In FIG. 18, the data in the print data file 118 was shifted towards the print head 78 when the nozzle 76 was printing in a valley and the print head 78 was moving in a positive x direction; in this instance, when the print head 78 moves in the positive x direction and encounters a mesa, the data in the print data file 118 must be shifted in the same direction the print head 78 is moving, i.e., away from the print head 78. As before, the data in the print data file 118 will be shifted by a certain amount of x positions that depends upon the slope and height of the non-uniform surface of the substrate 60, the velocity of the print head 78, the velocity of the ink drop 74, and the deviation angle $\theta_D$. Those of ordinary skill in the art of the present invention can readily determine the amount of x positions the data in the print data file 118 needs to be shifted based on the aforementioned factors. In FIG. 20, the data in the print data file 118 is shifted to the left (e.g., from 10,y to 11,y) so that the new actual ink drop receive position 108b is closer to the intended ink drop position 106a than the previous actual ink drop receive position 108a.

FIG. 21 represents the situation in which the timing of the print timing command signal 116 has been shifted by a certain amount of time to compensate for a rising slope of mesa on a surface of a non-uniform substrate 60 by the direct printing system 100 according to an embodiment of the present invention. The nozzle 76 expels an ink drop 74 at printing position 114a,b such that it lands on the substantially flat surface of the substrate 60 at intended ink drop receive position 106a,b. In this instance, the actual and intended ink drop positions 106, 108 are identical, because the surface of the substrate 60 is substantially uniform. When a rising slope or mesa is encountered, however, the actual and intended locations of the received ink drop positions will differ. For example, at printing position 114a, the ink drop 74 will not land at intended ink drop receive position 106a; instead, the ink drop 74 will land on the mesa at actual ink drop receive position 108a. In order to compensate for the rising slope of the mesa, the direct printing system 100 according to an embodiment of the present invention shifts by a certain amount of time the print timing command signal 116 (shown in FIG. 22). The nozzle 76 then expels an ink drop 74 at printing position 114b, and the actual ink drop receive position 108b is substantially the same as the intended ink drop receive position 106a. Because the nozzle is moving in the positive x direction, and a mesa (rising slope) is encountered on the non-uniform surface of the substrate 60, the print timing command signal 116 is advanced by a certain amount of time that is dependent upon the velocities of the print head nozzle $V_{PH}$ and the expelled drop of ink $V_D$, the change in height h of the nozzle 76 above the mesa, and the deviation angle $\theta_D$. Those of ordinary skill in the art of the present invention can readily determine the amount of time the print timing command signal 116 needs to be shifted based on the aforementioned factors.

Figure 22:
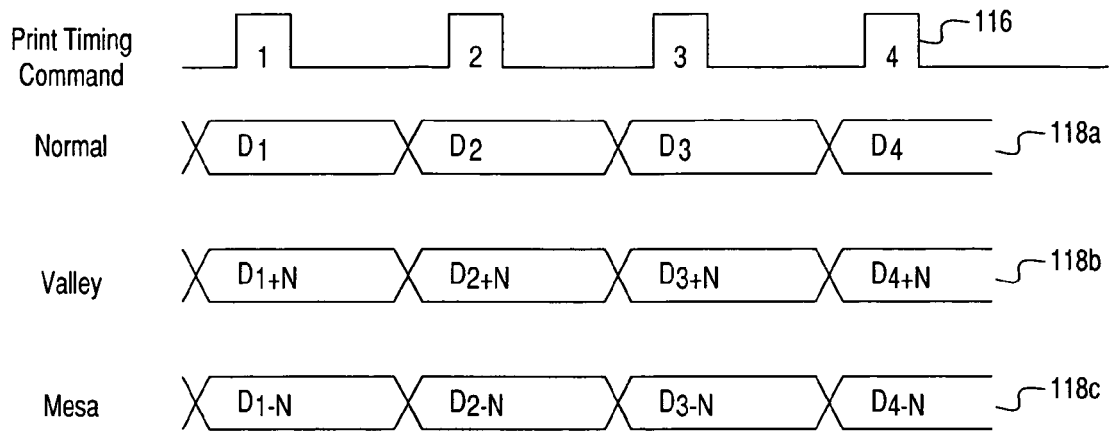
FIG. 22 illustrates a first timing diagram showing a shift in a print data file for compensating for a non-uniform substrate in the direct printing system shown in FIG. 15.
Figure 24:
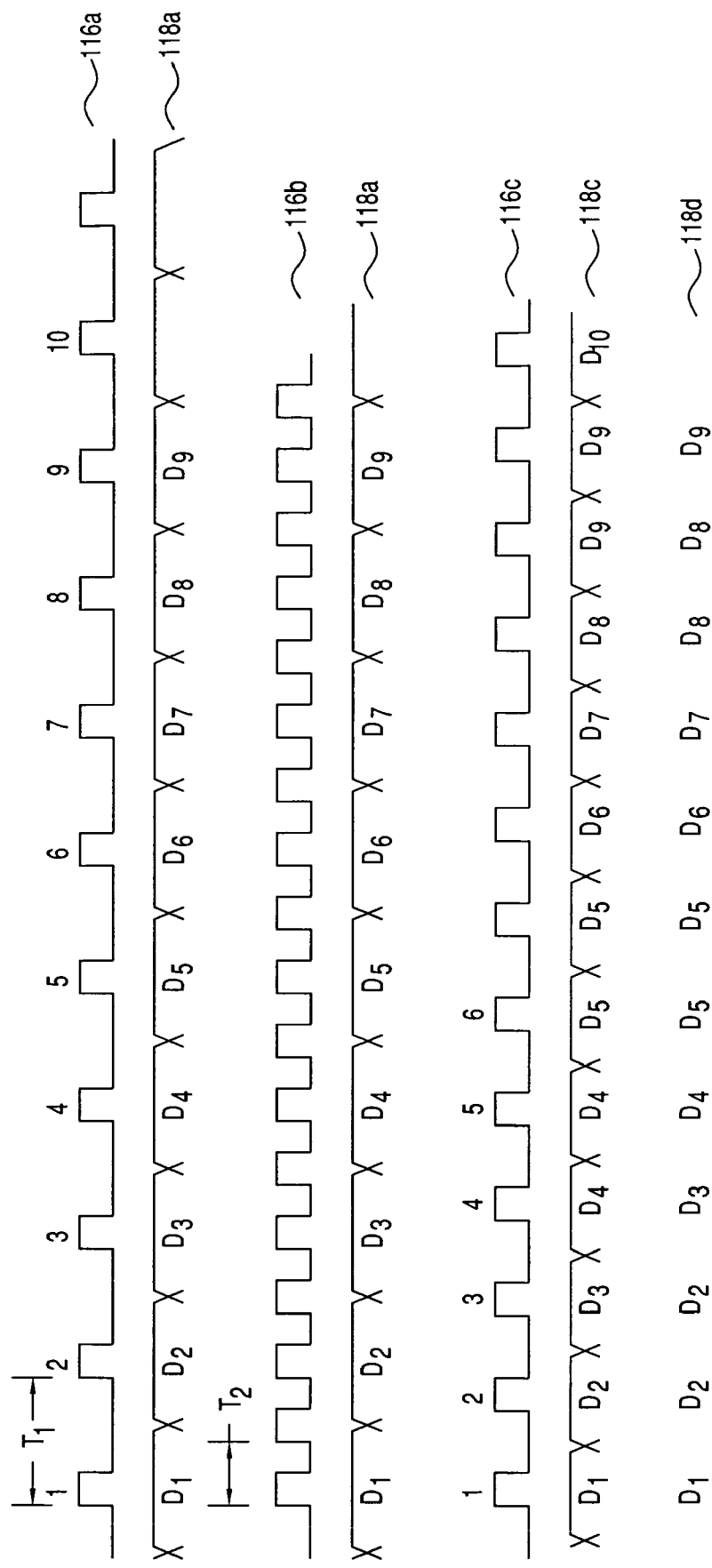
FIG. 24 illustrates a third timing diagram showing a change in a frequency of a print timing command signal to compensate for a non-uniform substrate in the direct printing system shown in FIG. 15.

FIG. 22 illustrates a first timing diagram showing a shift in the data in a print data file 118 to compensate for a non-uniform substrate 60 in the direct printing system 100 shown in FIG. 15. As discussed above, the data of the print data file 118 can be shifted by the direct printing system 100 according to an embodiment of the invention to compensate for both valleys and mesas on the non-uniform surface of a substrate 60 when printing upon it. FIG. 24 illustrates the effect of shifting data when such mesas or valleys are encountered. The print timing command 116 is shown at the top of FIG. 22. In this case, the frequency of the print timing command does not change; the print data file 118a illustrates the situation when the nozzle 78 is expelling ink drops 74 onto a normal, substantially flat surface. Each print data needs to be set up a certain amount of time before the print timing command 116 commands the nozzle to expel an ink drop 74. The print data can either be a logic level 0 or a logic level 1 or other suitable de-assert and assert signals; depending upon the direct printing system, a logic level 1 can cause the nozzle to expel an ink drop 74, and a logic level 0 will cause the nozzle to not expel an ink drop 74.

As illustrated in FIG. 22, print data file 118b illustrates the situation when print data has to be advanced; this occurs when the nozzle 76 encounters a valley. Instead of print data $D_1$ occurring at print timing command signal 1, print data $D_{1+N}$ occurs. The "N" signifies a number of print data positions of advancement. It is possible that the print data needs to be shifted by more than one print timing command signal 116. For example, if the print data normally associated with print timing command signal 3 is shifted to print timing command signal 1, then "N" would equal 2. The effect of advancing the print data is to cause the print data to occur sooner than it would normally otherwise occur. Print data file 118c illustrates the situation when print data has to be retarded; this occurs when encountering a mesa. Instead of print data $D_1$ occurring at print timing command signal 1, print data $D_{1-N}$ occurs. The "N" signifies a number of print data of positions retarding. It is possible that the print data needs to be shifted, or retarded, by more than one print timing command signal 116. For example, if the print data normally associated with print timing command signal 1 is retarded to print timing command signal 3, then "N" would equal 2. The effect of retarding the print data is to cause the print data to occur later than it would normally otherwise occur.

Figure 23:
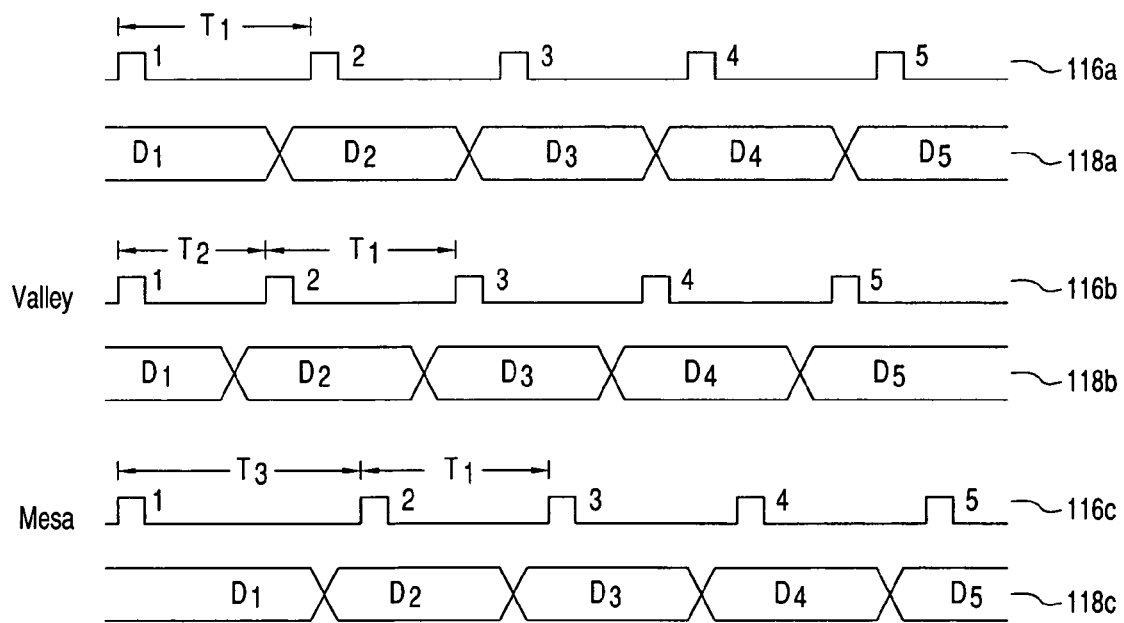
FIG. 23 illustrates a second timing diagram showing a shift in a print timing command signal to compensate for a non-uniform substrate in the direct printing system shown in FIG. 15.

FIG. 23 illustrates a second timing diagram showing a shift in a print timing command signal 116 in the direct printing system 100 shown in FIG. 15. In FIG. 23, the print timing command 116a normally occurs with a period $T_1$. The print data 118a changes at the same period, but just ahead of the print timing command 116a, as is well known to those of ordinary skill in the present invention. When a valley is encountered, the print timing command 116b is created by the direct printing system 100 according to an embodiment of the present invention. Because there is a valley, the print timing command must be advanced by a certain amount of time, $\Delta\tau$. This is dependent, as discussed above, upon the change in height from the nozzle 76 to the surface of the substrate 60, the velocity of the ink drop $V_D$ and the print head $V_{PH}$, and the deviation angle $\theta_D$. The period $T_2$ is set by the direct printing system 100 according to an embodiment of the present invention, which also causes the print data to be set up within the same time period $T_2$. In this case, only one print data needs to be advanced; following print data $D_1$, the direct print system 100 commands the next print timing command signal 118b to revert back to its original period, $T_1$. Print timing command signal 116c illustrates the effect of encountering a mesa. The printing timing command signal 116c is retarded by a certain amount $\Delta\tau$ by the direct printing system 100 according to an embodiment of the present invention. To accomplish this, the direct printing system 100 increases the period of print timing command signal 1 to increase from $T_1$ to $T_3$. Therefore print timing command signal 2 will occur a certain amount of time $\Delta\tau$ later; the direct printing system 100 also ensures that the print data for print timing command signal 2 is set up properly for the delayed command signal. Following the retardation of the print timing command signal 116c, the period is returned to its normal value of $T_1$.

This is, as one of ordinary skill in the art of the present invention can appreciate, a simple example of shifting a print timing command signal 116 according to an embodiment of the present invention. It can be the case that several print timing command signals 118 have to be adjusted, e.g., sequentially, with the same or different periods, by the direct printing system 100. These are all differing embodiments of the present invention as described herein for compensating for a non-uniform substrate 60 according to an embodiment of the present invention.

FIG. 24 illustrates a third timing diagram showing a change in a frequency of a print timing command signal 116 in the direct printing system 100 shown in FIG. 15. In FIG. 24, the frequency of the print timing command signal 116a increases from its normal value of $f_1$ (=1/$T_1$) to $f_2$ (=1/$T_2$). By increasing the frequency of the print timing command signal 116, the direct printing system 100 can increase the amount of ink drops 74 to be expelled from the nozzle 76 for a given area. The increase in frequency is limited by the physical constraints of the nozzles 76. Nozzles 76, being electro-mechanical devices, will have certain maximum operating frequencies above which they cannot be expected to reliably operate. These differ, of course, between different types of nozzle technologies, and also in the manner in which they are deployed in particular direct printing systems.

In FIG. 24, the frequency $f_2$ of the print timing command signal 116b is twice that of the original frequency $f_1$ shown in print timing command signal 116a of FIG. 23. In this instance, however, the print data file 118b in FIG. 24 remains exactly the same as with print timing command signal 116a in FIG. 23. Therefore, two times as many ink drops 74 will be expelled from the nozzle 76 per given area. The print timing command signal 116c illustrates a slightly higher frequency $f_3$ than the print timing command signal 116a of $f_1$, but not twice the rate of print timing command signal 116b $f_2$. The ratio of print timing command signal 116c occurring to print timing command signal 116a is 5:4. Thus, for every four occurrences of print timing command signal 116a, there are five occurrences of print timing command signal 116c (e.g., if $f_1$ equal 10 kHz, $f_2$ equals 12.5 kHz). In order to have the correct data print at the correct positions, only certain print data is repeated, as FIG. 24 illustrates, in print data 118c. Furthermore, the print data file need not be altered. If print data file 118b is used with print timing command signal 116c, print data file 118d would result. In this latter case, $D_2$ repeats, $D_5$ repeats, and then $D_8$ repeats, and so on. As one of ordinary skill in the art of the present invention can appreciate, manipulating the print data file 118 is within the scope of the embodiments of the present invention. The data of the print data file 188 can be shifted and adjusted in numerous ways, depending upon the expected coverage of the ink drops 74 per given area, the ability of the substrate to absorb/spread the ink drops 74, the slope of the mesa or valley, temperature, humidity and other factors. These factors are all taken into account in the direct printing system 100 according to an embodiment of the present invention.

Figure 25:
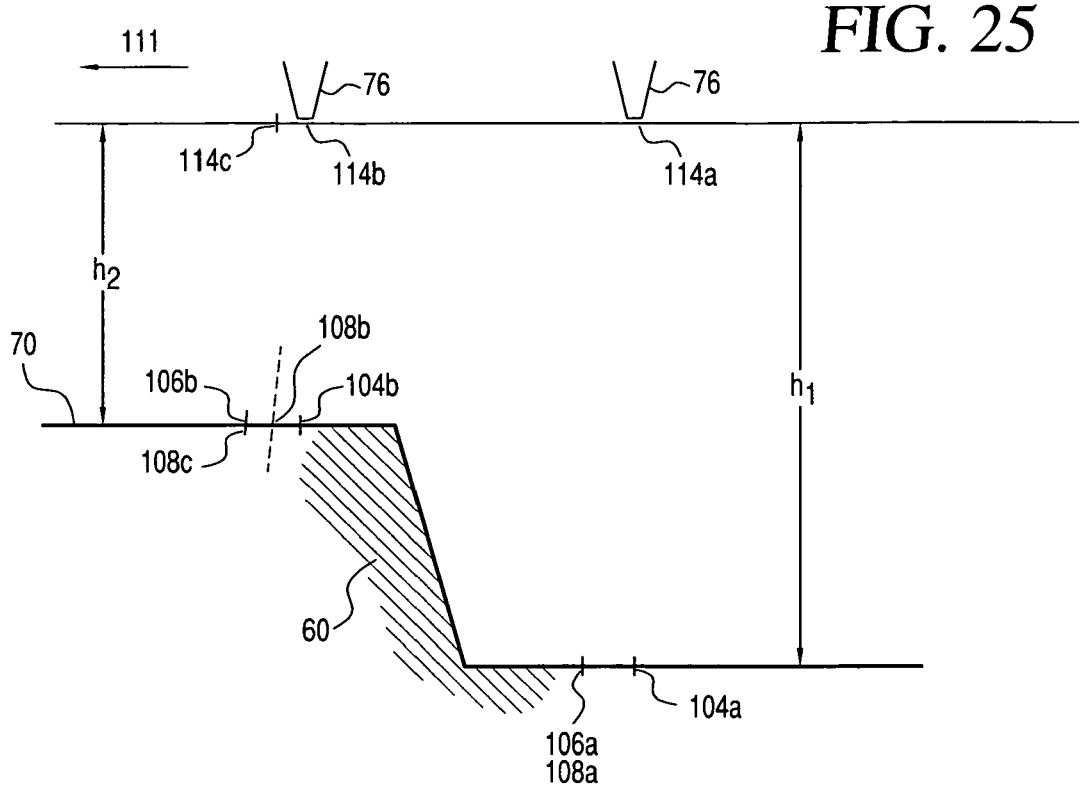
FIGS. 25 and 26 illustrate examples of the direct printing system shown in FIG. 15, encountering a mesa and valley, respectively.
Figure 26:
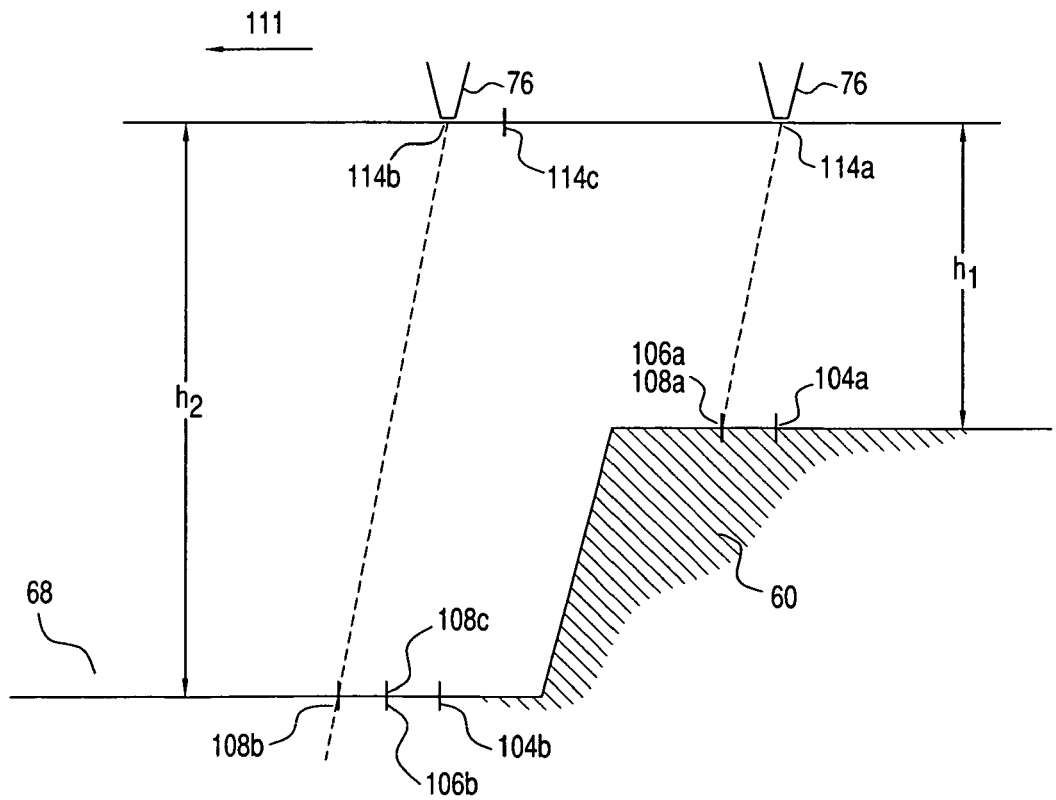

FIGS. 25 and 26 illustrate examples of the direct printing system shown in FIG. 15, encountering a mesa and valley, respectively. In FIG. 25, a mesa 70 is shown on the substrate 60. The difficulties of printing on rising and falling slopes was discussed above with FIGS. 17-24. Some of the same principles apply to mesas 70 as was discussed with rising slopes. If the print head 78 expels an ink drop 74 at a printing position 114a, the ink drop 74 will hit the surface of the substrate at an intended and actual ink drop receive positive 106a, 108a. The print head 78 is at a certain height $h_1$, above the surface of the substrate 60. At printing position 114b, however, the print head 78 is at a different height $h_2$ that is less than $h_1$. If an ink drop 74 is expelled at printing position 114b, it will not hit the mesa 70 surface at intended ink drop receive position 106b, but instead at actual ink drop receive position 108b. This is problematic because it means that discontinuities can develop due to misplaced ink drops 74. As discussed above, several methods exist to compensate for the problem of a mesa 70. These includes shifting the data of the print data file 118, for example, in the direction the print head 78 is moving, shifting the printing time command signal 116 by increasing or decreasing its period at the appropriate time so that it expels an ink drop 74 at printing position 114c, making repeated passes, increasing the frequency of the print timing command signal 116, or by combining two or more of these processes. If the period of the print timing command signal 116 is increased such that the print head 78 expels an ink drop 74 at printing position 114c, the ink drop 74 will encounter the mesa 70 surface at actual ink drop receive position 105c, which is identical to intended ink drop receive position 106b.

In FIG. 26, a valley 68 is shown on the substrate 60. The difficulties of printing on valleys is similar to printing on falling slopes as discussed above in reference to FIGS. 17-24. If the print head 78 expels an ink drop 74 at printing position 114a, the ink drop 74 will hit the surface of the substrate 60 at an intended and actual ink drop receive position 106a, 108a. The print head 78 is at a certain height $h_1$ above the surface of the substrate 60. At printing position 114b, however, the print head 78 is at height $h_2$ above the surface of the valley 68, wherein $h_2$ is greater than $h_1$. If an ink drop is expelled at printing position 114b, it will not hit the valley 68 surface at intended ink drop receive position 106b, but instead at actual ink drop receive position 108b. This is problematic, because it means discontinuities can develop due to misplaced ink drops 74. As discussed above, several methods exist to compensate for the problem of a valley 68. These include shifting the data of the print data file 118, for example towards the direction the print head 78 is moving, shifting the print timing command signal 116 by increasing or decreasing its period at the appropriate time so that it expels an ink drop 74 at printing position 114c, making repeated passes, increasing or decreasing the frequency of the print timing command signal 116, or by combining two or more of these processes for example, if the period of the print timing command signal 116 is decreased such that the print head expels an ink drop 74 at printing position 114c, the ink drop will encounter the valley 68 at actual ink drop receive position 108c, which is identical to intended ink drop receive position 106b.

Figure 27:
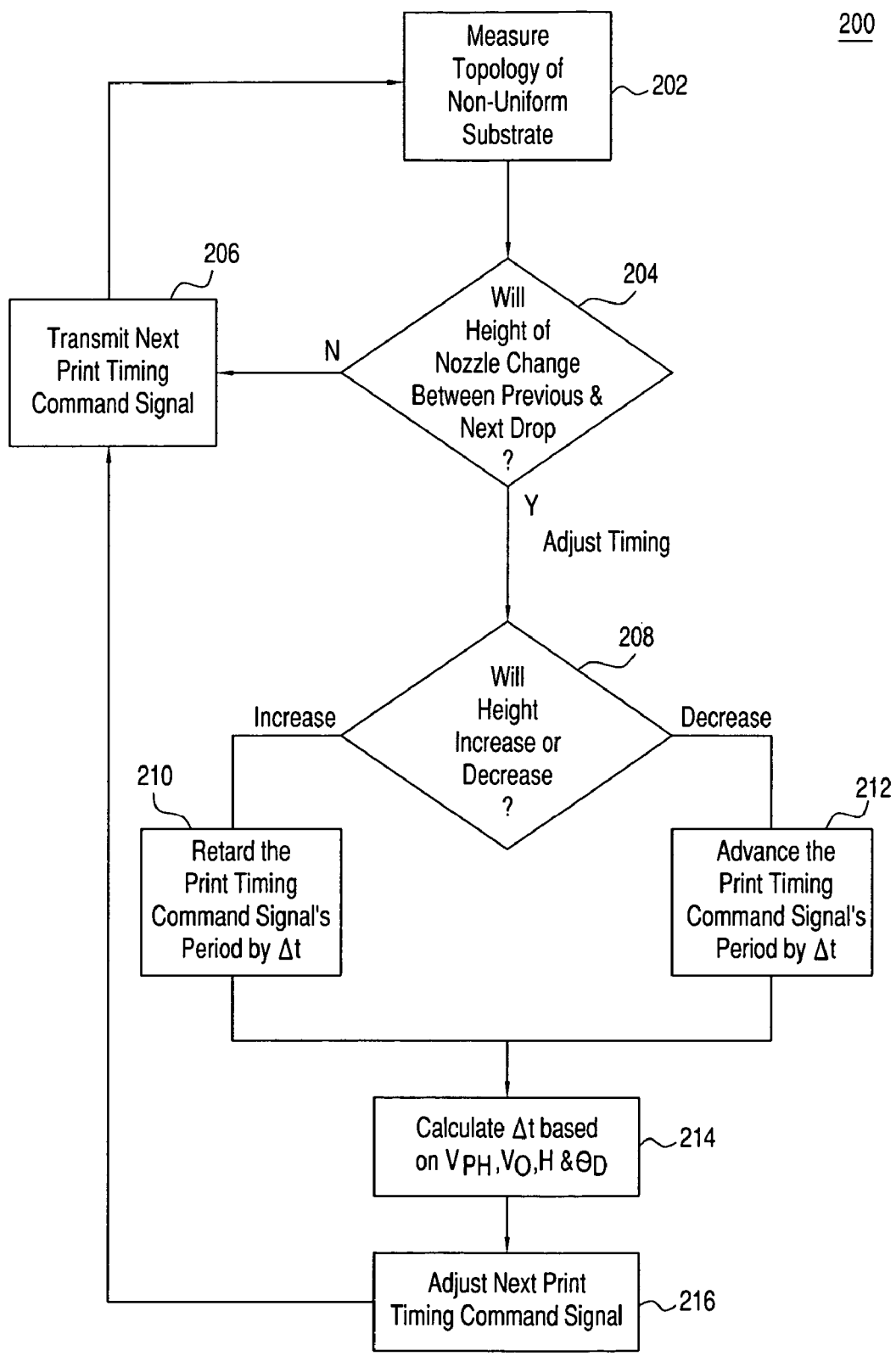
FIG. 27 illustrates a flow diagram of a method to shift the print timing command signal to compensate for a non-uniform substrate according to an embodiment of the present invention.

FIG. 27 illustrates a flow diagram of a method 200 to advance or retard the print timing command signal 116 to compensate for a non-uniform substrate 60 according to an embodiment of the present invention. The method 200 for modifying a print timing command signal 116 begins with step 202 in which the laser interferometer 86 continuously measures the topology of the surface of the substrate 60. This occurs as the print head 78 moves in both the positive and negative x directions, and steps up the substrate 60 in the positive z direction. The data is constantly fed back to the processor 94, which stores the height data in memory, along with the velocity of the print head 78 $V_{PH}$, the velocity of the expelled ink drop 74 $V_D$, and the deviation angle $\theta_D$. As discussed above, the absolute data height generated by the laser interferometer 86 is associated with the laser interferometer's 86 relative position to the nozzle 76. This data is used by an algorithm that determines the amount of time, $\Delta\tau$, to advance or retard the print timing command signal 116. This algorithm is discussed in greater detail below. Following step 202, the method 200 determines, in decision step 204, whether the height from the nozzle 76 to the surface of the substrate 60 will change from the position where an ink drop 74 was previously expelled, to a position where a next ink drop 74 will be expelled. If the magnitude of the change in height does not exceed a first threshold $\Delta h$, then the method 200 proceeds to step 206 ("No" path from decision step 204). In step 206, the next print timing command signal 116 and print data 118 is transmitted to the print head 78 and the nozzle 76. The print data 118 then either causes the nozzle 76 to expel an ink drop 74, or not. The method then returns to step 202.

If the magnitude of the change in height from the nozzle 76 to the surface of the substrate 60 from the position where an ink drop 74 was previously expelled, to a position where a next ink drop 74 will be expelled equals or exceeds the first threshold $\Delta h$ ("Yes" path from decision step 204), the method 200 proceeds to decision step 208. In decision step 208, the method 200 determines whether the change in height increases or decreases. As one of ordinary skill in the art can appreciate, decision steps 204 and 208 need not actually be separate decision steps when written in software code or performed by the algorithm. The flow diagram shown in FIG. 27 is meant to illustrate generally the process by which a determination is made as to how much to shift a print timing command signal 116, if at all, depending on the magnitude and direction of the change in height from the nozzle 76 of the print head 78 to the surface of the substrate 60. One of ordinary skill in the art of the present invention could create a flow diagram of a method that combines certain steps to accomplish the same result of advancing or retarding a print timing command signal 116 to compensate for a non-uniform substrate 60: all such methods are encompassed within the embodiments of the present invention.

If the change in height from the nozzle 76 to the surface of the substrate 60 from the position where an ink drop 74 was previously expelled, to a position where a next ink drop 74 will be expelled is of sufficient magnitude (i.e., equals or exceeds the first threshold $\Delta h$), and is a decrease in height, the method proceeds from decision step 208 to step 212 ("Decrease" path from decision step 208). In step 212, the method 200 determines it will shift the print timing command signal 116 towards the print head 78 by an amount $\Delta\tau$ (i.e., "retard" the print timing command signal 116), and the amount $\Delta\tau$ is calculated in step 214 (retard). Similarly, if the change in height from the nozzle 76 to the surface of the substrate 60 from the position where an ink drop 74 was previously expelled, to a position where a next ink drop 74 will be expelled is of sufficient magnitude (i.e., equals or exceeds the first threshold $\Delta h$), and is an increase in height, then the method 200 proceeds to step 210. In step 210, the method 200 determines that the print timing command signal 116 needs to be advanced by an amount $\Delta\tau$, and the amount $\Delta\tau$ of advancement is calculated in step 214.

The magnitude of $\Delta\tau$ and the direction (advance/retard) is determined in step 214. The magnitude and direction of $\Delta\tau$ depends upon the velocity of the print head 78 $V_{PH}$, the velocity of the ink drop $V_D$, the magnitude and direction of the change in height from the nozzle 76 of the print head 78 to the surface of the substrate 60, and the deviation angle $\theta_D$. As one of ordinary skill in the art of the present invention can appreciate, the determination of the magnitude and direction of $\Delta\tau$ is well within one of ordinary skill in the art of the present invention.

In step 216, the method 200 adjusts the next print timing command signal 116 by the amount $\Delta\tau$ calculated in step 214. In step 206, the method 200 then transmits the adjusted print timing command 116, as well as a corresponding shift in the print data file 118, to the print head 78, whereupon direct printing occurs or not (depending on the print data file 118).

Figure 28:
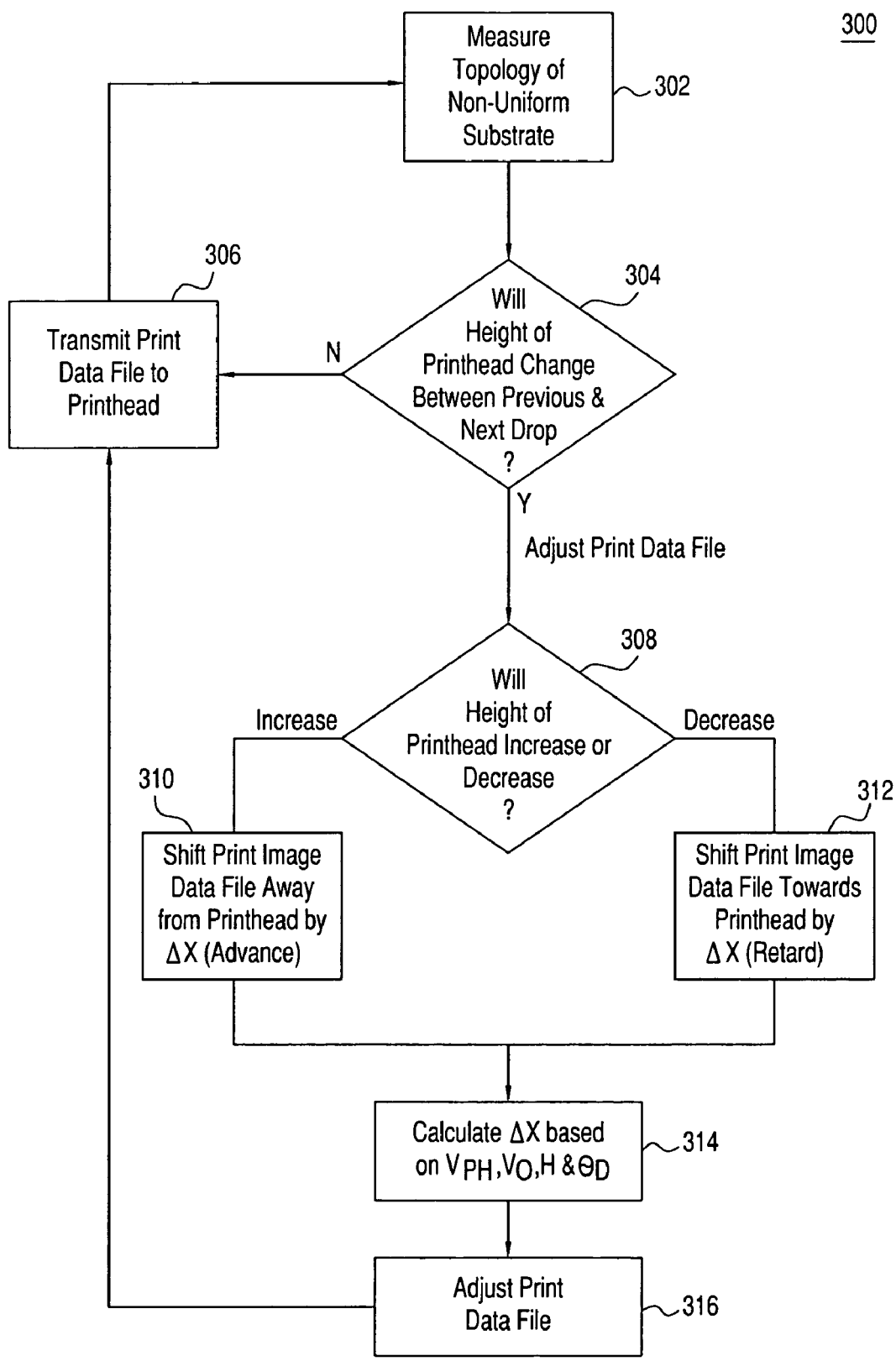
FIG. 28 illustrates a flow diagram of a method to shift the print data file to compensate for a non-uniform substrate according to an embodiment of the present invention.

FIG. 28 illustrates a flow diagram of a method 300 to shift the print data file (print data) 118 to compensate for a non-uniform substrate 60 according to an embodiment of the present invention. The method 300 for shifting the data of the print data file 118 begins with step 302, in which the laser interferometer 86 substantially continuously measures the topology of the surface of the substrate 60. This occurs as the print head 78 moves in both the positive and negative x directions, and steps up the substrate 60 in the positive y direction. The data is constantly fed back to the processor 94, which stores the height data in memory, along with the velocity of the print head 78 $V_{PH}$, the velocity of the expelled ink drop 74 $V_D$, and the deviation angle $\theta_D$. As discussed above, the absolute data height generated by the laser interferometer 86 is associated with the laser interferometer's 86 relative position to the nozzle 76. This data is used by an algorithm that determines the amount of distance, $\Delta x$, to advance or retard the print data file 118. This algorithm is discussed in greater detail below. Following step 302, the method 300 determines, in decision step 304, whether the height from the nozzle 76 to the surface of the surface of the substrate 60 will change from the position where an ink drop 74 was previously expelled, to a position where a next ink drop 74 will be expelled. If the magnitude of the change in height does not exceed the first threshold $\Delta h$, then the method 300 proceeds to step 306 ("No" path from decision step 304). In step 306, the next print timing command signal 116 and print data 118 is transmitted to the print head 78 and the nozzle 76. The print data 118 then either causes the nozzle 76 to expel an ink drop 74, or not. The method then returns to step 302.

If the magnitude of the change in height from the nozzle 76 to the surface of the substrate 60 from the position where an ink drop 74 was previously expelled, to a position where a next ink drop 74 will be expelled equals or exceeds the first threshold Δh ("Yes" path from decision step 304), the method 300 proceeds to decision step 308. In decision step 308, the method 300 determines whether the change in height increases or decreases. As one of ordinary skill in the art can appreciate, decisions steps 304 and 308 need not actually be separate decision steps when written in software code. The flow diagram shown in FIG. 28 is meant to illustrate generally the process by which a determination is made as to how much to shift a print data file 118, if at all, depending on the magnitude and direction of the change in height from the nozzle 76 of the print head 78 to the surface of the substrate 60. One of ordinary skill in the art of the present invention could create a flow diagram that combines certain steps to accomplish the same result of advancing or retarding a print data file 118 to compensate for a non-uniform substrate 60; all such methods are encompassed within the embodiments of the present invention.

Furthermore, the use of a common threshold, Δh, to determine whether to shift the print timing command signal 116 or data of the print data file 118 suggests that these methods (i.e., methods 200 and 300) need not be mutually exclusive; indeed, one skilled in the art of the present invention can appreciate that it is within the scope of the embodiments of the present invention to combine the two methods (shifting the print timing command and shifting the print data file) as discussed in reference to FIGS. 27 and 28. In an exemplary embodiment of the present invention, the methods illustrated by the flow diagrams of FIGS. 27 and 28 (methods 200 and 300) can be combined such that decision steps 204, 208 and 304, 308 are combined to determine whether a change in height will occur, the direction of the change (should it equal or exceeds the first threshold Δh), and then the determination of whether to alter the print timing command signal 116, the data of the print data file 118, or both, and whether to take the aforementioned action on a dot-by-dot basis, or for a specific amount of dots. The method according to an embodiment of the present invention can also make those determinations based on the measured values (as discussed above) but also certain other factors or variables, such as temperature, humidity, type of ink, type of substrate, slope of the valley, slope of the mesa, among other factors. Taking into account all these variables, as well as others not mentioned, in the manner discussed above, are within the scope of the embodiments of the present invention. This combinatorial approach is discussed in greater detail below.

If the change in height from the nozzle 76 to the surface of the substrate 60 from the position where an ink drop 74 was previously expelled, to a position where a next ink drop 74 will be expelled is of sufficient magnitude (i.e., equals or exceeds the first threshold Δh), and is a decrease in height, the method proceeds from decision step 308 to step 312 ("Decrease" path from decision step 308). In step 312, the method determines it will shift the data of the print data file 118 towards the print head 78 by an amount Δx (i.e., "retard" the data of the print data file 118), and the amount of Δx is calculated in step 314. Similarly, if the change in height from the nozzle 76 to the surface of the substrate 60 from the position where an ink drop 74 was previously expelled, to a position where a next ink drop 74 will be expelled is of sufficient magnitude, and an increase in height, then the method 300 proceeds to step 310. In step 310, the method determines that the print data file 118 needs to be advanced by an amount Δx, and the amount of advancement Δx is calculated in step 314.

The magnitude and direction of Δx (advance/retard) is determined in step 314. The magnitude and direction of Δx depends upon the velocity of the print head 78 $V_{PH}$, the velocity of the ink drop $V_D$, the magnitude and direction of the change in height from the nozzle 76 of the print head 78 to the surface of the substrate 60, and the deviation angle $\theta_D$. As one of ordinary skill in the art of the present invention can appreciate, the determination of the magnitude and direction of Δx is well within one of ordinary skill in the art of the present invention. Furthermore, however, Δx must be determined in terms of the period of the print timing command signal 116. For example, if the direct printing system 100 can expel ink drops 74 every 100 microseconds (period of the print timing command signal 116), and the velocity of the print head 78 is 1M/S, then the dot spacing is 0.1 mm $$\text{Dot Spacing} = \frac{V_{PH}}{1/T};$$

where $V_{PH}$ is the velocity of the print head 78, and T is the period of the print timing command signal 116. If Δx equals 0.25 mm, then the print data file 118 must be advanced (or retarded) by 2 or 3 periods of the print timing command signal 116 (0.25/0.1=2.5 periods).

In step 316, the method 300 adjusts the data of the print data file 118 by the amount Δx calculated in step 314. In step 306, the method 300 then transmits the adjusted data of the print data file 118 and print timing command 116 to the print head 78, whereupon direct printing occurs or not (depending on the data of the print data file 118).

Figure 29A:
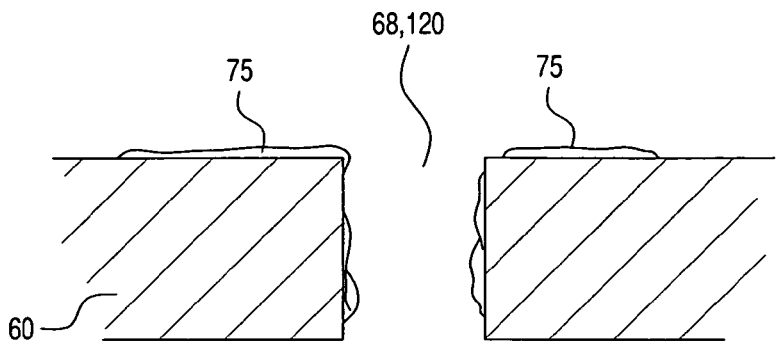
FIGS. 29A-29C illustrate an effect of repeated printing over a through-hole via in a non-uniform substrate according to an embodiment of the present invention.
Figure 29B:
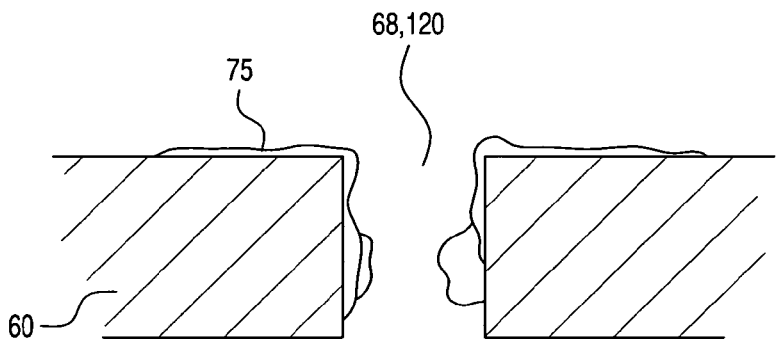
Figure 29C:
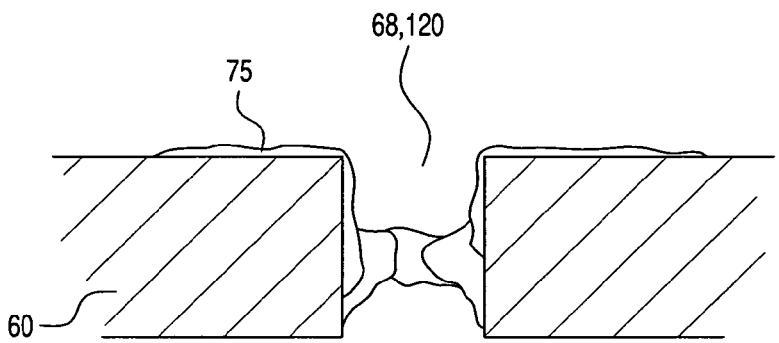

FIGS. 29A-29C illustrate an effect of repeated printing over a valley-type feature on a non-uniform substrate 60 according to an embodiment of the present invention. FIGS. 29A, 29B, and 29C represent an extreme type of valley 68, in this instance a through-hole via (via) 120, that can be encountered when direct printing conductive (or other types) of traces on a substrate 60. In FIG. 29A, the direct printing system 100 has made at least one printing pass over the via 120, and cured ink 75 is seen next to the via 120, and along the via's interior walls. Curing can occur over several minutes, or can be accelerated by applying heat. Curing solidifies the ink drop 74, changing the chemical formulation and giving the ink drop 74 its unique electrical characteristic. In the case of a conductive type ink, the ink only becomes conductive when its is cured. Curing is dependent upon the chemical composition of the ink 74, its viscosity, temperature, humidity, substrate 60, and other factors.

In this example of a via 120, the direct printing system 100 according to an embodiment of the present invention has determined that in order to bridge the via 120, repeated passes are made by the direct printing system 100. Prior to printing the ink 74 on the substrate 60, the user designs the layout using a suitable board layout application program (layout program) on a computer, that has the layout of the particular substrate 60, including the location of any vias 120. If the user wishes to bridge the via 120, a special feature of the design program can be utilized that provides for repeated passes by the direct printing system 100 in the particular area, or, based on the topology as determined by the laser interferometer 86, the direct printing system 100 can determine itself that repeated passes are necessary to bridge this particular via 120, as discussed above. The number of passes, also referred to as repeated passes, depends upon the diameter and depth of the via 120, as well as the type of conductive ink 74 being used. In this exemplary embodiment of the present invention a conductive ink 74 is being used. As one of ordinary skill in the art of the present invention can appreciate, however, this is but one example, and other types of inks 74 (including resistive, insulating, among other types) can also be used. The direct printing system 100 determines the number of repeated passes necessary to provide the required bridge of conductive ink 74. The operator then places the substrate in the direct printing system 100, which then proceeds to direct print the layout as designed. FIGS. 29A-29C illustrate three "snapshots" in the build-up of the cured ink 75 over several repeated passes.

Figure 30:
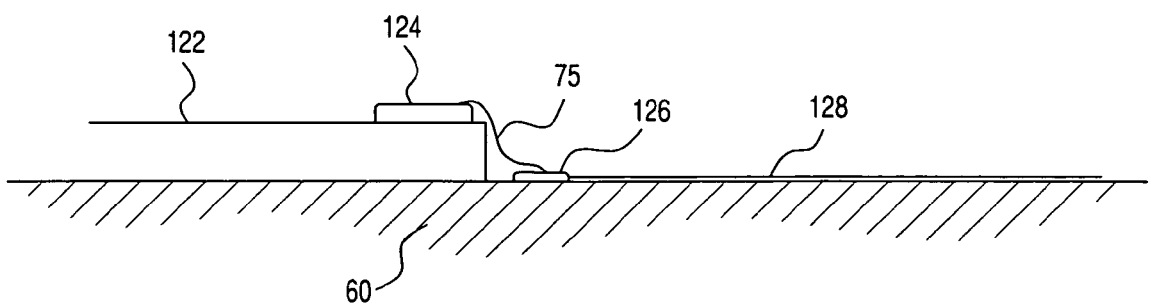
FIG. 30 illustrates printing of a conductive path from an inverted integrated circuit lead pin to a printed circuit board pad using one or more methods according to an embodiment of the present invention.

FIG. 30 illustrates printing of a conductive path from an inverted integrated circuit lead pin 124 to a printed circuit board pad 126 using one or more of the methods according to an embodiment of the present invention. FIG. 30 illustrates a second example of when repeated passes by the direct printing system 100 can be utilized to provide a conductive trace on the substrate 60. In this case, however, the direct printing system prints the ink 74 from a lead pad 124 of the integrated circuit (IC) 122 to a printed circuit board pad (PCB pad) 126 using repeated passes to build up the conductive layers of cured ink 75. After applying ink 74 and then curing it (so that it becomes cured ink 75), signals can flow to and/or from the lead pad 124 to the PCB pad 124 and then the PCB conductive trace 128 (which may itself have been applied by the direct printing system 100).

Figure 31:
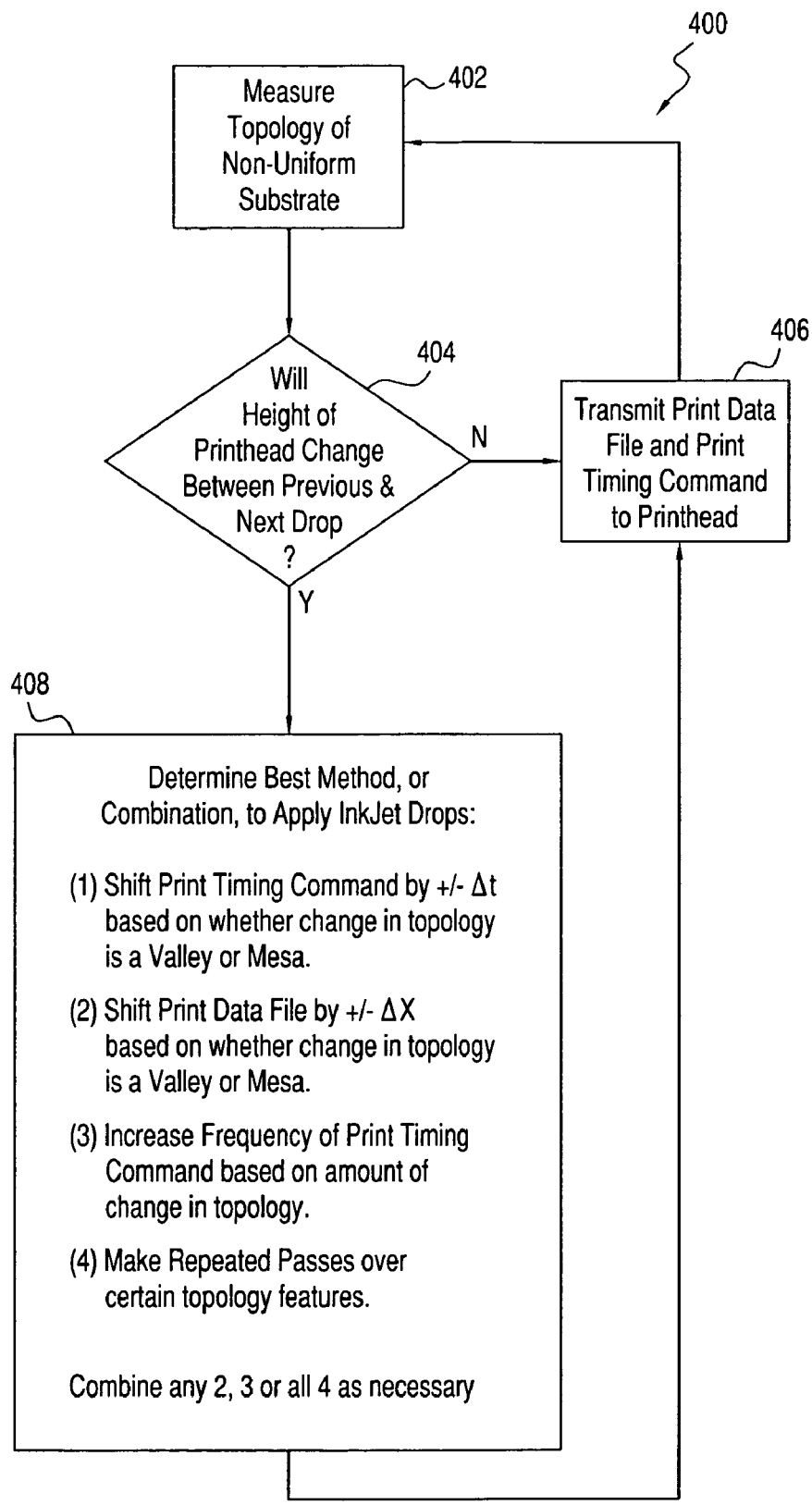
FIG. 31 illustrates a flow diagram of a method to compensate for a non-uniform substrate according to an embodiment of the present invention.

FIG. 31 illustrates a flow diagram of a method 400 to compensate for a non-uniform substrate 60 according to an embodiment of the present invention. Previously, two different methods, methods 200 and 300, were discussed that described different approaches to correcting for a non-uniform substrate 60. As was discussed above, those approaches, as well as others, need not be mutually exclusive. FIG. 31 illustrates a method 400 that combines aspects of the methods 200, 300 discussed in regard to FIGS. 27 and 28, as well as two other methods for which flow diagrams were not provided. The other two methods are increasing the frequency of the print timing command signal 116, and making repeated passes by the direct printing system 100 over particular areas of the substrate.

Method 400 for compensating for a non-uniform substrate 60 according to an embodiment of the present invention begins with step 402. In step 402 the laser interferometer 86 continuously measures the topology of the surface of the substrate 60. This occurs as the print head 78 moves in both the positive and negative x directions, and steps up the substrate 60 in the positive y direction. The data is constantly fed back to the processor 94, which stores the height data in memory, along with the velocity of the print head 78 $V_{PH}$, the velocity of the expelled ink drop 74 $V_D$, and the deviation angle $\theta_D$. As discussed above, the absolute height data generated by the laser interferometer 86 is associated with the laser interferometer's 86 relative position and height to the nozzle 76. This data is then used by an algorithm that determines the amount of distance, $\Delta\tau$, to advance or retard the print data file 118, as well as the amount of time, $\Delta\tau$, to advance or retard the print timing command signal 116. The direct printing system 100 can also use the topology data to determine whether the frequency of the print timing command signal should be increased or decreased, or whether repeated passes need to be made over certain topological features (e.g., via holes 120). This algorithm is discussed in greater detail below.

Following step 402, the method 400 determines, in decision step 404, whether the height from the nozzle 76 to the surface of the surface of the substrate 60 will change from the position where an ink drop 74 was previously expelled, to a position where a next ink drop 74 will be expelled. If the magnitude of the change in height does not exceed the first threshold $\Delta h$, then the method 400 proceeds to step 406 ("No" path from decision step 404). In step 406, the next print timing command signal 116 and print data 118 are transmitted to the print head 78 and the nozzle 76. The print data 118 then either causes the nozzle 76 to expel an ink drop 74, or not, depending upon the print data file 118. The method then returns to step 402.

If, however, the magnitude in the change in height from the nozzle 76 to the surface of the substrate 60 from the position where an ink drop 74 was previously expelled, to a position where a next ink drop 74 will be expelled equals or exceeds the first threshold Ah, the method 400 proceeds to decision step 408 ("Yes" path from decision step 404). In decision step 408, the method 400 determines the best method for compensating for the change in height based on the magnitude of the change in height, the direction of the change (i.e., valley or mesa), and whether any specific topological feature is present that necessitates a particular method of compensating for the non-uniform substrate 60.

There are, as discussed above, four methods of compensating for a non-uniform substrate 60. The first method comprises shifting the print timing command 116 by a certain amount of time, $\Delta\tau$, either by advancing the print timing command signal 116 or retarding the print timing command signal 116. Retarding the print timing command signal 116 compensates for a valley in the substrate 60, and advancing the print timing command signal 116 compensates for a mesa on the substrate 60. The second method comprises shifting the data of the print data file 118 by a certain amount of distance, $\Delta x$, either by advancing the data of the print data file 188 or retarding the data of the print data file 118. Retarding the data of the print data file 118 compensates for a valley in the substrate 60, and advancing the data of the print data file 118 compensates for a mesa on the substrate 60. The third method comprises increasing or decreasing the frequency of the print timing command signal 116, with or without changing the data of the print data file 118. This method can be used for either a valley or mesa feature on a substrate 60. And the fourth method for compensating for a non-uniform substrate is making repeated passes over certain topological features. Again, this can be used for either a valley or mesa feature on the substrate 60.

In step 408, the method 400 determines which one of the above-identified methods, or which combinations thereof, should be used for the topological changes being encountered by the direct printing system 100. For example, the method 400 can combine all four of the methods described above, any three or any two of them, as necessary.

In step 408, the method 400 adjusts the data of the print data file 118 by the amount $\Delta x$, the print timing command signal 116 by the amount $\Delta\tau$, the frequency of the printing timing command signal 116, and/or provides for repeated passes over certain topological features. The method 400 then transmits the adjusted data of the print data file 118 and/or print timing command signal 116 to the print head 78, whereupon direct printing occurs or not (depending on the data of the print data file 118). Prior to transmitting the data of the print data file 118, of course, the print data file 118 is compiled.

Compiling can be accomplished electronically (i.e., by a printer's driver software). The printer's driver software takes the print data file 118 and translates the information contained therein into a format (i.e., a series of commands and data) that the particular attached printer can understand. Following step 406, the method 400 returns to step 402, where the process repeats itself.

The direct printing system 100 according to an embodiment of the present invention can be used to print on many non-uniform substrates 60, and other substrates with different characteristics that the conventional printing systems could not compensate for. For example, printing on thick and thin film hybrids (i.e., MOSFETS and AMLCDs') with conventional lithography, photolithography and mesh screen printing is either virtually impossible, or prohibitively expensive. Printing on the thin-film devices mentioned above, as well as silicon solar cells, with the direct printing system, 100 according to an embodiment of the present invention, however, is much simpler, inexpensive and very effective. Other types of printing that can be accomplished readily by the direct printing system 100 according to an embodiment of the present invention are surfaces that have wet chemically active surfaces, such as reducing or fixing agents. The use of hydrophobic and hydrophilic inks 74 can also facilitate direct printing of substrates according to any of the embodiments of the present invention disclosed herein. Since there are no meshes, drums, or masks to place onto the covered substrate 60, substantially no unwanted interference with the chemical surface will occur.

Figure 32A:
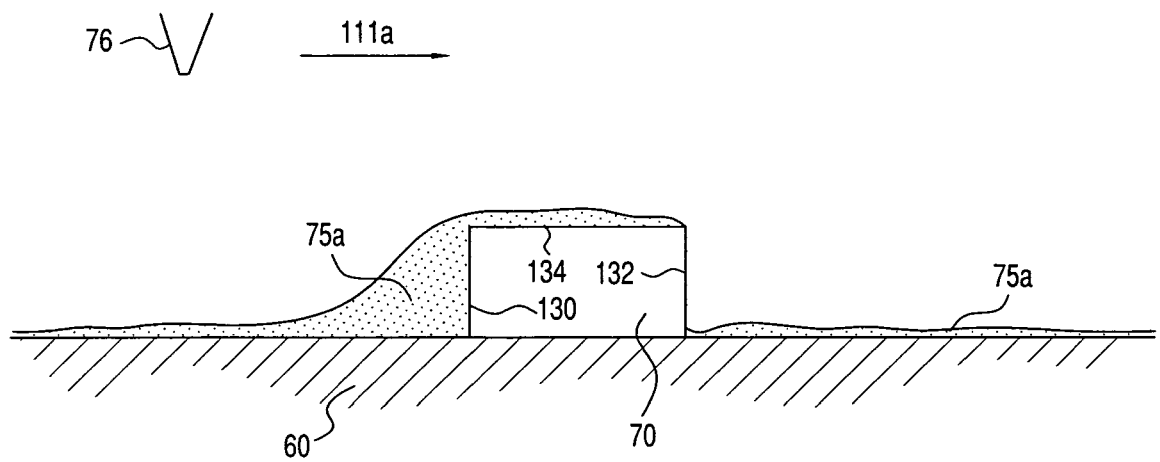
FIGS. 32A and 32B, and 33A-33C illustrate several exemplary embodiments of substrates that can be printed upon with the direct printing system shown in FIG. 15 according to an embodiment of the present invention
Figure 32B:
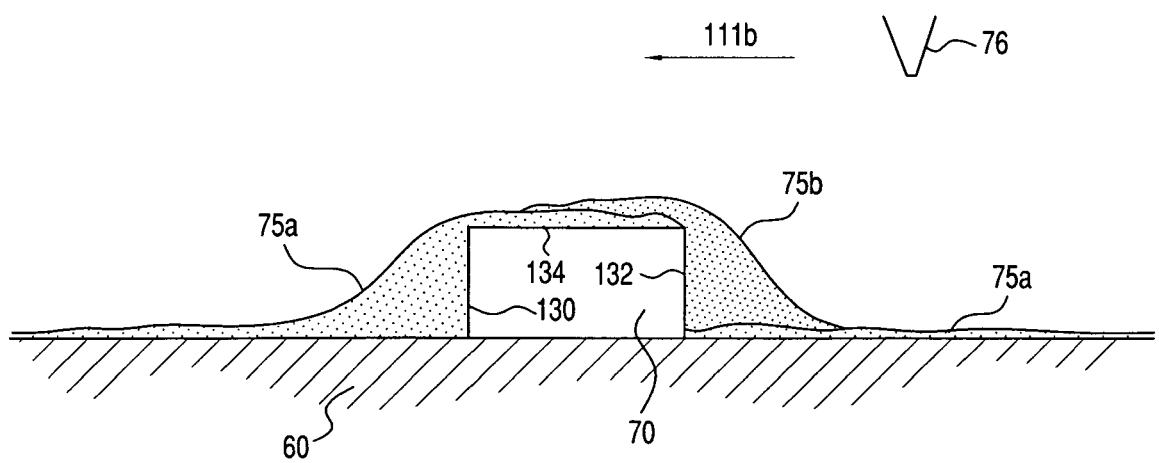
Figure 33A:
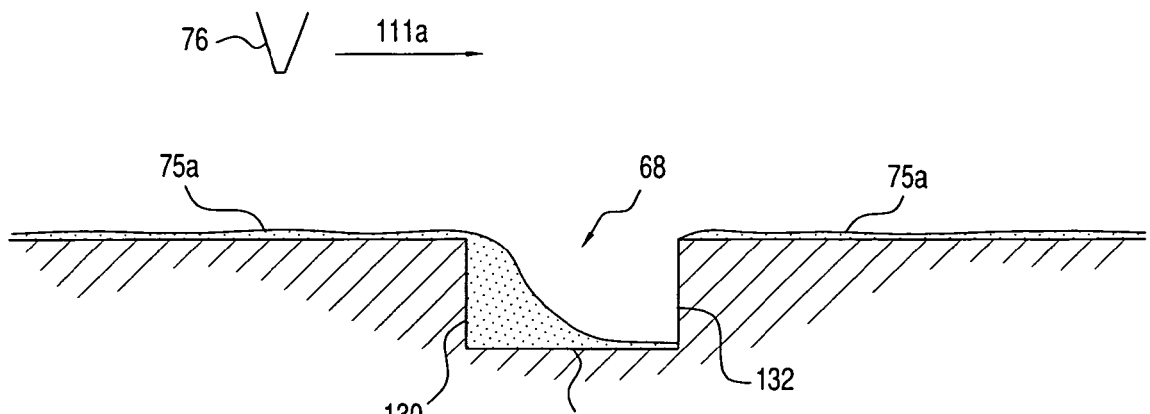
Figure 33B:
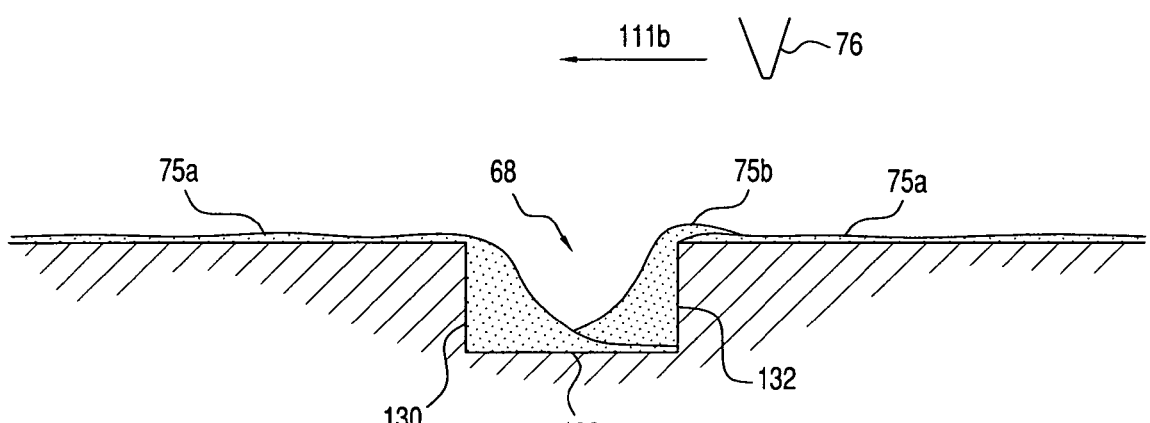
Figure 33C:
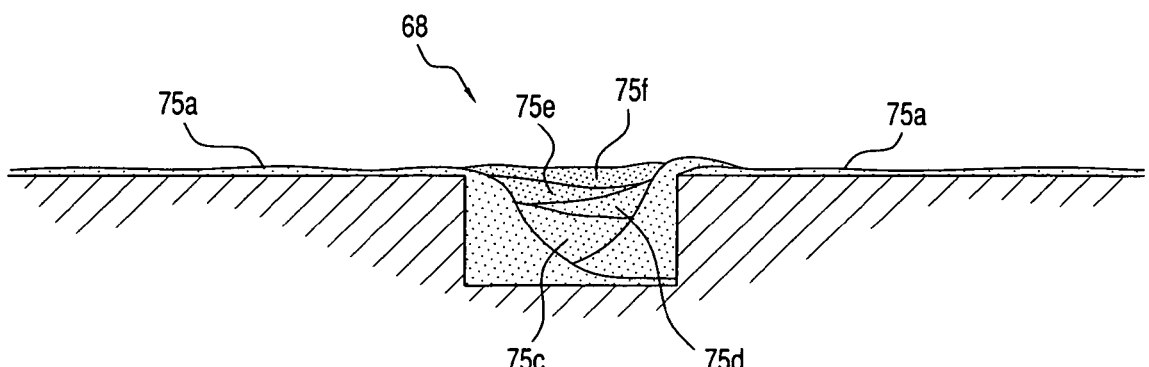

FIGS. 32A, 32B, and 33A-33C illustrate several exemplary embodiments of several substrate features that have been printed upon with the direct printing system 100 according to an embodiment of the present invention. As discussed above, it possible that the direct printing system 100 can create a topological survey of the surface of a substrate 60 prior to any printing occurring. Once the topological survey has been performed, and a height map created, the direct printing system 100 can then analyze the height data, and determine where there are mesas and valleys that need to be printed over, and the best method for accomplishing that printing. Regardless of the method(s) used, however, because of the physical nature of the direct printing system 100, i.e., the print head 78 moving and expelling ink drops 74, substrate features of mesas and valleys with walls that are at or about 90° present greater than normal difficulties when attempting to print a conductive path over them. In FIG. 32A, the mesa 70 comprises two (or more) walls 130, 132 that are at or about 90° with respect to the surface of the substrate 60. If the print head 78 moves in the direction as shown by arrow 111a, then as it encounters and prints over first wall 130, it will be able to lay a path of ink drops 74 over the first wall 130. The direct printing system 100 can use repeated passes, or an increase in frequency of the print timing command signal 116 to apply extra ink drops 74 to the first wall 130 area that will result in a first layer 75a of cured ink to bridge over the first wall 130. In regard to the second wall 132, however, it may be difficult for the nozzle 76 to expel enough ink drops 74 to create a layer of cured ink 75a to bridge the second wall 132. Therefore, the direct printing system 100 according to an embodiment of the present invention can print a second set of ink drops 74 in a reverse direction, as shown by the arrow 111b in FIG. 32B, to create a second layer 75b of cured ink that will bridge the second wall 132 of the mesa 70, and interconnect the first layers 75a of cured ink. Ink 74 can be conductive, resistive, ferromagnetic, ink with a specific dielectric constant, an insulating layer, or any other suitable type of ink In FIG. 33A, a valley 68 comprises two (or more) walls 130, 132 that are at or about 90° with respect to the surface of the substrate 60, as well as a floor 136. If the print head 78 moves in the direction as shown by arrow 111a, then as it encounters and prints over first wall 130, it will be able to lay a path of ink drops 74 down the first wall 130. The direct printing system 100 can use repeated passes, or an increase in frequency of the print timing command signal 116 to apply extra ink drops 74 to the first wall 130 area that will result in a first layer 75a of cured ink to bridge down the first wall 130. In regard to the second wall 132, however, it may be difficult for the nozzle 76 to expel enough ink drops 74 to create a layer of cured ink 75a to bridge over the second wall 132. Therefore, the direct printing system 100 according to an embodiment of the present invention can print a second set of ink drops 74 in a reverse direction, as shown by the arrow 111b in FIG. 33B, to create a second layer of cured ink 75b that will bridge the second wall 132 of the valley 68, and interconnect the first layer 75a of cured ink. In some circumstance, however, it can be necessary to not only provide a conductive path over a valley 68, but to entirely fill in the valley 68. The direct printing system 100 can provide the "ink bridge" as described in reference to FIGS. 33A and 33B, but can also use a feature of selective printing and repeated passes to apply ink drops 74 only over the valley 68. Selective printing is the process whereby the direct printing system 100 prints over given areas, and only those given areas for a given number of times. Selective printing therefore causes the print head 78 to move back and forth over a certain area expelling ink 74 only over that certain area, in order to compensate for a particular substrate feature, without printing any where else on the substrate during that particular time. After several or more passes (depending on the depth of the valley 68, and the viscosity of the ink 74), a number of layers of cured ink 75c, 75d, 75e, and so on, have been provided and the valley 68 has been effectively filled in.

The present invention has been described with reference to certain exemplary embodiments thereof. However, it will be readily apparent to those skilled in the art that it is possible to embody the invention in specific forms other than those of the exemplary embodiments described above. This may be done without departing from the spirit and scope of the invention. The exemplary embodiments are merely illustrative and should not be considered restrictive in any way. The scope of the invention is defined by the appended claims and their equivalents, rather than by the preceding description.

All United States patents and applications, foreign patents, and publications discussed above are hereby incorporated herein by reference in their entireties.

What is claimed is:

1. A process for compensating for a non-uniform surface of a substrate when printing onto the non-uniform surface of the substrate, comprising:

measuring height of a print head above the non-uniform surface of the substrate at a plurality of locations on the non-uniform surface, wherein measuring the height at any one of the locations occurs prior to any printing at that location; and adjusting a print timing command when printing an electrical component in accordance with a topology of the non-uniform surface of the substrate, wherein adjusting the print timing command is based on relative velocity between the print head and the substrate, ink drop velocity, and the relative height difference between a height of the print head before a previous drop was expelled and a height of the print head after the previous drop was expelled.

2. The process according to claim 1, wherein adjusting the print timing command is further based on ink drop deviation angle, $\theta_D$.

3. The process according to claim 1, further comprising:
creating a topological survey of the non-uniform surface of the substrate based on the measured heights;
creating a print file for a desired print image to be printed onto the non-uniform surface of the substrate;
initiating a printing sequence to print the desired print image onto the non-uniform surface of the substrate;
determining an initial location of the print head with respect to the non-uniform surface of the substrate;
determining a drop velocity of a drop of ink from the print head; and
determining a print head velocity relative to the substrate material.

4. The process according to claim 1, further comprising:
direct printing the electrical component onto the non-uniform surface of the substrate in accordance with the adjusted print timing command.

5. The process according to claim 1, further comprising:
transmitting the adjusted print timing command to the print head.

6. The process according to claim 5, wherein measuring height of the print head comprises:
measuring print head height above the non-uniform surface of the substrate by a laser interferometer.

7. The process according to claim 1, wherein adjusting the print timing command comprises:
initiating the print timing command to cause the print head to expel a next drop sooner by a first delta $\tau$ amount if a height of the print head above the non-uniform surface of the substrate at a next print drop release position increases relative to a height of the print head above the non-uniform surface of the substrate at a previous print drop release position; and
initiating the print timing command to cause the print head to expel the next drop later by a second delta $\tau$ amount if the height of the print head above the non-uniform surface of the substrate at the next print drop release position decreases relative to the height of the print head above the non-uniform surface of the substrate at the previous print drop release position.

8. The process according to claim 7, wherein the first and/or second delta $\tau$ amounts reflect measurements of time.

9. The process according to claim 8, wherein if the print timing command occurs sooner by the first delta $\tau$ amount, the first delta $\tau$ amount is a negative number added to a print timing command period.

10. The process according to claim 8, wherein if the print timing command occurs later by the second delta $\tau$ amount, the second delta $\tau$ amount is a positive number added to a print timing command period.

11. The process according to claim 1, wherein adjusting the print timing command comprises:
calculating a first delta $\tau$ amount if a height of the print head above the non-uniform surface of the substrate at a next print drop release position increases relative to a height of the print head above the non-uniform surface of the substrate at a previous print drop release position;
calculating a second delta $\tau$ amount if the height of the print head above the non-uniform surface of the substrate at the next print drop release position decreases relative to the height of the print head above the non-uniform surface of the substrate at the previous print drop release position, wherein the first delta $\tau$ and the second delta $\tau$ amounts are measurements of time and are calculated according to speed of the print head in a direction substantially parallel to a plane of the non-uniform surface of the substrate, print head height above the non-uniform surface of the substrate, and print drop velocity as print drop is expelled from the print head;
adjusting the print timing command by either the first or second delta $\tau$ amount; and
transmitting the adjusted print timing command to the print head.

12. The process according to claim 11, wherein calculating the first and/or second delta $\tau$ amounts is carried out by performing an algorithm with a processor of a print system that includes the print head.

13. The process according to claim 1, wherein adjusting the print timing command comprises:
adjusting an electronic print file that is used to generate the print timing command.

14. The process according to claim 13, wherein adjusting the electronic print file is based on the relative height difference between a height of the print head before a previous drop was expelled and a height of the print head after the previous drop was expelled, the process further comprising:
transmitting the adjusted print timing command to the print head.

15. The process according to claim 14, wherein measuring height of the print head comprises:
measuring print head height above the non-uniform surface of the substrate by a laser interferometer.

16. The process according to claim 13, wherein adjusting the electronic print file comprises:
shifting data of the electronic print file by a first delta x amount and in a first direction if a height of the print head above the non-uniform surface of the substrate at a next print drop release position increases relative to a height of the print head above the non-uniform surface of the substrate at a previous print drop release position; and
shifting data of the electronic print file by a second delta x amount and in a second direction opposite to the first direction if the height of the print head above the non-uniform surface of the substrate at the next print drop release position increases relative to the height of the print head above the non-uniform surface of the substrate at the previous print drop release position.

17. The process according to claim 16, wherein in response to shifting data of the electronic print file by a first delta x amount and in a first direction, the process further comprises:
changing a timing period of a signal reflecting the print timing command that causes the print head to expel a print drop to expel the print drop sooner by a first delta time amount that corresponds to the first delta x amount.

18. The process according to claim 16, wherein in response to shifting data of the electronic print file by a second delta x amount and in a second direction opposite to the first direction, the process further comprises:
changing a timing period of a signal reflecting the print timing command that causes the print head to expel a print drop to expel the print drop later by a second delta time amount that corresponds to the second delta x amount.

19. The process according to claim 16, wherein shifting data of the electronic print file by a first delta x amount and in a first direction comprises:
advancing a print pattern data set associated with a first x-y position, by one or more print timing command periods such that the print pattern data set is transmitted to the print head by the one or more print timing command periods prior to when the print pattern data set would have been transmitted to the print head.

20. The process according to claim 16, wherein shifting data of the electronic print file by a second delta x amount and in a second direction opposite to the first direction comprises:
retarding a print pattern data set associated with a first x-y position, by one or more print timing command periods such that the print pattern data set is transmitted to the print head by the one or more print timing command periods after when the print pattern data set would have been transmitted to the print head.

21. The process according to claim 16, wherein the first and/or second delta x amounts reflect a measurement of distance in the direction the print head is moving.

22. The process according to claim 21, wherein the print file is shifted in a negative x direction.

23. The process according to claim 21, wherein the print file is shifted in a positive x direction.

24. The process according to claim 13, further comprising:
creating a topological survey of the non-uniform surface of the substrate based on the measured heights;
creating a print file for a desired print image to be printed onto the non-uniform surface of the substrate;
initiating a printing sequence to print the desired print image onto the non-uniform surface of the substrate;
determining an initial location of the print head with respect to the non-uniform surface of the substrate;
determining a drop velocity of a drop of ink from the print head; and
determining a print head velocity relative to the substrate material.

25. The process according to claim 13, wherein adjusting the electronic print file comprises:
calculating a first delta x amount, if a height of the print head above the non-uniform surface of the substrate at a next print drop release position increases relative to a height of the print head above the non-uniform surface of the substrate at a previous print drop release position;
calculating a second delta x amount if the height of the print head above the non-uniform surface of the substrate at the next print drop release position decreases relative to the height of the print head above the non-uniform surface of the substrate at the previous print drop release position; wherein each of the first and second delta x amounts is calculated according to speed of the print head in a direction substantially parallel to a plane of the non-uniform surface of the substrate, print head height above the non-uniform surface of the substrate, and print drop velocity as print drop is expelled from the print head;
adjusting the electronic print by either the first or second delta x amount; and
transmitting the adjusted electronic print file to the print head.

26. The process according to claim 25, wherein each of the first and second delta x amounts is a measurement of distance in the direction the print head is moving.

27. The process according to claim 25, wherein calculating the first and/or second delta x amounts is carried out by performing an algorithm with a processor of a print system that includes the print head.

28. The process according to claim 1, wherein in response to adjusting the print timing command, the process further comprises:
adjusting a print drop dot-per-inch quantity when printing the electrical component in accordance with the topology of the non-uniform surface of the substrate.

29. The process according to claim 28, wherein adjusting the print timing command comprises:
adjusting a frequency of the print timing command based on the topology of the non-uniform surface of the substrate, thereby adjusting the print drop dot-per-inch quantity.

30. The process according to claim 29, wherein adjusting the frequency of the print timing command causes an increase in the print drop dot-per-inch quantity by a factor of $\cos h(x)$ when a slope of x degrees occurs in the non-uniform surface of the substrate.

31. The process according to claim 29 wherein adjusting the frequency of the print timing command comprises:
decreasing by a first amount at least one or more timing periods of the print timing command such that the print head expels at least one or more print drops at a higher frequency than previously expelled print drops.

32. The process according to claim 31, wherein the amount of the at least one or more timing periods corresponds to a density of print drop dots-per-inch necessary to substantially cover a certain topological feature.

33. The process according to claim 28, further comprising:
transmitting the adjusted print timing command to the print head.

34. The process according to claim 33, wherein measuring height of the print head comprises:
measuring print head height above the non-uniform surface of the substrate by a laser interferometer.

35. The process according to claim 28, wherein adjusting the print timing command comprises:
initiating the print timing command to cause the print head to expel a next drop sooner by a first delta $\tau$ amount if a height of the print head above the non-uniform surface of the substrate at a next print drop release position increases relative to a height of the print head above the non-uniform surface of the substrate at a previous print drop release position; and
initiating the print timing command to cause the print head to expel the next drop later by a second delta $\tau$ amount if the height of the print head above the non-uniform surface of the substrate at the next print drop release position decreases relative to the height of the print head above the non-uniform surface of the substrate at the previous print drop release position.

36. The process according to claim 35, wherein the first and/or second delta $\tau$ amounts reflect a measurement of time.

37. The process according to claim 35, wherein if the print timing command occurs sooner by the first delta $\tau$ amount, the first delta $\tau$ amount is a negative number added to a print timing command period.

38. The process according to claim 35, wherein if the print timing command occurs later by the second delta $\tau$ amount, the second delta $\tau$ amount is a positive number added to a print timing command period.

39. The process according to claim 28, wherein adjusting the print timing command comprises:
calculating a first delta $\tau$ amount if a height of the print head above the non-uniform surface of the substrate at a next print drop release position increases relative to a height of the print head above the non-uniform surface of the substrate at a previous print drop release position;
calculating a second delta $\tau$ amount if the height of the print head above the non-uniform surface of the substrate at the next print drop release position decreases relative to the height of the print head above the non-uniform surface of the substrate at the previous print drop release position, wherein the first delta $\tau$ and the second delta $\tau$ amounts are calculated according to speed of the print head in a direction substantially parallel to a plane of the non-uniform surface of the substrate, print head height above the non-uniform surface of the substrate, and print drop velocity as print drop is expelled from the print head;

adjusting the print timing command by either the first or second delta τ amount; and transmitting the adjusted print timing command to the print head.

40. The process according to claim 39, wherein each of the first and second delta τ amounts is a measurement of time.

41. The process according to claim 39, wherein calculating the first and/or second delta τ amounts is carried out by performing an algorithm with a processor of a print system that includes the print head.

42. The process according to claim 28, further comprising:
creating a topological survey of the non-uniform surface of the substrate based on the measured heights;
creating a print file for a desired print image to be printed onto the non-uniform surface of the substrate;
initiating a printing sequence to print the desired print image onto the non-uniform surface of the substrate;
determining an initial location of the print head with respect to the non-uniform surface of the substrate;
determining a drop velocity of a drop of ink from the print head; and
determining a print head velocity relative to the substrate material.

43. The process according to claim 28, wherein adjusting the print timing command comprises:
adjusting a timing and frequency of the print timing command based on a sloped surface of the non-uniform surface of the substrate, thereby adjusting the print drop-per-inch quantity.

44. The process according to claim 28, wherein adjusting the print timing commend causes the print head to repeat a print sequence for a certain topological feature only at a location of the topological feature.

45. The process according to claim 1, wherein in response to adjusting the print timing command, the process further comprises:
adjusting a print drop dots-per-inch quantity in accordance with the topology of the non-uniform surface of the substrate; and
repeating one or more print timing commands that correspond to one or more areas of the non-uniform surface of the substrate, without repeating other print timing commands that correspond to any of one or more other areas of the non-uniform surface of the substrate, in accordance with the topology of the non-uniform surface of the substrate.

46. The process according to claim 45, wherein repeating one or more print timing commands comprises:
printing in a first direction at the one or more certain areas of the non-uniform surface of the substrate;
printing in a direction opposite to the first direction at the one or more certain areas of the non-uniform surface of the substrate; and
repeating the printing in the first and second directions until the one or more certain areas of the non-uniform surface of the substrate have been substantially covered.

47. The process according to claim 45, wherein adjusting the print timing command comprises:
adjusting a frequency of the print timing command in accordance with the topology of the non-uniform surface of the substrate, thereby adjusting the print drop dot-per-inch quantity.

48. The process according to claim 47, wherein adjusting the frequency of the print timing command causes an increase in the print drop dot-per-inch quantity by a factor of cos h(x) when a slope of x degrees occurs in the non-uniform surface of the substrate.

49. The process according to claim 47 wherein adjusting the frequency of the print timing command comprises:
decreasing by a first amount at least one or more timing periods of the print timing command such that the print head expels at least one or more print drops at a higher frequency than previously expelled print drops.

50. The process according to claim 49, wherein the amount of the at least one or more timing periods corresponds to a density of print drop dots-per-inch necessary to substantially cover a certain topological feature.

51. The process according to claim 45, further comprising:
transmitting the adjusted print timing command to the print head.

52. The process according to claim 51 wherein measuring height of the print head comprises:
measuring print head height above the non-uniform surface of the substrate by a laser interferometer.

53. The process according to claim 51, wherein adjusting the print timing command comprises:
initiating the print timing command to cause the print head to expel a next drop sooner by a first delta τ amount if a height of the print head above the non-uniform surface of the substrate at a next print drop release position increases relative to a height of the print head above the non-uniform surface of the substrate at a previous print drop release position; and
initiating the print timing command to cause the print head to expel the next drop later by a second delta τ amount if the height of the print head above the non-uniform surface of the substrate at the next print drop release position decreases relative to the height of the print head above the non-uniform surface of the substrate at the previous print drop release position.

54. The process according to claim 53, wherein the first and/or second delta τ amounts reflect a measurement of time.

55. The process according to claim 53, wherein if the print timing command occurs sooner by the first delta τ amount, the first delta τ amount is a negative number added to a print timing command period.

56. The process according to claim 53, wherein if the print timing command occurs later by the second delta τ amount, the second delta τ amount is a positive number added to a print timing command period.

57. The process according to claim 45, wherein adjusting the print timing command comprises:
calculating a first delta τ amount if a height of the print head above the non-uniform surface of the substrate at a next print drop release position increases relative to a height of the print head above the non-uniform surface of the substrate at a previous print drop release position;
calculating a second delta τ amount if the height of the print head above the non-uniform surface of the substrate at the next print drop release position decreases relative to the height of the print head above the non-uniform surface of the substrate at the previous print drop release position, wherein the first delta τ and the second delta τ amounts are calculated according to speed of the print head in a direction substantially parallel to a plane of the non-uniform surface of the substrate, print head height above the non-uniform surface of the substrate, and print drop velocity as print drop is expelled from the print head;

adjusting the print timing command by either the first or second delta τ amount; and transmitting the adjusted print timing command to the print head.

58. The process according to claim 57, wherein each of the first and second delta τ amounts is a measurement of time.

59. The process according to claim 57, wherein calculating the first and/or second delta τ amount are carried out by performing an algorithm with a processor of a print system that includes the print head.

60. The process according to claim 45, further comprising:
creating a topological survey of the non-uniform surface of the substrate based on the measured heights;
creating a print file for a desired print image to be printed onto the non-uniform surface of the substrate;
initiating a printing sequence to print the desired print image onto the non-uniform surface of the substrate;
determining an initial location of the print head with respect to the non-uniform surface of the substrate;
determining a drop velocity of a drop of ink from the print head; and
determining a print head velocity relative to the substrate material.

61. The process according to claim 45, wherein adjusting the print timing command comprises:
adjusting a timing and frequency of the print timing command based on a sloped surface of the non-uniform surface of the substrate, thereby adjusting the print dropper-inch quantity.

62. The process according to claim 45, wherein adjusting print timing command causes the print head to repeat a print sequence for a certain topological feature only at a location of the topological feature.

63. A non-transitory computer readable medium encoded with instructions that, when executed by a processor, cause the processor to execute a process for compensating for a non-uniform surface of a substrate when printing onto the non-uniform surface of the substrate, the process comprising:
measuring height of a print head above the non-uniform surface of the substrate at a plurality of locations on the non-uniform surface, wherein measuring the height at any one of the locations occurs prior to any printing at that location; and
adjusting a print timing command when printing an electrical component in accordance with a topology of the non-uniform surface of the substrate, wherein adjusting the print timing command is based on relative velocity between the print head and the substrate, ink drop velocity, and the relative height difference between a height of the print head before a previous drop was expelled and a height of the print head after the previous drop was expelled.

* * * * *